United States Patent [19]

Kondo et al.

[11] Patent Number: 5,621,748
[45] Date of Patent: Apr. 15, 1997

[54] STRIPE LASER DIODE HAVING AN IMPROVED EFFICIENCY FOR CURRENT CONFINEMENT

[75] Inventors: Makoto Kondo; Akira Furuya; Chikashi Anayama; Mami Sugano; Kay Domen; Toshiyuki Tanahashi; Hiroshi Sekiguchi, all of Kawasaki, Japan

[73] Assignee: Fujitsu Limited, Kawasaki, Japan

[21] Appl. No.: 427,352

[22] Filed: Apr. 24, 1995

Related U.S. Application Data

[62] Division of Ser. No. 228,453, Apr. 15, 1994, Pat. No. 5,436,194, which is a continuation of Ser. No. 947,171, Sep. 18, 1992, abandoned.

[30] Foreign Application Priority Data

| Sep. 20, 1991 | [JP] | Japan | 3-241533 |
| Dec. 25, 1991 | [JP] | Japan | 3-342825 |
| Mar. 4, 1992 | [JP] | Japan | 4-46547 |
| Mar. 10, 1992 | [JP] | Japan | 51563 |
| Mar. 26, 1992 | [JP] | Japan | 4-68000 |
| May 25, 1992 | [JP] | Japan | 4-132304 |

[51] Int. Cl.$^6$ ................................. H01S 3/19
[52] U.S. Cl. ................... 372/46; 372/48; 372/45
[58] Field of Search ................... 372/45, 46, 48

[56] References Cited

U.S. PATENT DOCUMENTS

| 4,503,539 | 3/1985 | Mori et al. | 372/45 |
| 4,599,787 | 7/1986 | Sasatani | 437/129 |
| 4,785,457 | 11/1988 | Asbeck et al. | 372/46 |
| 4,835,117 | 5/1989 | Ohba et al. | 148/DIG. 95 |
| 5,010,556 | 4/1991 | Imanaka et al. | 372/46 |
| 5,065,200 | 11/1991 | Bhat et al. | 372/46 |
| 5,079,184 | 1/1992 | Hatano et al. | 437/94 |
| 5,095,488 | 3/1992 | Yamamoto et al. | 372/45 |
| 5,185,289 | 2/1993 | Meier et al. | 148/DIG. 95 |
| 5,202,285 | 4/1993 | Sugano et al. | 437/129 |
| 5,219,785 | 6/1993 | Welch et al. | 437/129 |
| 5,227,015 | 7/1993 | Fujihara et al. | 148/DIG. 95 |

FOREIGN PATENT DOCUMENTS

| 0301826 | 2/1989 | European Pat. Off. . | |
| 0454476 | 10/1991 | European Pat. Off. . | |
| 2-146788 | 6/1990 | Japan | 372/45 |
| 2-294089 | 12/1990 | Japan . | |
| 91/10263 | 7/1991 | WIPO . | |

OTHER PUBLICATIONS

Hino et al., "Continuous Wave Operation (77 K) of Yellow (583.6 nm) Emitting AlGaInP Double Heterostructure Laser Diodes," *Applied Physics Letters*, vol. 48, No. 9, Mar. 3, 1986, pp. 557–558.

BHAT et al., "Orientation Dependence of S, Zn, Si, Te, and Sn Doping in OMCVD Growth of InP and GaAs: Application to DH Lasers and Lateral p–n Junction Arrays Grown on Non–Planar Substrates," *Journal of Crystal Growth*, vol. 107, No. 1/4, Jan. 1, 1991, pp. 772–778.

*Patent Abstracts of Japan*, vol. 15, No. 74 (E–1036) Feb. 21, 1991 & JP–A–02 294089 (Mitsubishi Electric Corp.) Dec. 5, 1990.

(List continued on next page.)

*Primary Examiner*—Rodney B. Bovernick
*Assistant Examiner*—Yisun Dong
*Attorney, Agent, or Firm*—Staas & Halsey

[57] ABSTRACT

A method for fabricating a laser diode, comprises the steps of: forming a first stripe structure defined by a plurality of crystallographically distinct surfaces on a surface of a semiconductor substrate; forming an epitaxial layer of InGaAlP on the semiconductor substrate including the first stripe structure by a decomposition of gaseous source materials of In, Ga, Al and P; wherein the InGaAlP layer is doped to the p-type by incorporating Mg while growing the InGaAlP by adding a gaseous source material of Mg into said source materials of In, Ga, Al and P such that the InGaAlP layer is doped to the p-type with a substantially uniform carrier concentration level irrespective of the crystal surfaces forming the stripe structure.

10 Claims, 42 Drawing Sheets

OTHER PUBLICATIONS

Hamada et al., "AlGaInP Visible Laser Diodes Grown on Misoriented Substrates," *IEEE Journal of Quantum Electronics,* vol. 27, No. 6, Jun. 1991, pp. 1483–1490.

Suzuki et al., "Effects of Substrate Misorientation on Doping Characteristics and Band Gap Energy for InGaAlP Crystals Grown by Metalorganic Chemical Vapor Deposition," *Journal of Crystal Growth,* vol. 113, No. 1/2, Aug. 1991, pp. 127–130.

Kondo et al., "Crystal Orientation Dependence of Impurity Dopant Incorporation in MOVPE–Grown III–V Materials," *Journal of Crystal Growth,* vol. 124, Jun. 8, 1992, pp. 449–456.

Anayama et al., "One–Step–MOVPE–Grown Index–Guide GaInP/AlGaInP Visible Laser Using Simultaneous Impurity Doping," *Extended Abstracts of the 1992 International Conference on Solid State Devices and Materials,* vol. B–6–6, Aug. 26, 1992, pp. 619–621.

Se
Zn

ELECTRON
RESISTIVITY (311)A  (100)  (311)A

Zn
Se p  n  p (311)A  (100)  (311)A

STRIPE LASER DIODE HAVING AN IMPROVED EFFICIENCY FOR CURRENT CONFINEMENT

This application is a division of application Ser. No. 08/228,453 filed Apr. 15, 1994, now U.S. Pat. No. 5,436,194, in turn a continuation of application Ser. No. 07/947,171, filed Sep. 18, 1992, now abandoned.

BACKGROUND OF THE INVENTION

The present invention generally relates to laser diodes and more particularly to an improvement of a laser diode having a stripe structure.

With the widespread use of laser diodes in various fields of human society, such as for optical storage of information in optical disk systems, optical reading of bar codes in POS systems, optical recording of images in printers, and the like, there is an increasing demand for a laser diode that produces short wavelength optical beam in the visual wavelength band. With the use of such short wavelength radiation for the optical beam, one can increase the storage capacity of the optical information storage system. Further, the use of visible light is advantageous in other applications such as POS systems.

In the optical information storage systems that record and reproduce information on and from a recording media by means of a finely focused optical beam, the laser diode is required to have small astigmatism in addition to the usual requirement of low threshold current, high output power and high reliability. In the optical information storage systems in particular, the optical beam is required to have a very small round beam shape when focused on a recording medium such as an optical disk. When there is a large astigmatism in the laser diode, the optical beam does not form the desired round beam spot but forms an elongated spot wherein the direction of elongation changes depending on the focusing state. In order to eliminate or minimize the problem of astigmatism, various efforts have been made so far.

FIG. 1 shows the basic structure of a typical conventional laser diode of the so-called ridge type that produces an output optical beam in the visible wavelength region.

Referring to FIG. 1, the laser diode is constructed on the (100)-oriented upper major surface of a GaAs substrate 101 doped to the n-type. There, a buffer layer 102 of n-type GaAs is grown epitaxially on the (100)-oriented surface of the GaAs substrate 101, and an intermediate layer 103 of n-type InGaP is grown further on the buffer layer 102 epitaxially.

On the intermediate layer 103, a clad layer 104 of n-type InGaAlP is grown epitaxially, and an active layer 105 of undoped InGaP is grown epitaxially on the clad layer 104. The active layer 105 in turn is covered by a clad layer 106 of p-type InGaAlP, and an etching stopper layer 107 of p-type InGaP is grown on the clad layer 106. Further, a clad layer 109 of p-type InGaAlP and an intermediate layer 110 of InGaP are grown consecutively to form a layered semiconductor body, and a silicon oxide layer (not shown) is deposited further on the layer 110. Next, the silicon oxide layer is patterned in correspondence to the ridge structure to be formed to form a patterned silicon oxide mask, and the layered semiconductor body obtained previously is subjected to a wet etching process while using the patterned silicon oxide mask. Thereby, a ridge structure including the layers 109–110 is formed on the etching stopper layer 107. Further, while using the same silicon oxide mask, a deposition of n-type GaAs is made such that the foregoing ridge structure is laterally supported by a pair of n-type GaAs regions formed as a result of the foregoing deposition of n-type GaAs.

In the laser diode of FIG. 1, the layers 109–111 form a ridge structure supported laterally by the n-type GaAs regions 108a and 108b as already noted, and the ridge structure thus constructed forms a loss guide structure for guiding therethrough the optical beam produced in the active layer 105. There, the GaAs regions at both sides of the ridge structure absorbs the optical beam and changes the refractive index in response thereto. It should be noted that the band gap of GaAs is much smaller than the band gap of InGaP or InGaAlP. Further, such a ridge structure, supported laterally by the p-type GaAs regions 108a and 108b, causes a confinement of the drive current within the ridge. Thereby, the laser diode of FIG. 1 is characterized by a low threshold current. By using InGaP for the material of the active layer 105, one can realize a laser oscillation at the wavelength of about 680 nm. Thus, the laser diode of FIG. 1 is capable of producing output optical beam with a visible wavelength.

The laser diode of FIG. 1, however, has a problem in that there appears an astigmatism in the optical beam produced from the device. More specifically, there arises a discrepancy in the focal point of the optical beam that is emitted at the edge surface of the laser diode with a horizontal plane of beam divergence and the optical beam that is emitted at the same edge surface with a vertical plane of beam divergence. FIG. 2 shows such a situation wherein two focal points, $f_1$ and $f_2$, exist in the optical beam produced from the laser diode. There, the optical beam spreads in the vertical plane from the first focal point $f_1$, while the optical beam spreads in the horizontal plane from the second focal point $f_2$, wherein the focal point $f_2$ is offset from the focal point $f_1$ by several microns. Associated with such an offset in the focal point, the beam spot of the optical beam has an elongated elliptical shape that is not desirable for optical storage of information such as the optical disk systems as already described. It will be noted that the direction of elongation of the elliptical beam spot changes depending on the focusing state of the optical beam.

The foregoing astigmatism occurring in the laser diode of FIG. 1 is caused mainly by the difference in the degree of optical confinement between the vertical plane and the horizontal plane. As long as the loss guide structure that lacks the refractive structure for efficient lateral optical confinement is used, one cannot avoid the problem of astigmatism. In order to overcome or minimize the astigmatism, the inventors of the present invention have proposed previously in the European Laid-open Patent Publication EP 0 454 476 that corresponds to the U.S. patent application Ser. No. 691,620 now abandoned and Ser. No. 892,680 that is a file-wrapper continuation of the former, a laser diode having a stripe structure wherein an active layer is provided to extend as a stripe in correspondence to a mesa structure that is formed on a substrate on which the laser diode is constructed.

FIG. 3 shows the laser diode proposed previously by the present inventors.

Referring to FIG. 3, the laser diode is constructed on a GaAs substrate 201 doped for example to the p-type. The substrate 201 has a (100)-oriented upper major surface, and a mesa structure 201a that is characterized by a (100)-oriented upper major surface and a pair of (111)B-oriented side walls, is formed on the upper major surface as illustrated. It should be noted that the (100) surface of the mesa structure 201a extends in the longitudinal direction of the laser diode and forms the basis of the stripe structure.

On the substrate 201 thus shaped, a current confinement layer 202 of n-type GaAs is grown epitaxially while protecting the upper major surface of the mesa structure 201a by a mask such as silicon oxide. When an epitaxial process is applied to the (111)B surface that extends obliquely to the (100) surface of the GaAs substrate 201, it is known that a (311)B surface develops preferentially because of the slow rate of crystal growth in this crystal orientation. In other words, the epitaxial layer 202 thus grown is characterized by the well-developed (311)B surface that extends obliquely to the (100) surface of GaAs at both sides of the mesa structure 201a. Thereby, the (311)B surface forms another mesa structure that extends coincident to the stripe structure of the laser diode.

After the layer 202 is formed and the mask removed, a buffer layer 203 of p-type GaAs is grown epitaxially for providing an improved crystal surface for the subsequent epitaxial processes, and an intermediate layer 204 of p-type InGaP corresponding to the intermediate layer 110 is grown further on the buffer layer 203. Further, a clad layer 205 of p-type InGaAlP is grown epitaxially on the intermediate layer 204, and an active layer of undoped InGaP is grown epitaxially on the clad layer 205.

On the active layer 205, a clad layer 207 of n-type InGaAlP is grown epitaxially, and an intermediate layer 208 of n-type InGaP corresponding to the intermediate layer 103 of FIG. 1 is grown further thereon. Further, a contact layer 208 of $n^+$-type GaAs is grown on the intermediate layer 110 epitaxially, and upper and lower electrode layers (not shown) are provided respectively on the upper major surface of the contact layer 209 and the lower major surface of the substrate 201. The epitaxial layers are grown by the MOCVD process for exact control of composition, and dopants are incorporated into the epitaxial layers as necessary during the epitaxial process. Usually, Zn is used for the p-type dopant, while Se or Si is used for the n-type dopant. Zn may be incorporated by admixing dimethylzinc $((CH_3)_2Zn)$ to the source gas of the epitaxial layers, while Se is incorporated by admixing hydrogen selenide ($H_2Se$). When Si is used, a gas of silane ($SiH_4$) or disilane $Si_2H_6$ is used.

In operation, a forward bias voltage is applied across the upper and lower electrodes to inject carriers into the active layer 206. In the illustrated example, holes are injected into the p-type substrate 201 and transported to the active layer 206 through the mesa structure 201a due to the current confinement that is achieved by the n-type GaAs layer 202 at both sides of the mesa structure 201a. Thereby, the holes are injected preferentially at the central part of the clad layer 205 and transferred further to the active layer 206 for recombination with electrons that are injected from the upper electrode and transported to the active layer 206 via the layers 209–207. Such a recombination of electrons and holes initiates the well known stimulated emission process, and the stimulated emission process causes an amplification of the optical beam when reflectors are provided at both longitudinal ends of the laser diode for reflecting the optical beam back and forth through the laser diode. Thereby, one obtains a laser oscillation as is well known in the art.

In the structure of the laser diode thus fabricated, it should be noted that the layers 203 through 209 are all formed in conformity with the surface morphology of the second mesa structure in that each layer includes an elongated stripe region characterized by a (100) surface and extending in correspondence to the (100) surface of the mesa structure 201a. There, each stripe region is laterally defined by a pair of lateral regions located at both sides of the elongated (100) stripe surface and characterized by the (311)B surface in correspondence to the (311)B surface of the layer 202. Of course, the (100) surface is flat and extends in parallel with the upper major surface of the mesa structure 201a, while the (311)B surface extends obliquely to the (100) surface. Because of the lateral confinement of the optical beam in the stripe region of the active layer wherein the recombination of the carriers occurs predominantly, the problem of astigmatism is successfully eliminated in the device of FIG. 3.

In such a structure wherein each epitaxial layer includes crystallographically non-equivalent surfaces, the nature or property of the epitaxial layers changes depending on the orientation of the crystal surface.

In the laser diode of FIG. 3, it will be noted that the clad layer 205 is formed of three distinct regions characterized by respective, three crystallographically distinct surfaces, the first region characterized by the (100) surface and the second and third regions characterized by the (311)B surfaces, wherein the second and third regions are located at both sides of the first region and extend in the longitudinal direction of the laser diode together with the first region. As will be discussed in detail later, it was discovered that the concentration level of the dopant changes depending on the first through third regions of the clad layer 205. More specifically, the concentration level of Zn is higher in the second and third regions, i.e., characterized by the (311)B surface, as compared with the first region, i.e., characterized by the (100) surface. Associated with such a variation in the concentration of the dopant, there appears a variation in the carrier density such that the density or concentration level of the holes is higher in the second and third regions as compared with the first region. This indicates that the resistivity of the clad layer 205 increases to a higher value in the first region as compared with the second and third regions located at both sides thereof because of the reduced concentration of the carriers. Thus, there is a tendency that the injected current flows preferentially through the oblique region of the clad layer 205 rather than the stripe region having the (100) surface as indicated by arrows in FIG. 3. In other words, drive current avoids the strip region of the active layer 206 where the recombination occurs, and the laser diode of FIG. 3 has a problem of poor current confinement and hence a low efficiency of laser oscillation.

Further, the conventional laser diode of FIG. 3 has a problem of large resistivity due to the relatively small Zn content in the epitaxial layer. More specifically, the small Zn content in the epitaxial layer causes the problem of small concentration of holes in the p-type layers, and the conventional laser diode has suffered from the problem of large resistivity and limited operational power. It should be noted that the laser diode would generate intolerable heat due to the large resistivity of the p-type layers, particularly when the injection current is increased. It is thought that this problem arises from the large vapor pressure of Zn that is in equilibrium with the crystal phase during the MOCVD process. There, Zn tends to concentrate more in the vapor phase than in the crystal as a result of the evaporation, and such a tendency is enhanced when the temperature of the epitaxial process is increased. As it is desirable to use high temperature for obtaining high quality crystal layer in the epitaxial process, the foregoing tendency contradicts with the requirement of large dopant concentration level in the epitaxial layers of the laser diode.

SUMMARY OF THE INVENTION

Accordingly, it is a general object of the present invention to provide a novel and useful process for fabricating a laser diode wherein the foregoing problems are eliminated.

Another and more specific object of the present invention is to provide a laser diode operational in the visible wavelength with a reduced astigmatism and with an improved current confinement.

Another object of the present invention is to provide a process for fabricating a laser diode on a substrate that is formed with a stripe structure defined by crystallographically distinct surfaces and extending in a predetermined direction, wherein the device has a reduced resistivity associated with a high dopant concentration level in the clad layer.

Another object of the present invention is to provide a simple process for forming an effective current confinement structure in a laser diode.

Another object of the present invention is to provide a process for fabricating a laser diode, comprising the steps of: forming a first stripe structure defined by a plurality of crystallographically distinct surfaces, each extending in parallel with each other in a predetermined direction on an upper major surface of a semiconductor substrate; forming a layer of InGaAlP on said semiconductor substrate including said first stripe structure by a decomposition of organic source materials of In, Ga, Al and P while maintaining an epitaxial relationship with respect to said semiconductor substrate such that said layer of InGaAlP is formed with a second stripe structure corresponding to said first stripe structure, said layer of InGaAlP being formed such that said second stripe structure is formed of a plurality of crystallographically distinct surfaces corresponding to said plurality of crystallographically distinct surfaces that form said first stripe structure; and doping said InGaAlP layer to the p-type by incorporating Mg while growing said InGaAlP by admixing a gaseous source material of Mg into said source materials of In, Ga, Al and P such that said InGaAlP layer is doped to the p-type with a substantially uniform carrier concentration level irrespective of the crystal surfaces forming said second stripe structure. According to the present invention, one can obtain a relatively uniform distribution of Mg in the clad layer irrespective of the crystal surface on which the clad layer is grown. In other words, the uniform distribution of Mg is achieved even when the clad layer is formed on the stripe structure that includes crystallographically distinct surfaces, contrary to the conventional process wherein Zn is used for the dopant. The present invention is particularly useful for eliminating the spreading of the drive current in the stripe laser diodes wherein the GaAs substrate is formed with such a stripe structure. Further, the use of Mg as the p-type dopant enables a high level doping that is advantageous for reducing the resistivity of the laser diode. By growing the clad layer doped with Mg before an undoped active layer is grown, one can obtain a sharp boundary of conductivity type in correspondence to the interface between the clad layer and the active layer that is grown on the clad layer. By interrupting the supply of Mg, the incorporation of Mg into the clad layer is stopped immediately. On the other hand, when the Mg-doping is applied to the clad layer that is grown on the already formed active layer, there tends to appear a delay in the incorporation of Mg into the clad layer even when the supply of Mg is started, and the boundary of the conductivity type, which is essential for the double-hetero structure of the laser diode, may shift from the physical interface between the active layer and the clad layer.

Another object of the present invention is to provide a process for fabricating a laser diode, comprising the steps of: forming a first stripe structure defined by a plurality of crystallographically distinct crystal surfaces including the (100) surface on an upper major surface of a semiconductor substrate, each of said crystal surfaces being formed to extend parallel with each other in a predetermined direction of said semiconductor substrate; forming a layer of InGaAlP on said semiconductor substrate including said first stripe structure by a decomposition of organic source materials of In, Ga, Al and P while maintaining an epitaxial relationship with respect to said semiconductor substrate such that said layer of InGaAlP is formed with a second stripe structure corresponding to said first stripe structure, said layer of InGaAlP being formed such that said second stripe structure is formed of a plurality of crystallographically distinct crystal surfaces corresponding to said plurality of crystal surfaces that form said first stripe structure; and doping said InGaAlP layer by incorporating a p-type dopant and an n-type dopant simultaneously while growing said layer of InGaAlP by adding gaseous source materials of said p-type dopant and said n-type dopant into said gaseous source materials of In, Ga, Al and P such that said InGaAlP layer has an electronic property that changes depending on said crystallographically distinctly surfaces of said InGaAlP layer. According to the present invention, one can form a p-type region and an n-type region in the same clad layer simultaneously by a single MOCVD process such that the n-type region is sandwiched laterally by a pair of p-type regions or vice versa. For example, by selecting Mg or Zn as the p-type dopant and by selecting Se as the n-type dopant, one can form the clad layer such that the clad layer includes a p-type stripe region and a pair of n-type stripe regions that sandwich the p-type stripe region laterally or vice versa. Alternatively, one may form the clad layer such that the part of the clad layer grown on said first stripe surface has a carrier density that is substantially larger than the part of the clad layer that is grown on the other stripe surfaces by setting the doping level of the p-type dopant and the n-type dopant appropriately. Thereby, one can achieve an efficient current confinement at the clad layer and the efficiency of laser oscillation is improved substantially. By growing an active layer on the clad layer thus formed, one can achieve an effective lateral confinement of the optical beam in the active layer in correspondence to the stripe structure. More particularly, the morphology of the stripe structure characterized by the crystallographically distinct stripe surfaces is transferred to the clad layer, and the part of the active layer that is grown on the first stripe surface of the clad layer is supported laterally by a pair of sloped surfaces of the clad layer that are formed in correspondence to other stripe surfaces with an angle with respect to the first stripe surface. In other words, the optical radiation produced in the active layer is confined therein laterally by the first or second clad layer, and the problem of astigmatism is substantially eliminated.

Another object of the present invention is to provide a process for fabricating a laser diode, comprising the steps of: forming a crystal surface on an upper major surface of a semiconductor substrate such that said crystal surface has a crystal orientation different from said upper major surface; and forming a clad layer on said substrate while maintaining an epitaxial relationship between said clad layer and said substrate; wherein said step of forming the clad layer comprises a step of incorporating a p-type dopant and an n-type dopant simultaneously. According to the present invention, one can obtain a clad layer wherein the conductivity type is changed selectively therein by a single deposition step. Thereby, one can fabricate a laser diode having an excellent confinement of current easily.

Another object of the present invention is to provide a stripe laser diode, comprising: a substrate of a semiconductor material having an upper major surface and a lower major surface and extending in a longitudinal direction from a first end to a second, opposite end; a stripe structure formed on said upper major surface of said substrate as a part of said substrate, said stripe structure comprising a first stripe surface formed of the (100) surface and extending in said longitudinal direction and a pair of different stripe surfaces each having a crystal orientation different from the (100) surface and extending in said longitudinal direction at both lateral sides of said first stripe surface; a first clad layer of InGaAlP doped provided on said substrate to extend in said longitudinal direction from a first end to a second, opposite end, said first clad layer having upper and lower major surfaces and including a stripe structure formed therein in conformity with said stripe structure of said substrate; an active layer of undoped semiconductor material having a band gap smaller than said first clad layer and provided on said first clad layer to extend in said longitudinal direction from a first end to a second, opposite end, said active layer having upper and lower major surfaces and including a stripe structure formed therein in conformity with said stripe structure of said substrate; a second clad layer of InGaAlP provided on said active layer to extend from said first end to said second end of said substrate, said second clad layer including a stripe structure formed therein in conformity with said stripe structure of said substrate; first carrier injection means provided on said lower major surface of said substrate for injecting first type carriers having a first polarity to said active layer via said first clad layer by establishing an ohmic contact therewith; and second carrier injection means provided on said upper major surface of said second clad layer for injecting second type carriers having a second, opposite polarity to said active layer via said second clad layer; one of said first and second clad layers being doped to the p-type by incorporating Mg such that Mg distributes substantially uniformly irrespective of existence of said stripe structure; the other of said first and second clad layers being doped to the n-type. According to the present invention, one can eliminate the problem of leakage of the injection current away from the stripe structure wherein the recombination occurs preferentially, by employing Mg that distributes uniformly in the clad layer irrespective of the existence of the stripe structure, as the dopant. Thereby, an efficient laser oscillation can be achieved. As Mg can be doped into the clad layer with increased concentration level as compared with Zn, one can increase the conductivity of the laser diode with respect to the drive current. As the stripe structure of the active layer is laterally sandwiched by the first or second clad layer in the stripe laser diode, one can minimize the problem of astigmatism.

Another object of the present invention is to provide stripe laser diode, comprising: a semiconductor substrate doped to a first conductivity type, said substrate having an upper major surface and a lower major surface and extending in a longitudinal direction of the laser diode from a first end to a second, opposite end; a first stripe structure formed on said upper major surface of said semiconductor substrate as a part of said substrate, said first stripe structure comprising a first stripe surface formed of the (100) surface and extending in said longitudinal direction and a pair of side surfaces each formed of a crystal surface different from the (100) surface and extending in said longitudinal direction at both lateral sides of said first stripe surface; a first clad layer of InGaAlP having upper and lower major surfaces and provided on said semiconductor substrate to extend in said longitudinal direction from a first end to a second, opposite end; a second stripe structure formed on said upper major surface of said first clad layer so as to extend in said longitudinal direction as a part of said first clad layer and in conformity with said first stripe structure, said second stripe structure comprising a second stripe surface formed of the (100) surface and extending in said longitudinal direction and a pair of stripe surfaces each formed of a crystal surface different from the (100) surface and extending in said longitudinal direction at both lateral sides of said second stripe surface; an active layer of undoped semiconductor material having upper and lower major surfaces and provided on said first clad layer so as to extend in said longitudinal direction from a first end to a second, opposite end, said active layer being supplied with first type carriers of a first polarity and second type carriers of a second opposite polarity for producing an optical beam as a result of recombination of said first and second type carriers; a third stripe structure formed on said upper major surface of said active layer so as to extend in said longitudinal direction as a part of said active layer and in conformity with said first and second stripe structures, said third stripe structure comprising a third stripe surface formed of the (100) surface and extending in said longitudinal direction and a pair of stripe surfaces each formed of a crystal surface different from the (100) surface and extending in said longitudinal direction at both lateral sides of said third stripe surface; a second clad layer of InGaAlP having upper and lower major surfaces and provided on said active layer to extend in said longitudinal direction from said first end to said second end of said substrate; a fourth stripe structure formed on said upper major surface of said second clad layer so as to extend in said longitudinal direction as a part of said second clad layer and in conformity with said first through third stripe structures, said fourth stripe structure comprising a fourth stripe surface formed of the (100) surface and extending in said longitudinal direction and a pair of stripe surfaces each formed of a crystal surface different from the (100) surface and extending in said longitudinal direction at both lateral sides of said fourth stripe surface; first carrier injection means provided on said lower major surface of said substrate for injecting first type carriers having a first polarity into said active layer via said first clad layer; and second carrier injection means provided on said upper major surface of said second clad layer for injecting said second type carriers having a second, opposite polarity into said active layer via said second clad layer; one of said first and second clad layers being doped with Zn and simultaneously with Se and forming a current blocking structure for guiding a drive current of the laser diode such that said drive current is injected selectively into said active layer in correspondence to the third stripe structure characterized by the third stripe surface. According to the present invention, one can block the injection current at the first and second clad layers such that the injected current flows to the active layer selectively through said first stripe region by setting the concentration level of the p-type dopant and the n-type dopant such that the carrier concentration level increases at said first stripe region or such that the conductivity type changes at said first stripe region. Thereby, an efficient confinement of the injection current is achieved.

Other objects and further features of the present invention will become apparent from the following detailed description when read in conjunction with the attached drawings.

DETAILED DESCRIPTION OF THE PREFERRED EMBODIMENTS

Before starting the description of embodiments, a brief explanation will be given on the experimental evidence that forms the basis of the present invention.

It is well known that the property or nature of the semiconductor material changes depending on the crystal surface or orientation. This applies not only to the physical property of the crystal known as anisotropy but also to the crystal growth conducted by the epitaxial processes. In the semiconductor layer that is grown by the MOCVD process, in particular, the composition of the semiconductor material tends to change depending on the crystal surface. For example, it is reported that the content of Zn incorporated into the InGaAlP crystal grown by the MOCVD process increases with increasing offset angle of the crystal surface on which the epitaxial growth occurs, with respect to the (100) surface.

Figure 4:
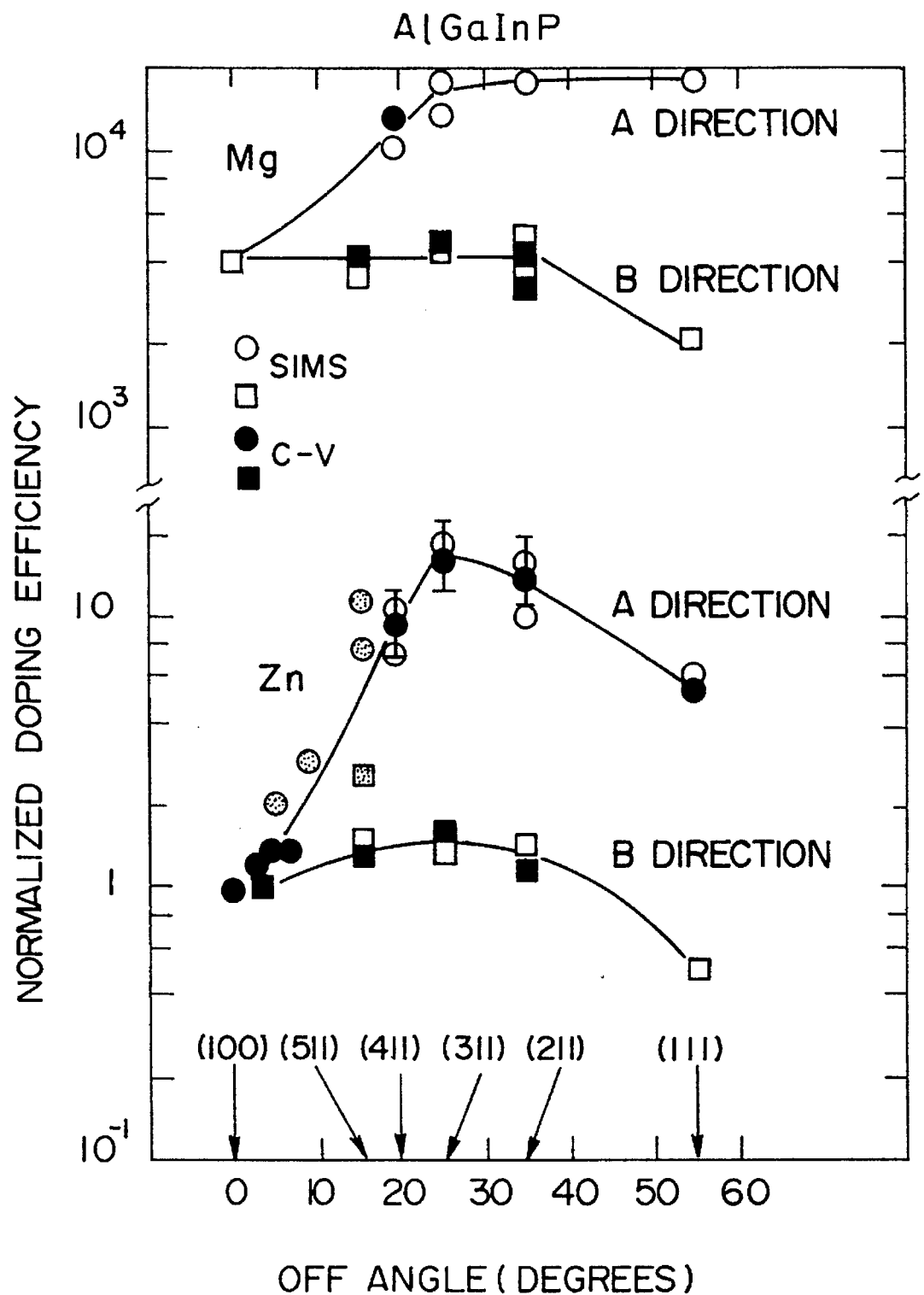
FIG. 4 is a diagram showing the relationship between the doping efficiency and the crystal surface of an InGaAlP crystal, for each of Mg and Zn.

FIG. 4 shows the concentration level of Zn and Mg that are added to an epitaxial layer of InGaAlP as a dopant for various crystal surfaces, wherein the data for Zn and Mg is discovered for the first time by the inventors of the present invention (Kondo, M., Anayama, C., Tanahashi, T. and Yamazaki S., Sixth International Conference on Metalorganic Vapor Phase Epitaxy, IEEE Catalog #92THO459-8, Jun. 8–11, 1992). In FIG. 4, the data for Zn from other references are also illustrated. There, doping of Mg or Zn is achieved while growing the InGaAlP layer by the MOCVD process, by admixing a gaseous source such as dimethylzinc (($CH_3)_2Zn$) or bis(cyclo-penta-dienyl)magnesium (($C_5H_5)_2Mg$) to the source gas of Al, In, Ga and P. In FIG. 4, the solid and open circles as well as the solid and open squares represent the data that is obtained by the experiment by the inventors of the present invention, wherein the open circles and open squares represent the result of the SIMS analysis, while the solid circles and solid squares represent the result of the C-V measurement. The condition of the MOCVD process is summarized in TABLE I below.

TABLE I

EXPERIMENTAL GROWTH PARAMETERS

| | |
|---|---|
| COMPOSITION | $(Al_{0.7}Ga_{0.3})_{0.5}In_{0.5}P$ |
| GROWTH TEMPERATURE | 730° C. |
| OPERATING PRESSURE | $1.0 \times 10^3$ (Pa) |
| TOTAL HYDROGEN FLOWRATE | 8 (SLM) |
| TOTAL GROUP III FLOWRATE | $2.4 \times 10^{-5}$ (mol/min) |
| TOTAL GROUP V FLOWRATE | $6.4 \times 10^{-3}$ (mol/min) |
| V/III RATIO | 269 |
| GROWTH RATE | 3.5 (μm/h) |

Referring to FIG. 4 showing the Zn content and the Mg content in the InGaAlP layer normalized with respect to the Zn content on the (100) surface, it will be noted that the Zn content increases steeply with increasing tilt angle of the crystal surface toward the (111)A surface (designated as A direction in FIG. 4) from the (100) reference surface and then decreases with a further increase of the offset angle, wherein the peak of the Zn concentration appears generally in coincidence to the (311)A surface. It should be noted that the (311) surface that is offset or tilted toward the (111)A surface exposes the Ga surface and hence forms the (111)A surface. On the other hand, the (311) surface tilted toward the (311)B surface exposes the As surface and forms the (311)B surface. When the crystal surface is tilted in the B-direction toward the (311)B surface, on the other hand, it will be noted that the Zn content increases but with a more gentle rate and reaches a maximum at the (311)B surface. When the offset angle is increased more, the Zn content starts to decrease.

In the case of Mg, it will be noted that the Mg concentration level remains substantially constant even when the crystal surface is tilted toward the (311)B surface. In other words, the content of Mg is substantially the same in the (100) surface and the (311)B surface. When the crystal surface is tilted toward the (311)A surface, on the other hand, the Mg content increases with increasing tilt angle of the crystal surface. Further, it should be noted that the Mg content is much larger than the Zn content in any of the crystal surfaces. As already noted, this reflects the thermodynamic situation in that the equilibrium vapor pressure of Zn is much larger than the that of Mg. In other words, Zn easily escapes from InGaAlP into the vapor phase by causing an evaporation. With increasing deposition temperature, this tendency of depletion of Zn becomes even more conspicuous.

Figure 5:
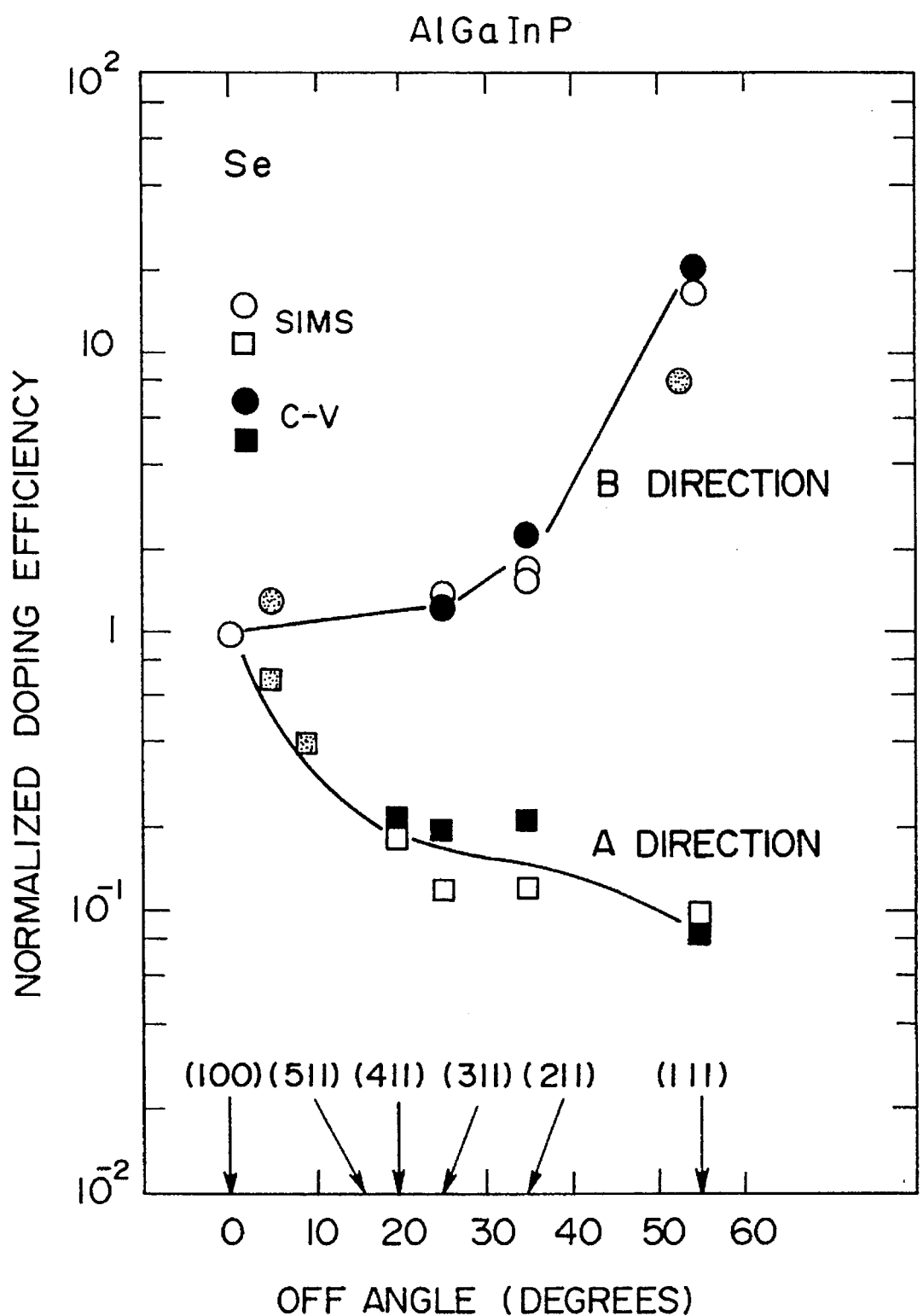
FIG. 5 is a diagram showing the relationship between the doping efficiency and the crystal surface, of an InGaAlP crystal, for Se.

FIG. 5 shows the content of Se incorporated into the InGaAlP layer for various crystal surfaces. There, the growth of the InGaAlP layer is achieved by the MOCVD process with the condition identical with the condition of TABLE I. In FIG. 5, it will be noted that the Se content increases slightly in the (311)B surface as compared with the (100) surface and increases steeply when the offset angle exceeds the angle corresponding to the (311)B surface. In the A direction, the Se content decreases steeply with increasing offset angle from the (100) surface.

Figure 6:
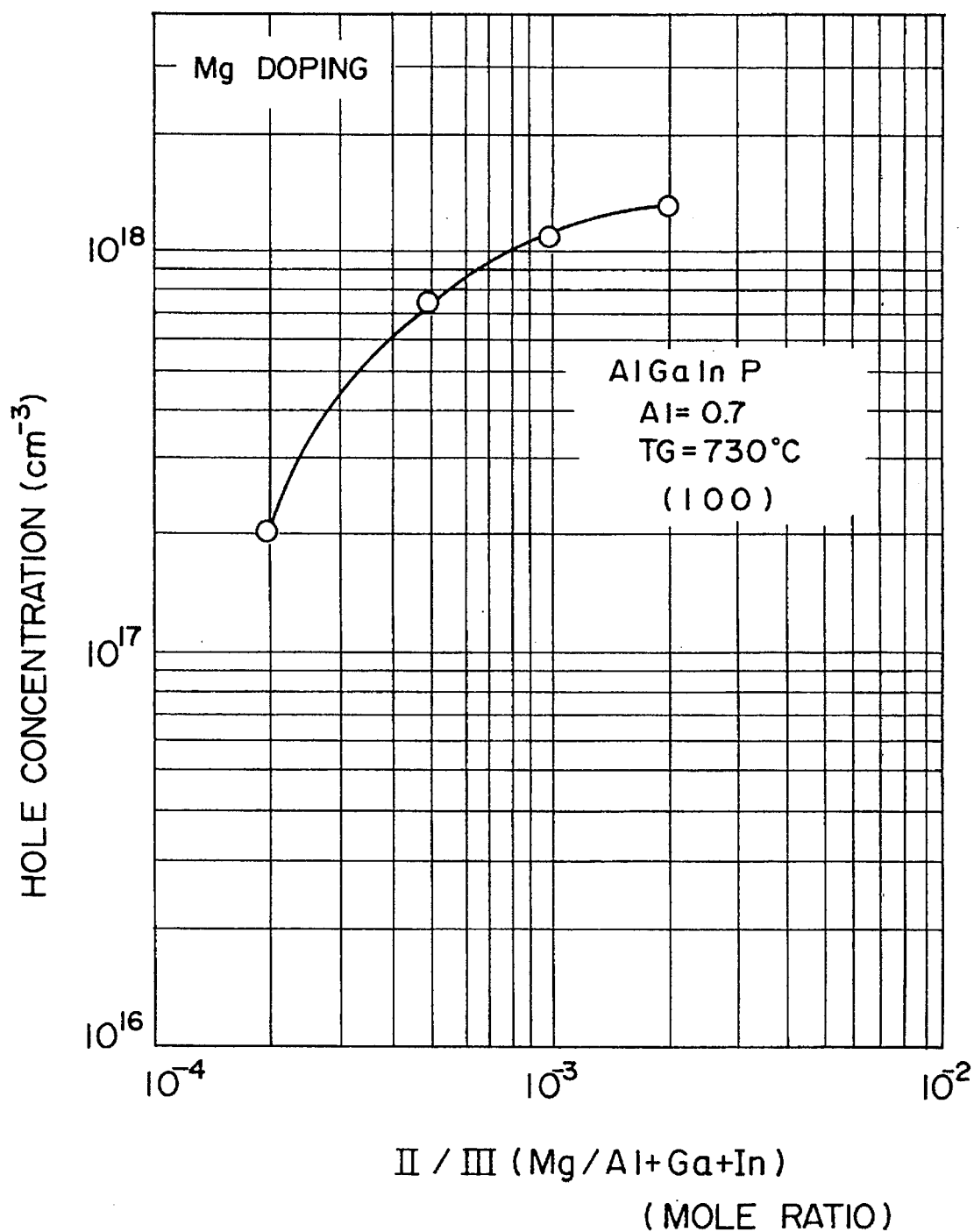
FIG. 6 is a diagram showing the relationship between the hole concentration and the composition of the organic source materials used for growing InGaAlP, with respect to the (100) surface.

FIG. 6 shows the effect of Mg doping on the (100) surface of the InGaAlP crystal. There, it will be noted that one obtains the hole concentration level of about $4 \times 10^{17}$ cm$^{-3}$ by setting the mole ratio of the $(C_5H_5)_2Mg$ gas with respect to the source gases of the group III elements, to about $3 \times 10^{-4}$. When the desirable hole concentration is about $1 \times 10^{18}$ cm$^{-3}$, the mole ratio may be set to $1 \times 10^{-3}$ cm$^{-3}$. It should be noted that Mg occupies the site of the group III elements in the crystal of InGaAlP and acts as the p-type dopant that releases a hole.

Figure 7:
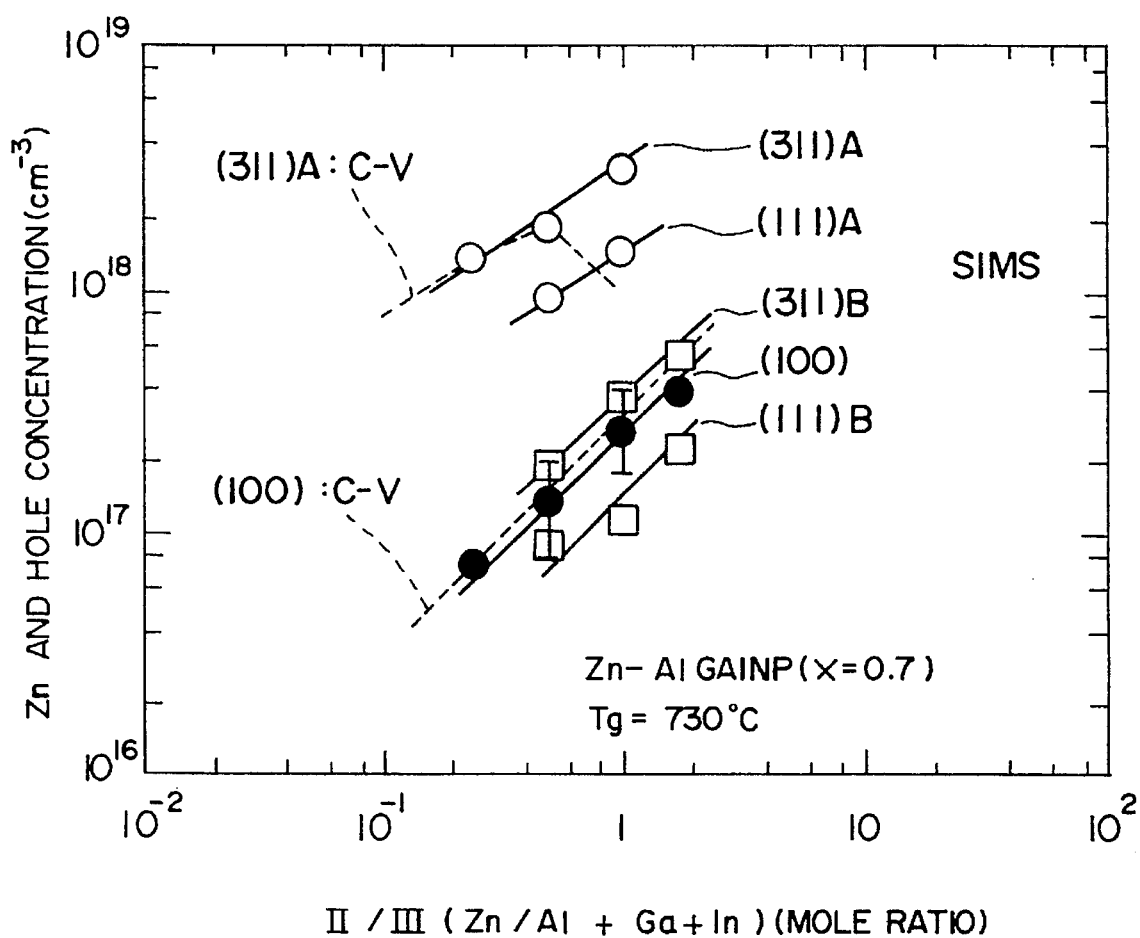
FIG. 7 is a diagram showing the relationship between the Zn and hole concentration and the composition of the organic source materials used for growing InGaAlP, with respect to various crystal surfaces.

FIG. 7 is a diagram similar to FIG. 6 and shows the effect of Zn doping on the various crystal surfaces of InGaAlP. As will be noted in FIG. 7, the Zn content increases with increasing mole ratio of the Zn source gas and changes depending on the crystal surfaces. There, the concentration level of the holes is much smaller than that of Mg shown in FIG. 6 in conformity with the result of FIG. 4.

Figure 1:
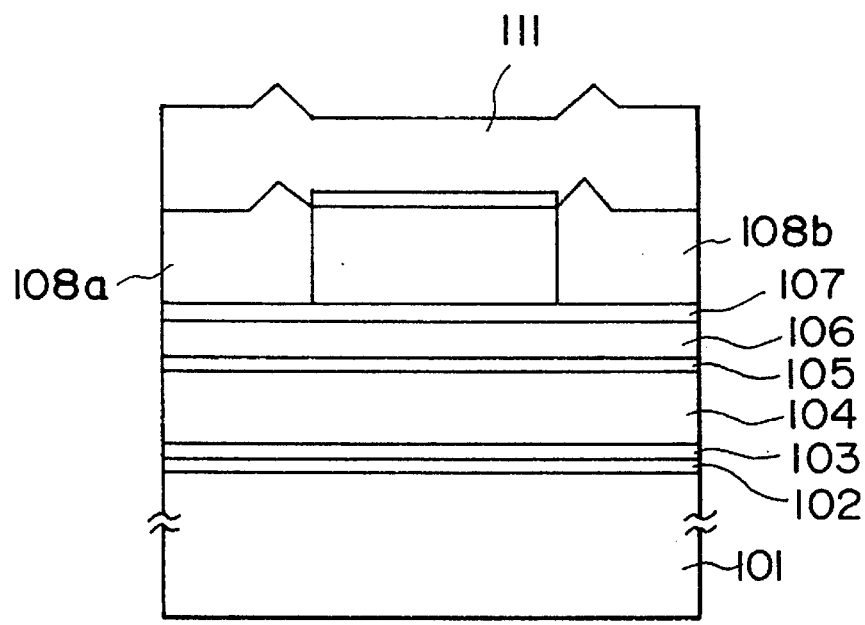
FIG. 1 is a diagram showing the structure of a conventional ridge type laser diode, that uses the loss guide structure, in a transversal cross section.
Figure 2:
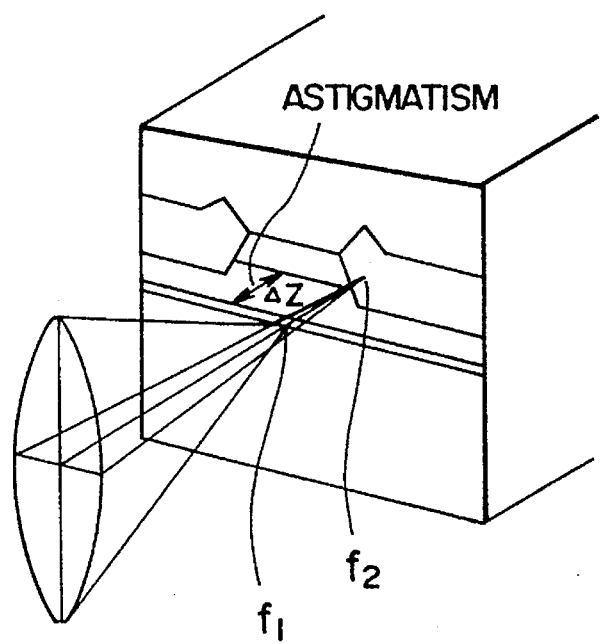
FIG. 2 is a diagram showing the astigmatism occurring in the optical beam produced by the laser diode of FIG. 1.
Figure 3:
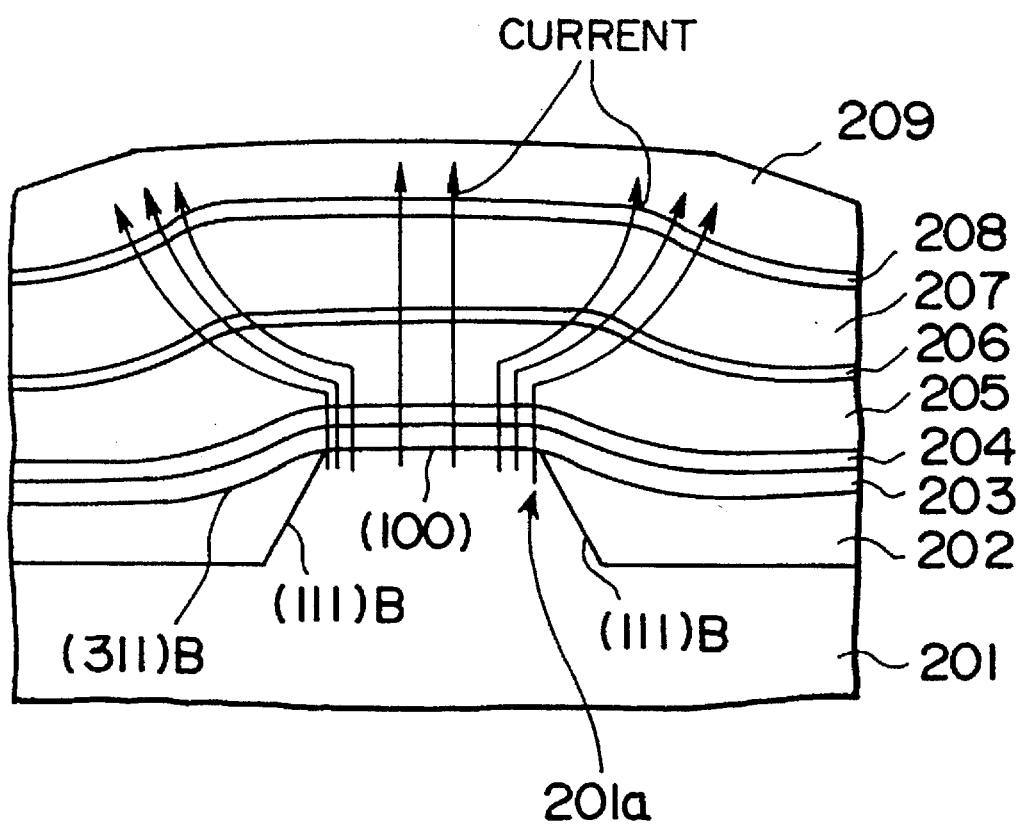
FIG. 3 is a diagram showing the structure of a conventional stripe laser diode, proposed previously by the inventors, in a transversal cross section.
Figure 8:
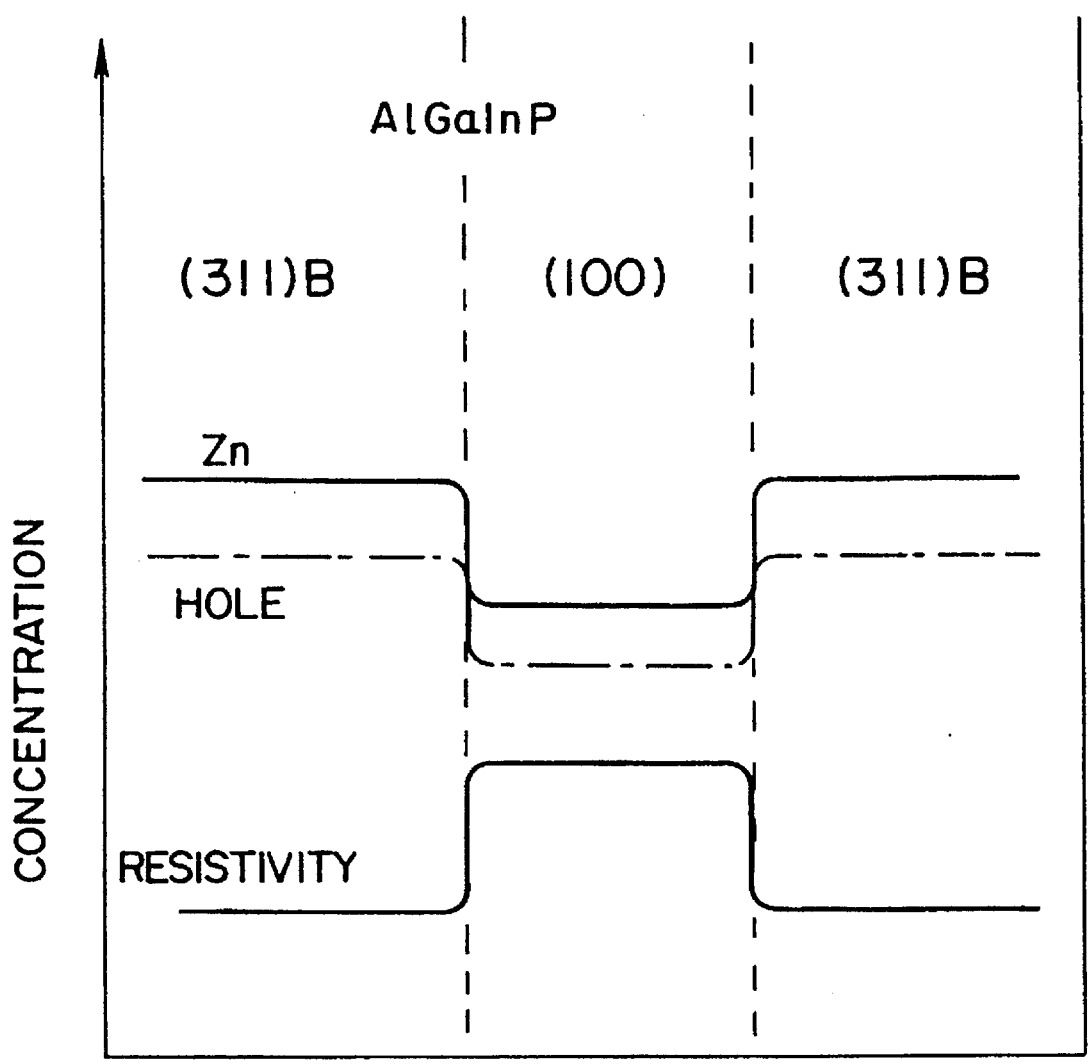
FIG. 8 is a diagram showing the dependence of the hole concentration and resistivity on different crystal surfaces of InGaAlP achieved by the doping of Zn.

When the Zn doping is used in the growth of the p-type clad layer 205 of the device of FIG. 3, it will be noted from the result of FIG. 4 that the oblique part of the layer 205, that is grown on the (311)B surface, is doped with a larger concentration level of Zn as compared with the flat part grown on the (100) surface as illustrated in FIG. 8. Thereby, the carrier density decreases in correspondence to the (100) part that forms the stripe structure, and the resistivity of the clad layer 205 increases in correspondence to the stripe part on which the essential part of the active layer is formed. Thereby, the current injected at the bottom electrode inevitably circumvents the stripe part of the active layer 206 wherein the recombination of carriers should occur, and the efficiency of the laser oscillation is deteriorated inevitably.

Figure 9:
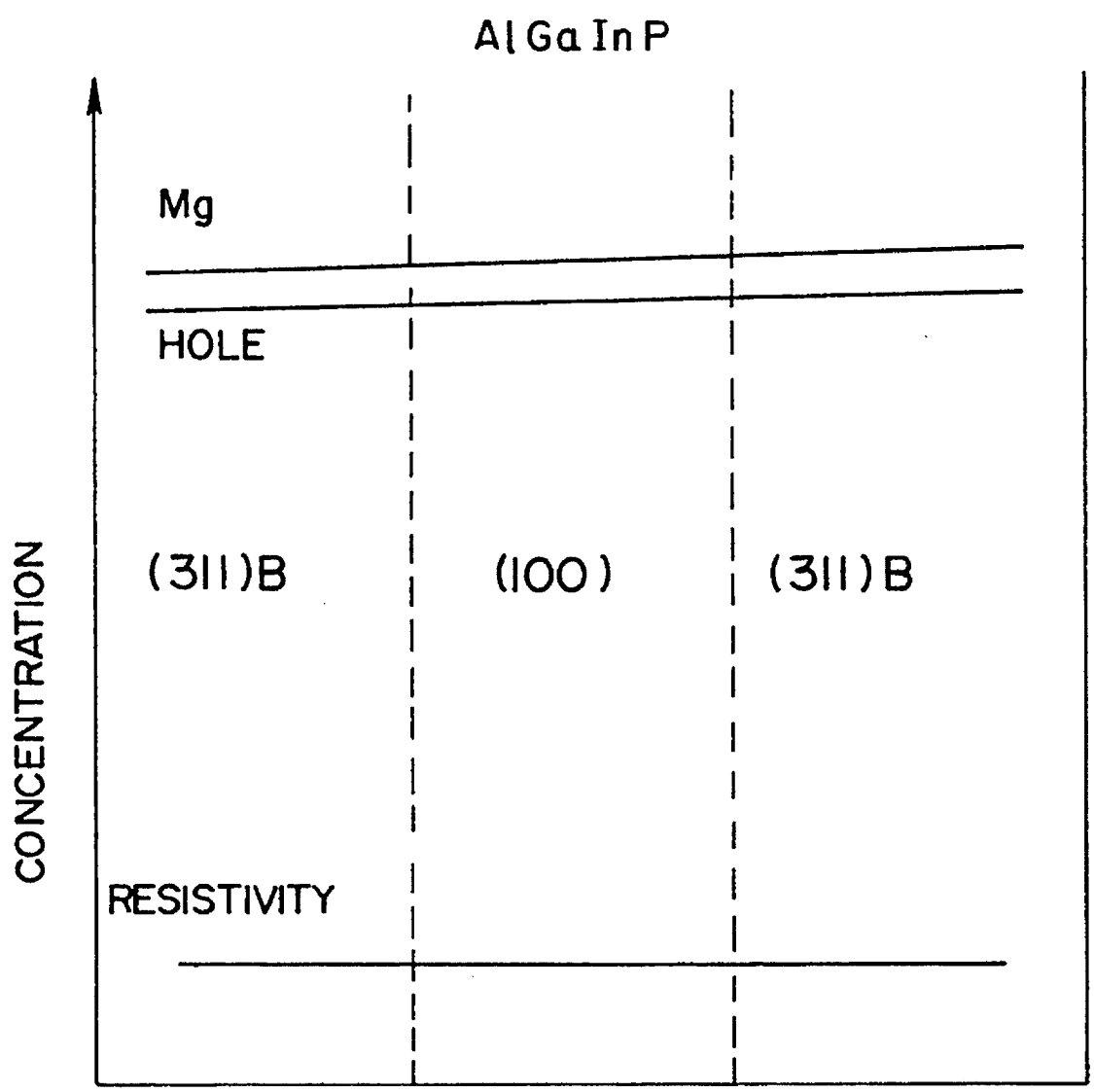
FIG. 9 is a diagram showing the dependence of the hole concentration and resistivity on the different crystal surfaces of InGaAlP achieved by the doping of Mg.

The result of FIG. 4 indicates further that the problem of unwanted increase of the resistivity of the InGaAlP layer in correspondence to the (100) surface can be eliminated when the Mg doping is employed in place of the Zn doping. FIG. 9 shows the Mg concentration level as well as the corresponding hole concentration level together with the resistivity distribution, realized in the InGaAlP layer that is grown on the mesa structure having the (100) surface and a pair of (311)B surfaces at both sides of the (100) surface. In conformity with the result of FIG. 4, it will be noted that the Mg content and hence the hole concentration level remains substantially constant throughout the InGaAlP layer, irrespective of the crystal surfaces.

Next, a first embodiment of the present invention for improving the current confinement in the stripe laser diode by the Mg doping of the clad layer will be described.

Figure 10:
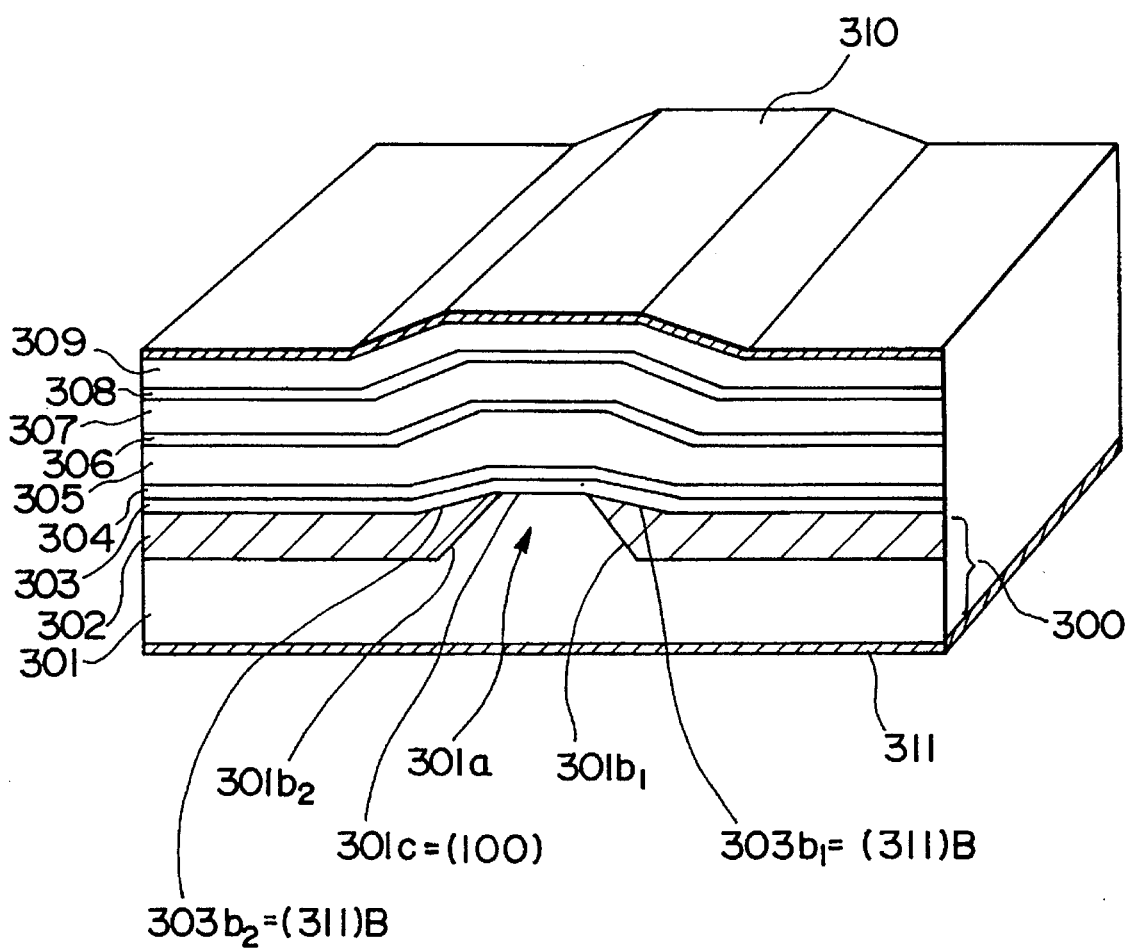
FIG. 10 is a diagram showing the structure of the stripe laser diode according to a first embodiment of the present invention in a perspective view.

Referring to FIG. 10 showing the structure of the laser diode of the first embodiment, the laser diode is constructed on a p-type GaAs substrate 301 that may be doped by Zn to have a carrier concentration level of $1 \times 10^{19}$ cm$^{-3}$. The GaAs substrate 301 has an upper major surface and a lower major surface, each having the (100) orientation, and a mesa structure 301a is formed on the upper major surface so as to extend in the longitudinal direction of the laser diode that is set coincident to the <011> direction of the substrate 301. There, the mesa structure is defined laterally by sloped surfaces $301b_1$ and $301b_2$ each having the (111)B orientation, and there extends a stripe surface 301c having the (100) orientation in coincidence to the longitudinal direction of the laser diode.

On the upper major surface of the substrate 301, a current confinement layer 302 of n-type GaAs is grown epitaxially with a thickness of about 1 μm such that the stripe surface 301c extends in the longitudinal direction of the laser diode. There, the current confinement layer 302 is doped by Si or Se to a carrier concentration level of about $5\times10^{18}$ cm$^{-3}$ and forms a pair of well developed oblique surfaces $303b_1$ and $303b_2$ at both sides of the exposed stripe surface 301c of the GaAs substrate. Further, it will be noted that the oblique surfaces $303b_1$ and $303b_2$ are equivalent to each other and each forms a (311)B surface. In other words, there is formed a second mesa structure above the first mesa structure with an (100) oriented stripe surface formed coincident to the (100) oriented stripe surface 301c, and a pair of oblique or sloped surfaces $303b_1$ and $303b_2$ each having the (311)B orientation are formed to extend at both sides of the stripe surface 301c in the longitudinal direction of the device. Thereby, the substrate 301 and the current confinement layer 302 forms a substrate structure 300, and the essential part of the laser diode is constructed on the substrate structure 300 by an MOCVD process. There, In is supplied in the form of trimethylindium (TMI), Ga is supplied in the form of trimethylgallium (TMG), Al is supplied in the form of triethylaluminum (TEA), As is supplied in the form of arsine, and P is supplied in the form of phosphine, as commonly practiced in the art, with a condition similar to the condition given in TABLE I.

On the substrate structure 300, a buffer layer 303 of GaAs doped to the p-type by Zn and/or Mg with the carrier concentration level of $1\times10^{18}$ cm$^{-3}$ is grown epitaxially by a MOCVD process with a thickness of about 0.1–0.2 μm, and a first intermediate layer 304 of InGaP, doped to the p-type by Zn and/or Mg with the carrier concentration level of $1\times10^{18}$ cm$^{-3}$, is grown on the buffer layer 303 epitaxially with a thickness of about 0.1 μm also by a MOCVD process. Thereby, the morphology of the second mesa structure of the substrate structure 300 is transferred to the epitaxial layers 303 and 304, and the InGaP layer 304 thus grown has a corresponding mesa structure of the upper major surface such that there is formed a (100) oriented stripe surface and a pair of (311)B oriented sloped surfaces extending in the longitudinal direction of the device or the <011> direction at both sides of the (100) oriented stripe surface. The intermediate layer 304 acts similar to the intermediate layers 110 and 204 and reduces the kink or spike appearing in the valence band for facilitating the transport of the carriers.

On the upper major surface of the layer 304, a first clad layer 305 of p-type InGaAlP that forms the essential part of the present embodiment and having a composition of $(Al_{0.7}Ga_{0.3})_{0.5}In_{0.5}$, is grown epitaxially by a MOCVD process with a thickness of about 1 μm. There, the doping of the first clad layer 305 is achieved by incorporating bis(cyclo-penta-dienyl)magnesium into the source gases of TMI, TEG, TMA and phosphine, with a flowrate determined based upon the relationship of FIG. 6 such that a carrier concentration level of $1\times10^{18}$ cm$^{-3}$ is achieved. It will be noted that the mesa morphology of the substrate structure 300 is transferred further to the upper major surface of the first clad layer 305. In other words, the upper major surface of the clad layer 305 includes the stripe-like (100) surface corresponding to the apex of the mesa and two (311)B surfaces extending obliquely at both sides of the (100) stripe surface.

On the upper major surface of the clad layer 305 thus formed, an active layer of undoped InGaP is grown with a thickness of 0.07 μm. Again, the mesa morphology on the upper major surface of the clad layer 305 is transferred to the upper major surface of the active layer 306. In other words, the active layer 306 includes an (100) stripe surface and two oblique surfaces having the (311)B orientation in correspondence to the mesa structure. Further, a second clad layer 307 of InGaAlP doped to the n-type is grown epitaxially by an MOCVD process with a thickness of about 1 μm. There, the doping to the n-type is achieved by incorporating hydrogen selenide or silane such as monosilane or disilane into the source gases of In, Ga, Al and P with the condition similar to the condition of TABLE I. In such a structure wherein the active layer is formed on the mesa structure, it will be noted that the (100) stripe surface of the active layer 306 is laterally bounded by the sloped surfaces of the clad layer 307.

On the second clad layer 307, a second intermediate layer 308 of n-type InGaP, doped by Se or Si to the carrier concentration level of about $1\times10^{18}$ cm$^{-3}$, is grown epitaxially with a thickness of about 0.1 μm, and a contact layer of n-type GaAs, doped to the carrier concentration level of $3\times10^{18}$ cm$^{-3}$ is grown with a thickness of about 1 μm. The second intermediate layer 308 also reduces the spike in the conduction band, similarly to the first intermediate layer 304. Further, an upper electrode 310 and a lower electrode 311 are deposited respectively on the upper major surface of the contact layer 309 and the lower major surface of the substrate 301 in ohmic contact therewith. Further, it will be noted that the edge surfaces opposing with each other at the respective, opposite longitudinal ends form the reflectors of the laser diode as usual.

In the present embodiment, one can achieve a uniform doping of the clad layer 305 irrespective of the crystal surface, and the problem of unwanted divergence of the injected current is successfully eliminated. Further, the problem of astigmatism is successfully eliminated by confining the stripe region of the active layer laterally by the sloped surfaces of the clad layer 307.

In the device having the structure of FIG. 10, it will be noted that one may reverse the conductivity type of the epitaxial layers. Thus, one may use an n-type GaAs substrate in place of the p-type substrate 301 and apply the Mg doping to the second clad layer 307 instead of doping the same to the n-type by Se or Si. However, because of the fact that there appears a delay in the incorporation of Mg into the epitaxial layer, there appears a substantial difference between the process for growing the Mg-doped clad layer in the device that is constructed on the p-type substrate and the process for growing the Mg-doped clad layer in the device that is constructed on the n-type substrate. It is believed that such a delay in the incorporation of Mg occurs due to the fact that Mg atoms, released from the organic molecules of $(C_5H_5)_2Mg$ in a reaction vessel, are deposited preferentially on the silicon oxide vessel wall at first, and the incorporation into the epitaxial layer occurs after the vessel wall is covered by the layer of Mg.

Figure 11A:
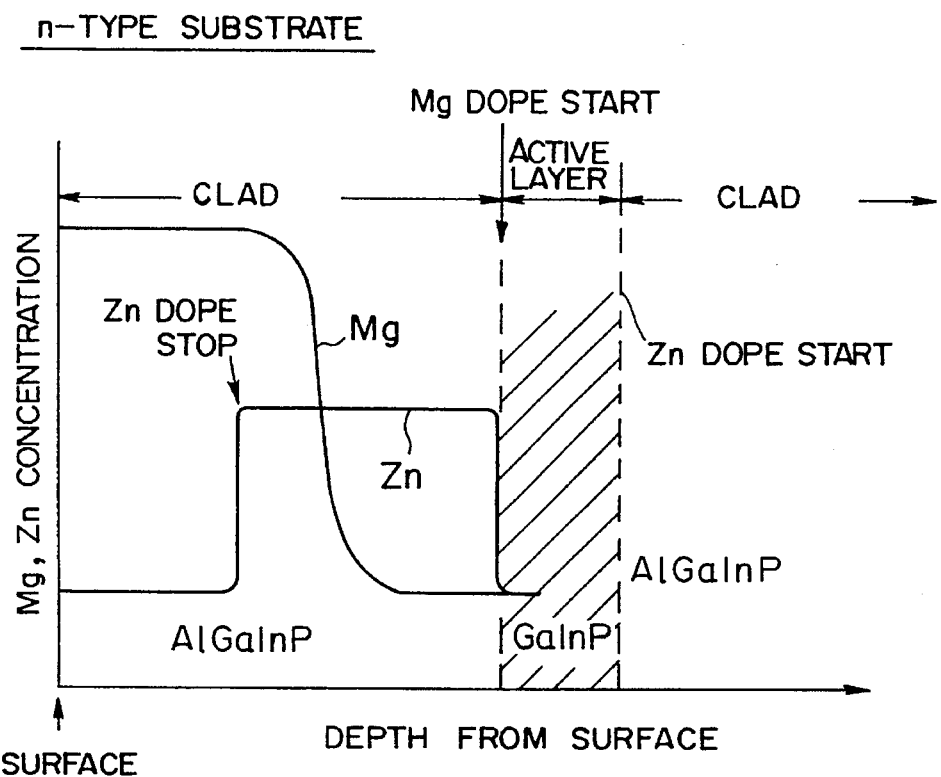
FIGS. 11(A) and 11(B) are diagrams showing the sequence of doping with the growth of the epitaxial layers for forming the structure of FIG. 10.

FIG. 11(A) shows the sequence of doping for incorporating Mg into the clad layer 307 by the MOCVD process in the device that is constructed on the n-type GaAs substrate.

Referring to FIG. 11(A), the deposition of the clad layer 307 is started after the active layer 306 of undoped InGaP is grown, wherein it will be noted that the incorporation of Mg into the clad layer 307 occurs after a substantial time has elapsed from the commencement of growth of the clad layer 307. This in turn means that the part of the clad layer 307 that contacts with the active layer remains in the undoped state, unless an additional doping process is employed simultaneously. When the clad layer 307 is undoped, it will be easily understood that the injection of the carriers to the active layer 306 does not occur. In order to avoid this problem, the process of FIG. 11(A) employs a step of Zn doping in order to compensate for the depletion of Mg in the foregoing part of the clad layer 307. Thus, in correspondence to the commencement of growth of the clad layer 307, Zn is supplied for example in the form of dimethylzinc together with the gaseous source materials for Al, Ga, In and P. Thereby, the incorporation of Zn occurs immediately and the p-type conductivity is guaranteed for the clad layer 307. After a predetermined time corresponding to the interval necessary for Mg to cover the vessel wall of the reaction chamber has elapsed, the supply of Zn is interrupted and Mg starts to be incorporated into the clad layer 307 with a substantial concentration level.

Figure 11B:
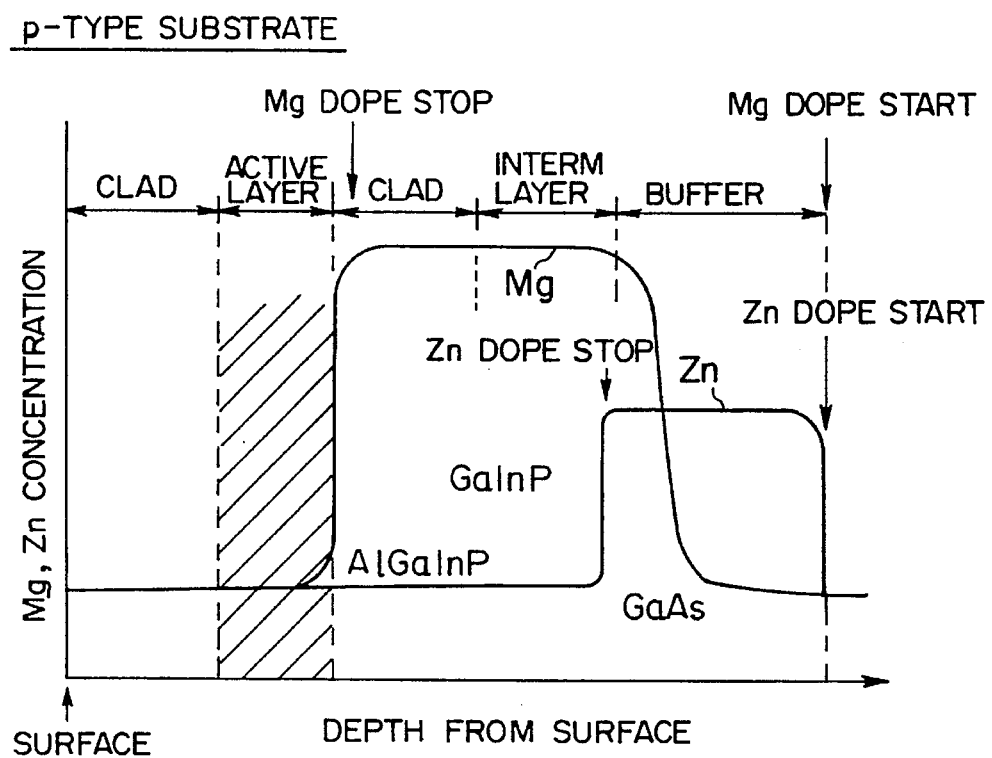

In the process of FIG. 11(B) that uses the p-type GaAs substrate 301, on the other hand, the growth of the GaAs buffer layer 303 is achieved on the p-type substrate structure 300 with the doping to the p-type by incorporating Zn into the layer 303. Further, while the layer 303 is still growing, the supply of Mg is started by admixing bis(cyclo-pentadienyl)magnesium into the source gases of the GaAs layer 303. Thereby, the content of Mg increases with the growth of the GaAs buffer layer 303 and becomes stationary when the growth of the first intermediate layer 304 is started on the buffer layer 303. In correspondence to the start of growth of the intermediate layer 304, the supply of Zn is interrupted. It should be noted that the incorporation of Zn into the layer 303 stops immediately when the supply of Zn is terminated. After the growth of the intermediate layer 304 is completed, the growth of the first clad layer 305 is started while continuing the supply of Mg. Thereby, the concentration level of the holes in the layers 304 and 305 remains substantially constant. When the clad layer 305 is grown to the predetermined thickness, the supply of Mg is interrupted, and the composition of the source material for the epitaxial layer is changed simultaneously. Thereby, the growth of undoped active layer 306 is started. On the active layer thus grown, the second clad layer 307 of Se- or Si-doped InGaAlP is grown as usual.

In the process of FIG. 11(B), it will be noted that one can obtain a sharp boundary of conductivity type in correspondence to the physical boundary between the first clad layer 305 and the active layer 306 that is grown thereon, without employing additional doping process by Zn to the layer 305. Thus, the process of FIG. 11(B) corresponding to the structure described with reference to FIG. 10 is more preferable to the process of FIG. 11(A) wherein the conductivity type of the substrate as well as the epitaxial layers is reversed, although this does not deny the usefulness of the process of FIG. 11(A).

Next, the fabrication process of the structure of FIG. 10 will be described with reference to FIGS. 12(A)–12(D).

Figure 12:
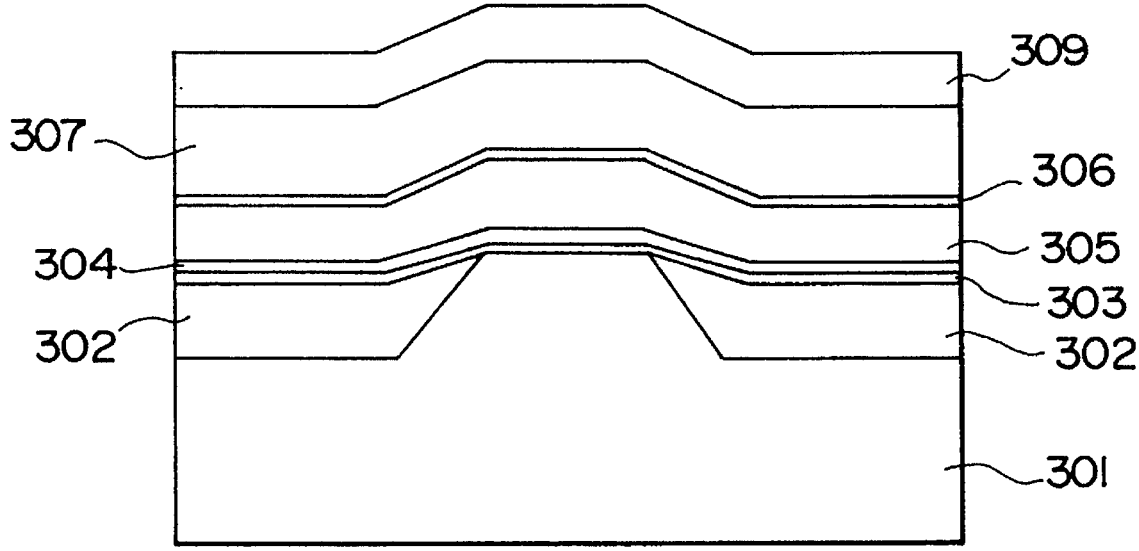
FIGS. 12(A)–12(D) are diagrams showing the process for constructing the device of FIG. 10.
Figure 12:
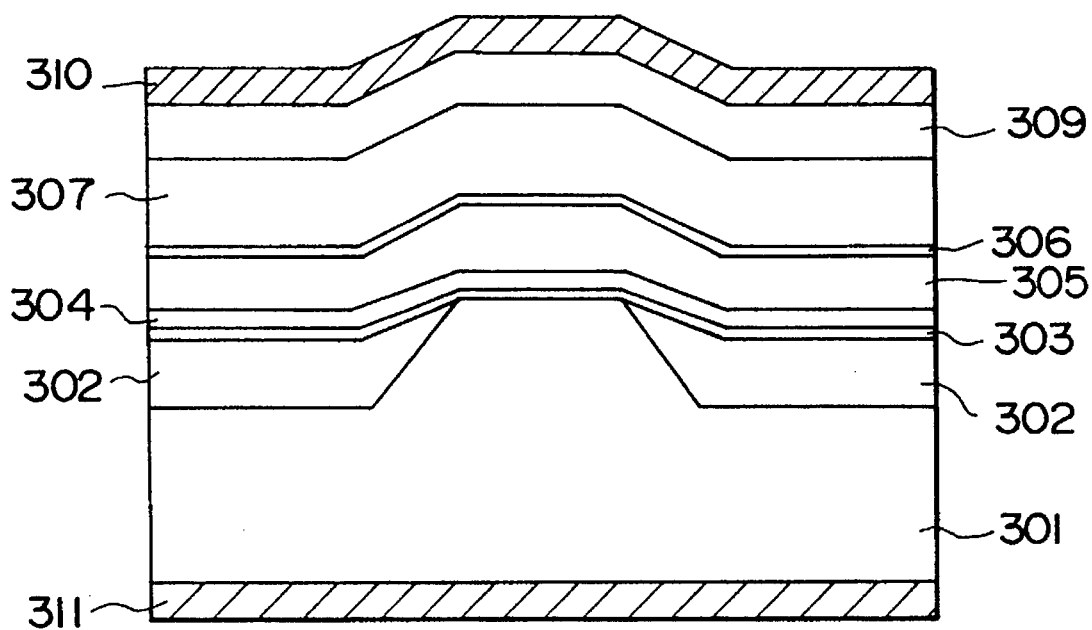
Figure 12A:
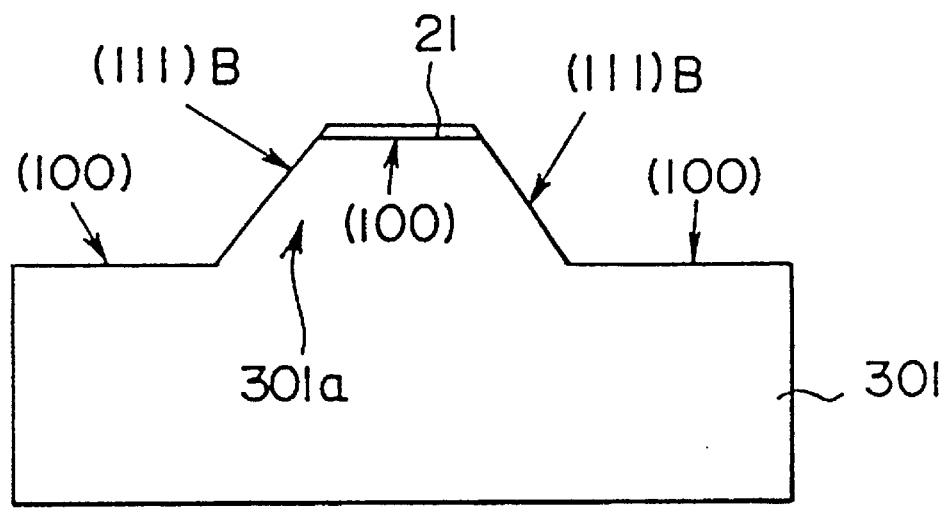

Referring to FIG. 12(A) showing the first step, a silicon oxide layer is provided on the (100) upper major surface of the p-type GaAs substrate 301 and patterned subsequently to form a silicon oxide stripe 21 such that the silicon oxide stripe 21 extends in the <011> direction. Further, while protecting the upper major surface of the substrate 301 by the silicon oxide stripe 21 thus formed, the substrate 301 is subjected to an wet etching process conducted in a mixture of $H_2SO_4$, $H_2O_2$ and $H_2O$ to form a mesa structure that corresponds to the mesa structure 301a and includes a (100) stripe surface extending in the <011> direction at the top thereof with a width of about 5 μm. There, the mesa structure 301a is laterally bounded by a pair of oblique surfaces both characterized by the (111)B surface. Beyond the mesa structure, the (100) upper major surface of the GaAs substrate 301 extends parallel to the (100) stripe surface of the mesa structure 301a.

Figure 12B:
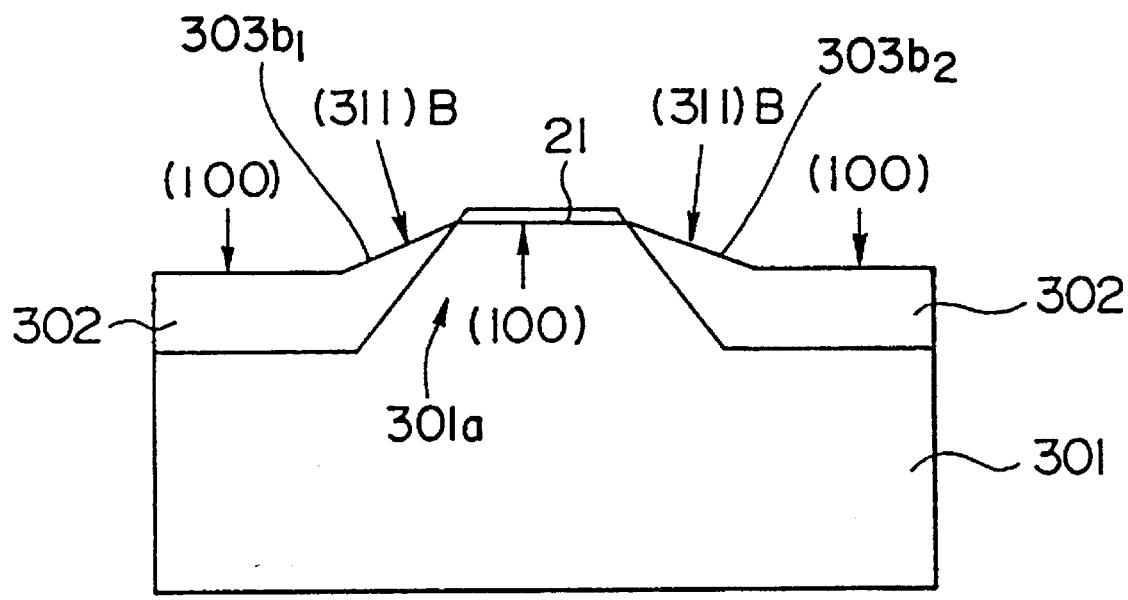

On the structure of FIG. 12(A) thus formed, the deposition of the n-type GaAs layer 302 is achieved by the MOCVD process while protecting the (100) stripe surface of the mesa structure 301a by the mask 21. As the mask 21 is made of silicon oxide, the growth of the epitaxial layer does not occur on the mask 21, while the layer 302 grows on the (100) upper major surface of the GaAs substrate 301 extending at both sides of the mesa structure 301a. Thereby, oblique layers $303b_1$ and $303b_2$ characterized by the (311)B crystal surface, develop on the upper major surface of the layer 302 at both sides of the (100) stripe region as shown in FIG. 12(B) in correspondence to the (111)B surface of the mesa structure 301a. Thereby, the (311)B surfaces $303b_1$ and $303b_2$ form a second mesa structure together with the (100) stripe surface.

After removing the silicon oxide mask 21, the epitaxial growth of the layers 303 through 309 is achieved by the MOCVD process consecutively on the structure of FIG. 12(B) as already described, wherein the growth of the layers 304 and 305 is achieved by the process described already with reference to FIG. 11(B). Thereby, one obtains a layered semiconductor body shown in FIG. 12(C). After the structure of FIG. 12(C) is formed, upper and lower electrodes 310 and 311 are deposited respectively on the upper major surface of the contact layer 309 and on the lower major surface of the substrate 301. Thereby, the layered structure of the laser diode formed as shown in FIG. 12(D).

The construction for confining the injection current according to the first embodiment is effective also when the conductivity type of the epitaxial layers is reversed. More specifically, when one uses the n-type GaAs substrate in place of the p-type substrate 301, the conductivity type is reversed in each of the epitaxial layers. There, the process of FIG. 11(A) is applied to the growth of the p-type clad layer 307 rather than the n-type clad layer 305.

Figure 13A:
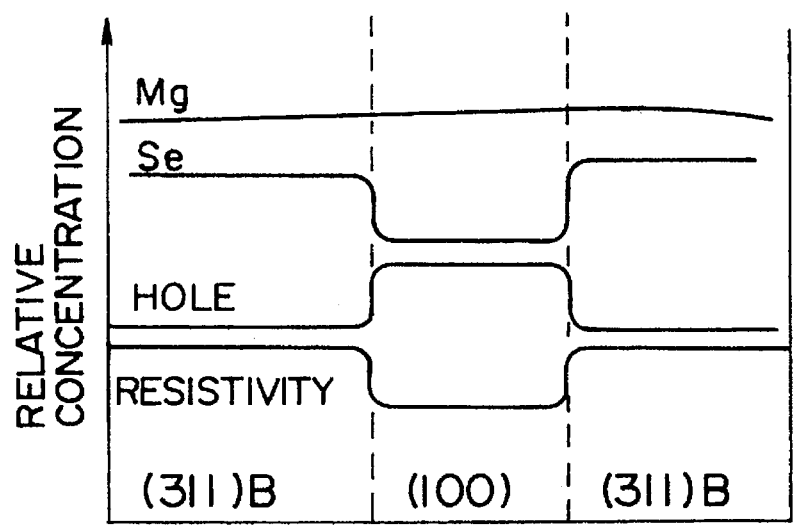
FIGS. 13(A) and 13(B) are diagrams showing the dependence of carrier concentration and resistivity on the different crystal surfaces of InGaAlP achieved by the simultaneous doping of Mg and Se.
Figure 13B:
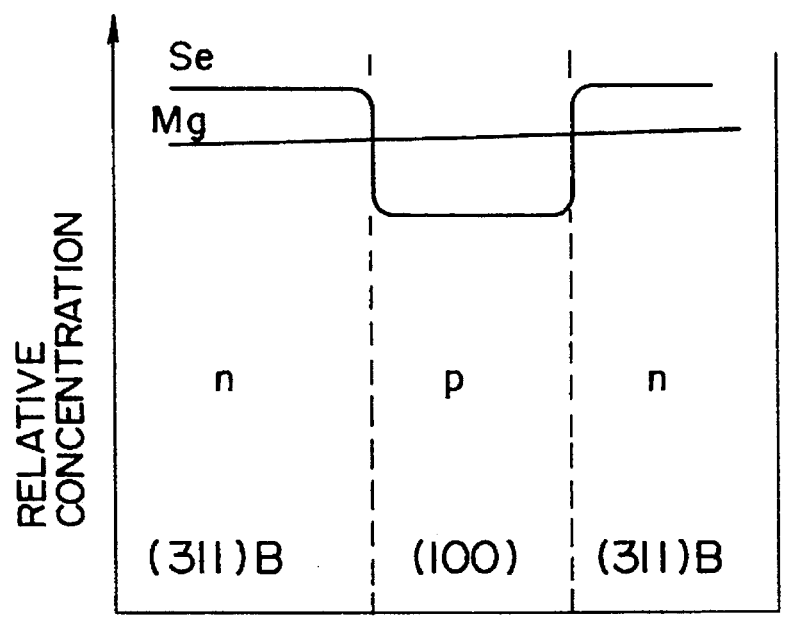

Next, a second embodiment of the present invention will be described with reference to FIGS. 13(A) and 13(B) as well as FIG. 14, wherein FIGS. 13(A) and 13(B) show the principle of the second embodiment.

Referring to FIG. 13(A) showing the concentration level of Mg and Se in the epitaxial layer of InGaAlP for various crystal surfaces, it will be noted that the concentration level of Se increases slightly in the (311)B surface as compared with the (100) surface. In other words, the concentration level of Se and hence the electron density decrease slightly in the InGaAlP layer in correspondence to the (100) surface as compared with the (311)B surface that forms the mesa structure together with the (100) surface. On the other hand, the concentration level of Mg and hence the hole density remains substantially constant in the same InGaAlP crystal irrespective of the crystal surfaces. Further, in the example of FIG. 13(A), it should be noted that the concentration level of Mg is larger than the concentration level of Se, doped simultaneously to Mg, in any of the (311)B surface and (100) surface, such that the InGaAlP crystal is doped to the p-type irrespective of the crystal surface, while it should be noted that there appears a difference in the resistivity depending on the crystal surface because of the different carrier concentration level in the (311)B surface and in the (100) surface. More specifically, the hole density increases in correspondence to the (100) surface as compared with the (311)B surface because of the reduced electron density in the (100) surface. Using the principle of FIG. 13(A), one can decrease the resistivity of the clad layer selectively in correspondence to the (100) stripe region while increasing the resistivity in correspondence to the (311)B side walls of the mesa structure.

FIG. 13(B) shows another principle of the second embodiment device wherein the concentration level of simultaneously doped Mg and Se is adjusted such that the conductivity type of InGaAlP changes depending on the crystal surface. There, it will be noted that one can set the conductivity type of the InGaAlP crystal grown on the (311)B surface to the n-type while simultaneously setting the conductivity type of the InGaAlP crystal grown on the (100) surface to the p-type.

Figure 14:
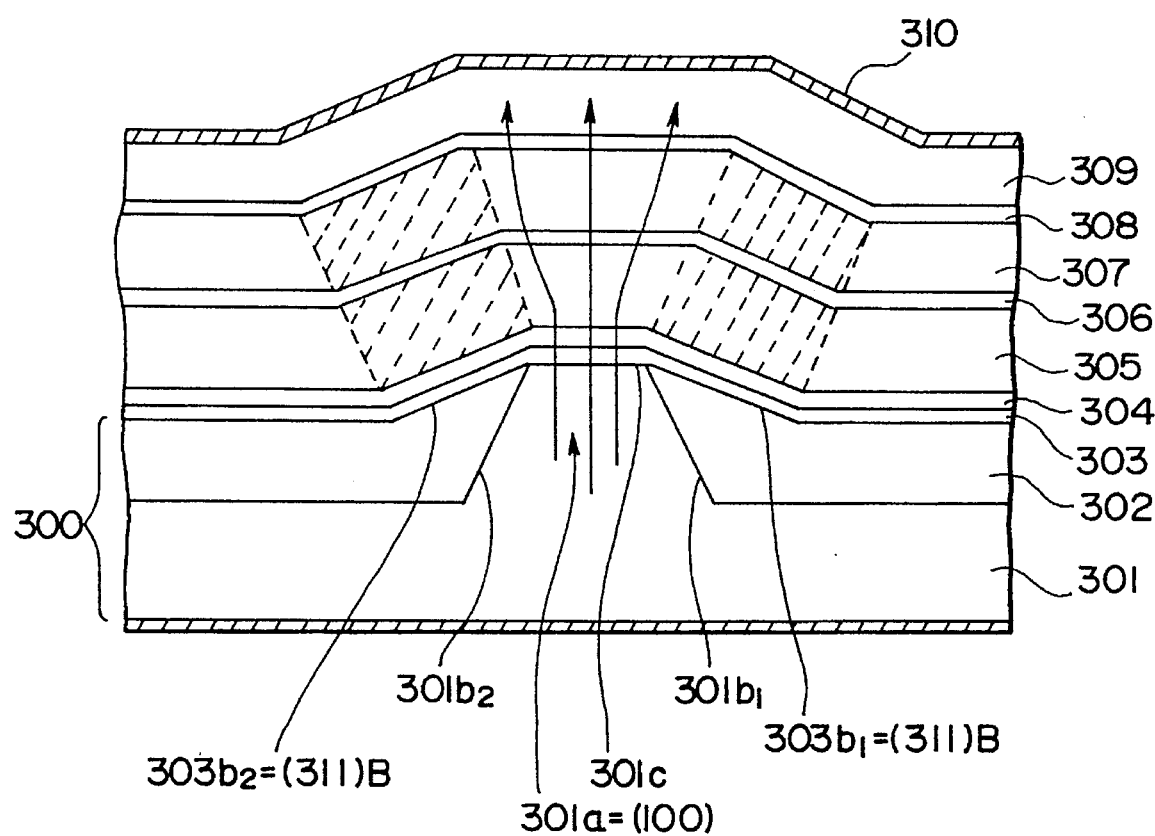
FIG. 14 is a diagram showing the structure of a stripe laser diode of a second embodiment of the present invention fabricated according to the principle of FIGS. 13(A) and 13(B) in a transversal cross section.

FIG. 14 shows the transversal cross section of the laser diode of the second embodiment wherein the foregoing principle is applied for realizing a current confinement structure. As the device has essentially the same structure as the device of FIG. 10, only the essential part of the device will be described.

In the device of FIG. 14, the first clad layer 305 is formed by the epitaxial process with the simultaneous doping of Mg and Se such that Mg has a concentration larger than Se for both the (311)B surface and the (100) surface as explained with reference to FIG. 13(A). For example, one may set the concentration level of Mg and Se in the respective parts of the InGaAlP clad layer 305 as shown in TABLE II below.

TABLE II

| DOPANT (CARRIER) CONCENTRATION LEVEL (cm$^{-3}$) | | |
|---|---|---|
| | (100) | (311)B |
| Mg | $1 \times 10^{18}$ | $1 \times 10^{18}$ |
| Se | $4 \times 10^{17}$ | $8 \times 10^{17}$ |
| carrier | $p = 6 \times 10^{17}$ | $p = 2 \times 10^{17}$ |

By setting the doping level as set forth in TABLE II, the resistivity of the clad layer 305 increases in correspondence to the part grown on the (311)B surface as indicated in FIG. 14 by the hatching, and the drive current, supplied at the electrode 311 and confined laterally by the n-type GaAs layer 302, is selectively injected to the stripe part of the active layer 306 through the low-resistivity (100) region of the clad layer 305 located immediately above the (100) stripe surface of the mesa structure. Thereby, one can increase the efficiency of laser oscillation substantially.

In the modification of the second embodiment corresponding to the principle of FIG. 13(B), the doping level of Mg and Se may be set as shown in the following TABLE III.

TABLE III

| DOPANT (CARRIER) CONCENTRATION LEVEL (cm$^{-3}$) | | |
|---|---|---|
| | (100) | (311)B |
| Mg | $1 \times 10^{18}$ | $1 \times 10^{18}$ |
| Se | $6 \times 10^{17}$ | $1.2 \times 10^{18}$ |
| carrier | $p = 4 \times 10^{17}$ | $n = 2 \times 10^{17}$ |

Thereby, one can change the conductivity type selectively in correspondence to the (311)B region as indicated by the hatching in FIG. 14, and an efficient blocking of drive current is achieved such that the injected current flows selectively to the stripe region of the active layer 306 corresponding to the (100) stripe surface of the mesa structure as indicated by arrows in FIG. 14. As a result of such a lateral confinement of the drive current, one can maximize the efficiency of laser oscillation.

In any of the foregoing two modifications of the second embodiment, the current confinement structure is formed within the clad layer that is formed immediately adjacent to the active layer. Thus, the divergence of the drive current after the current confinement is minimized. In other words, the device of FIG. 14 is improved further over the device of FIG. 10 with respect to the lateral current confinement.

Further, one can provide a current confinement structure also in the second clad layer 207 by doping the same simultaneously by Se and Zn as shown by hatching in FIG. 14.

Figure 15A:
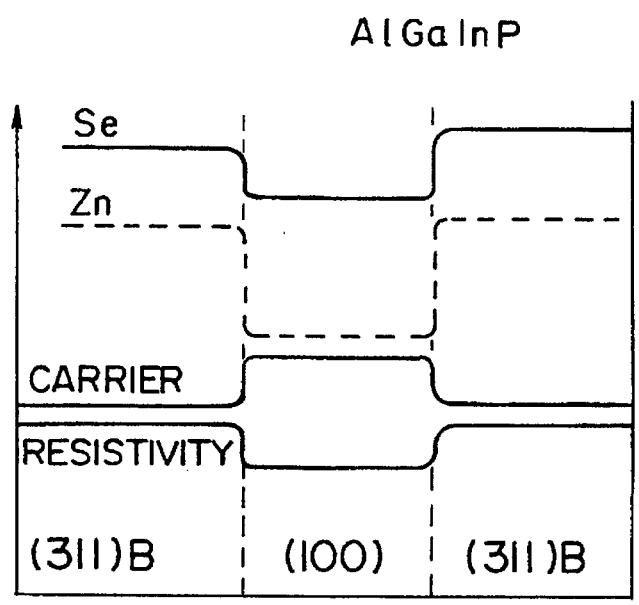
FIGS. 15(A) and 15(B) are diagrams showing the dependence of the carrier concentration level and the resistivity on various crystal surfaces of InGaAlP achieved by the simultaneous doping of Zn and Se.
Figure 15B:
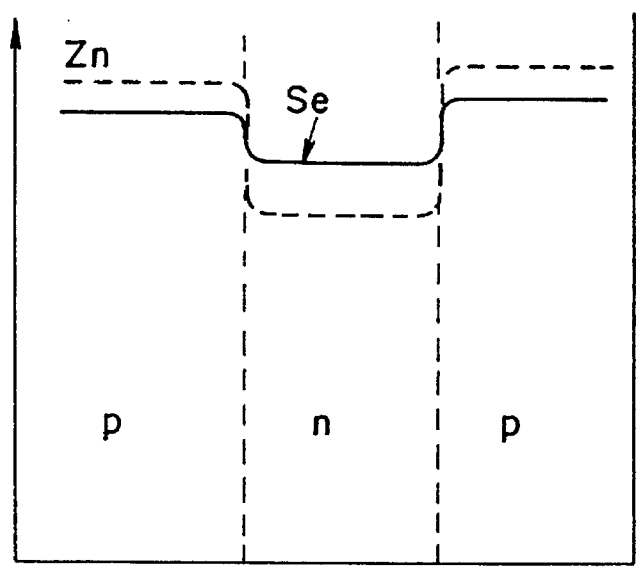

FIGS. 15(A) and 15(B) show the principle of construction of such a current confinement structure, wherein FIG. 15(A) shows the case in which the InGaAlP layer 307 is doped to the n-type irrespective of whether the layer 307 is grown on the (100) surface or (311)B surface, while FIG. 15(B) shows the case where the conductivity type changes in the layer 307 depending on the crystal surface. In the embodiment of FIG. 15(A), the resistivity changes, although the conductivity type does not change, such that the electron density decreases at the part grown on the (311)B surface as compared with the part that is grown on the (100) surface.

In any of the doping schemes of FIG. 15(A) and FIG. 15(B) employed for the clad layer 307, the drive current flows selectively through the mesa region grown on the (100) stripe surface as shown in FIG. 14, and the degree of current confinement is even more improved as compared with the embodiment wherein the current confinement structure is provided only in the first clad layer 305. One may realize the doping scheme shown in FIG. 15(A) by employing the doping level listed in TABLE IV below, while the doping scheme of FIG. 15(B) may be obtained by employing the doping level listed in TABLE V.

TABLE IV

| DOPANT (CARRIER) CONCENTRATION LEVEL (cm$^{-3}$) | | |
|---|---|---|
| | (100) | (311)B |
| Zn | $6 \times 10^{17}$ | $1.8 \times 10^{18}$ |
| Se | $1 \times 10^{18}$ | $2 \times 10^{18}$ |
| carrier | $n = 4 \times 10^{17}$ | $n = 2 \times 10^{17}$ |

TABLE V

| DOPANT (CARRIER) CONCENTRATION LEVEL (cm$^{-3}$) | | |
|---|---|---|
| | (100) | (311)B |
| Zn | $7 \times 10^{17}$ | $2.1 \times 10^{18}$ |
| Se | $1 \times 10^{18}$ | $2 \times 10^{18}$ |
| carrier | $n = 3 \times 10^{17}$ | $p = 1 \times 10^{17}$ |

Next, a third embodiment of the present invention will be described wherein an additional current confinement structure is embedded in the clad layer 305 or 307.

Figure 16:
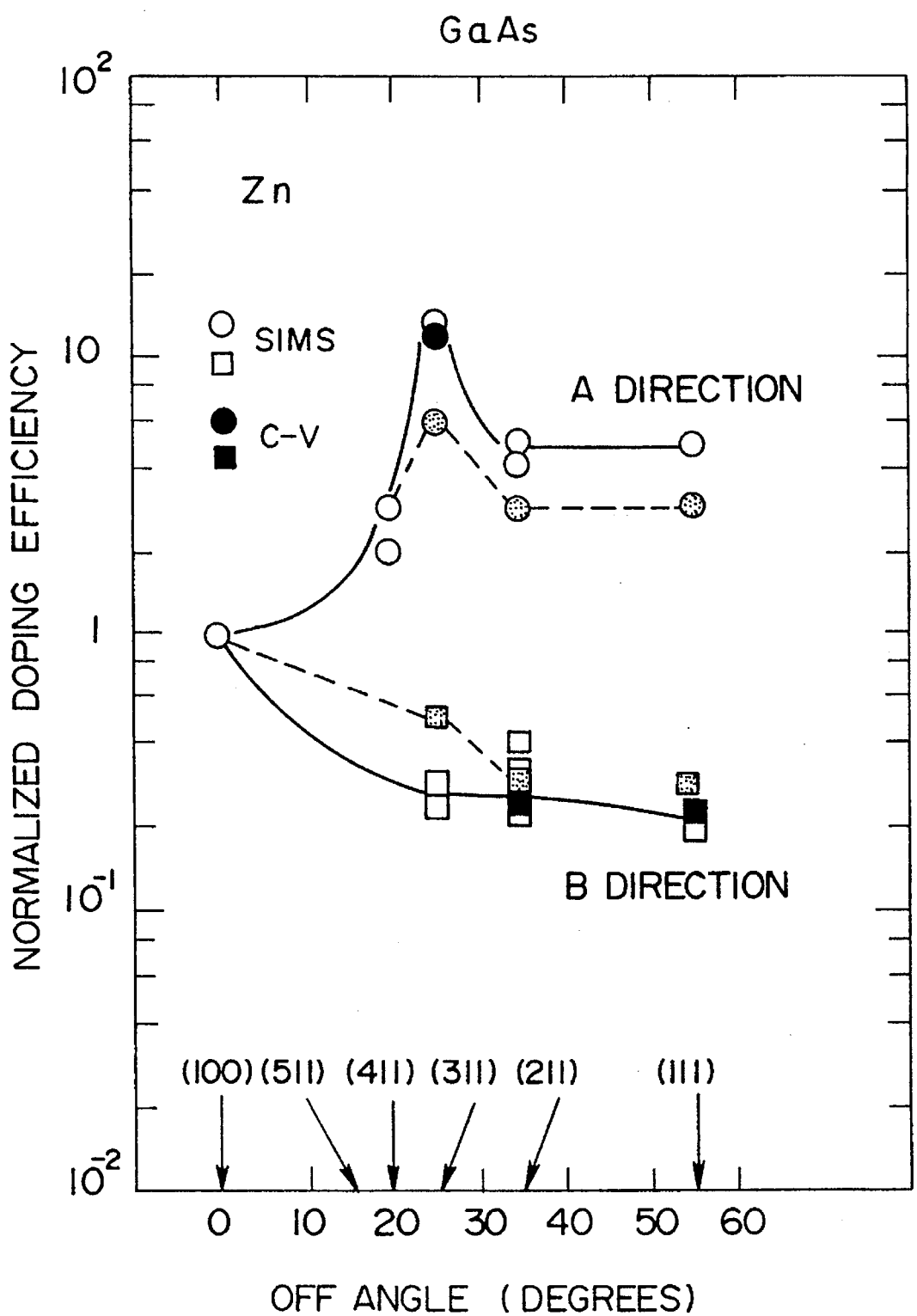
FIG. 16 is a diagram showing the relationship between the doping efficiency and the crystal surface of a GaAs crystal for Zn.
Figure 17:
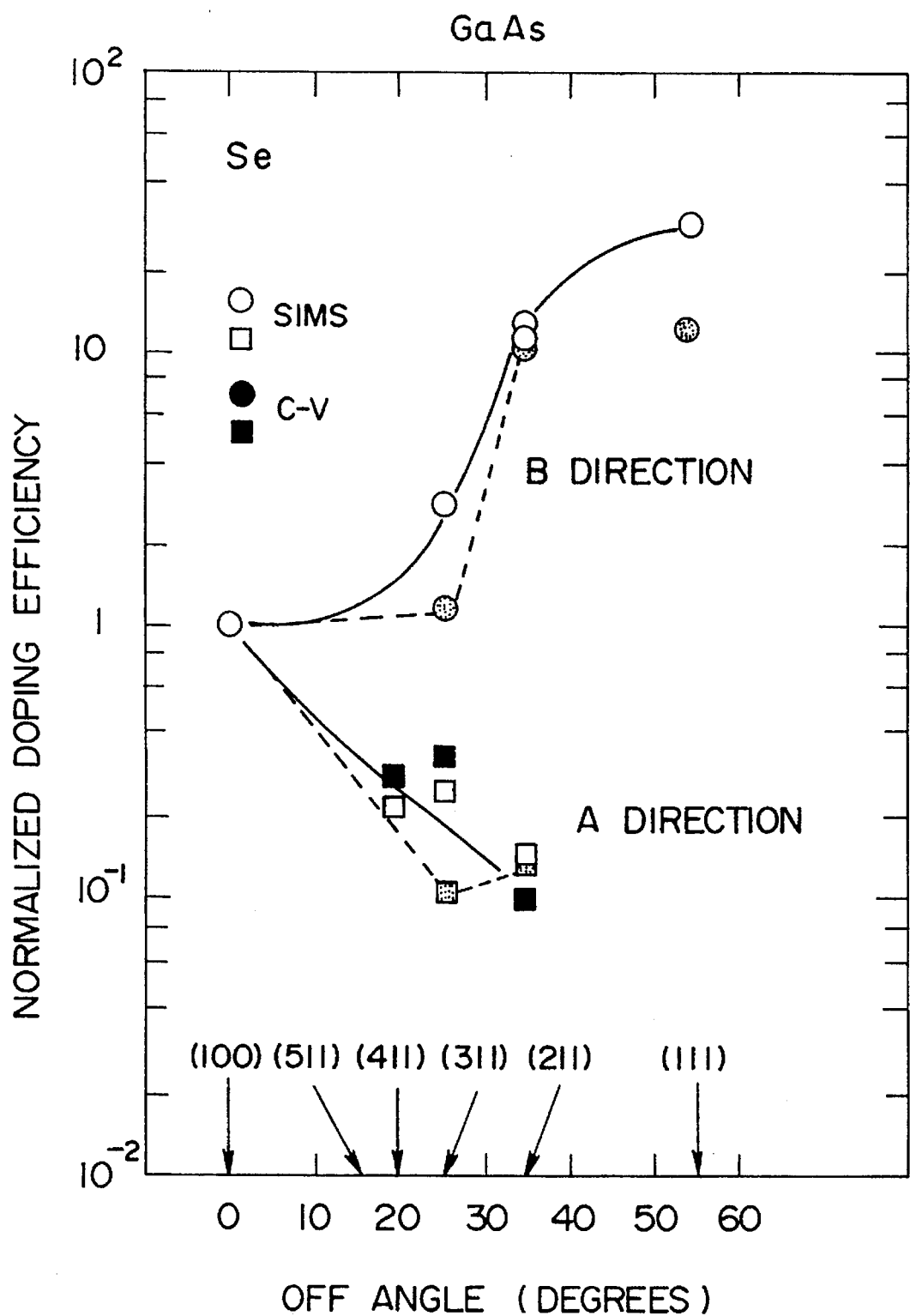
FIG. 17 is a diagram showing the relationship between the doping efficiency and the crystal surface of a GaAs crystal for FIG. 18 is a diagram showing the principle for changing the conductivity type of GaAs, depending on the crystal surface thereof, based upon the relationship of FIGS. 16 and 17.

First, the principle of the third embodiment will be described with reference to FIGS. 16 and 17, wherein FIG. 16 shows the concentration level of Zn incorporated in a GaAs layer grown by a MOCVD process for various crystal surfaces on which the GaAs layer is grown, while FIG. 17 shows the concentration level of Se that is incorporated in the GaAs layer for various crystal surfaces. There, it will be noted that the Zn content decreases with increasing offset angle to the (111)B surface as measured from the (100) reference surface, while the Se content increases with increasing offset angle to the (111)B surface. Further, the Zn content increases with increasing offset angle to the (111)A surface and shows a maximum generally in correspondence to the (311)A surface, while the Se content decreases monotonously with increasing offset angle to the (111)A surface. Thus, by incorporating Zn and Se simultaneously into a GaAs layer that is grown epitaxially on various crystal surfaces, one can change the electrical property, such as the resistivity or conductivity type, depending on the crystal surface on which the GaAs layer is grown.

Figure 18:
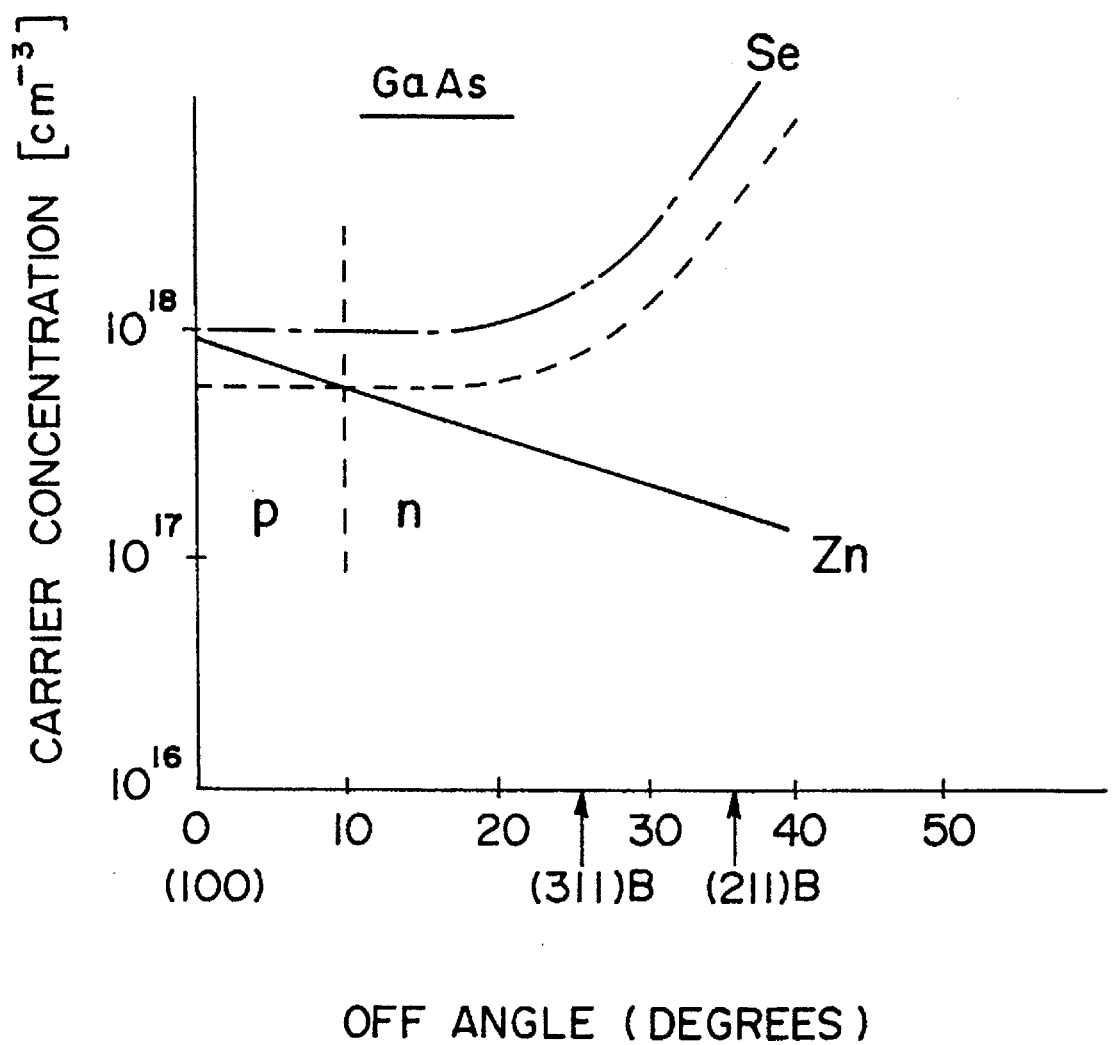

FIG. 18 shows the change of the conductivity type that can be achieved in a GaAs layer grown by the MOCVD process. Referring to FIG. 18, it will be noted that one obtains a high resistivity layer when the GaAs layer is grown on the (100) surface and doped simultaneously by Se and Zn with the equal concentration level of about $1 \times 10^{18}$ cm$^{-3}$. When the surface on which the GaAs layer is grown is tilted toward the (111)B surface, it will be noted that the Zn content decreases gradually and the GaAs layer shows the n-type conductivity. Further, when the concentration level of Se is set slightly smaller than Zn, the GaAs layer grown on the (100) surface shows the p-type conductivity due to the excess in the holes produced by Zn. With increasing offset angle, the Zn content decreases gradually and the conductivity type reverses in correspondence to the offset angle of about 10 degrees as can be seen in FIG. 18.

Figure 19:
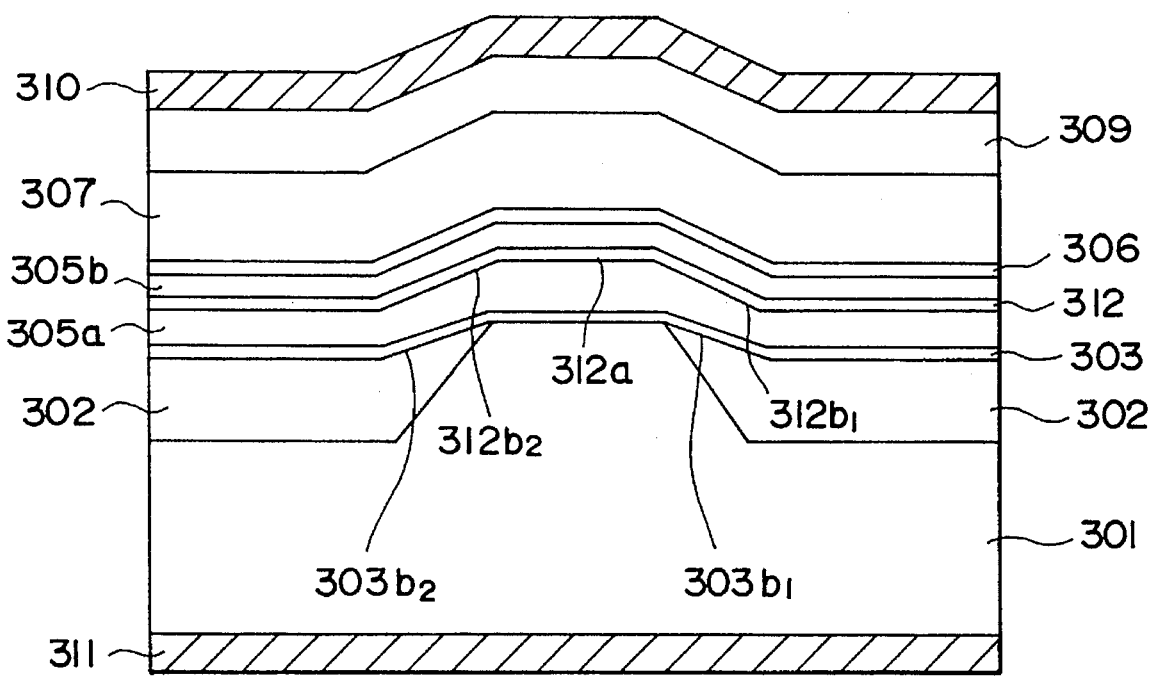
FIG. 19 is a diagram showing the structure of a stripe laser diode according to a third embodiment of the present invention wherein the principle of FIG. 18 is used in a transversal cross section.

FIG. 19 shows the structure of the laser diode of the third embodiment, wherein a GaAs current confinement layer is provided within the clad layer.

Referring to FIG. 19, the laser diode has a structure similar to the device of FIG. 10 or FIG. 14 except for one point that the intermediate layers 304 and 308 are omitted. In the device of FIG. 19, those parts that correspond to the parts described in the previous embodiments will be designated by the same reference numerals and the description will be omitted.

In the present embodiment, a thin GaAs layer 312 is provided within the clad layer 305 such that the clad layer 305 is split into a lower part 305a and an upper part 305b. There, the GaAs layer has a thickness of about 8 nm and is divided into three distinct regions, a first, stripe-like region 312a formed on the (100) surface and extending in correspondence to the mesa structure, a pair of second regions $312b_1$ and $312b_2$ formed on the (311)B surface in correspondence to the mesa structure and extending at both sides of the region 312a. There, the GaAs layer 312 is grown by the MOCVD process and doped simultaneously by Zn and Se such the region 312a is doped to the p-type while the regions $312b_1$ and $312b_2$ are doped to the n-type. Such a doping of the layer 312 can be achieved by setting the concentration level of Zn and Se as shown in FIG. 18. More specifically, one may admix dimethylzinc and hydrogen selenide into the source gases of TEG and arsine for growing the GaAs layer 312 with respective concentration levels such that a Zn concentration level of about $1 \times 10^{18}$ cm$^{-3}$ and a Se concentration level of about $5 \times 10^{17}$ cm$^{-3}$ are achieved in the (100) surface. Thereby, the n-type regions $312b_1$ and $312b_2$ are doped to the n-type and act to block the current injected to the active layer 306, and the effect of the current confinement is enhanced substantially.

Figure 20:
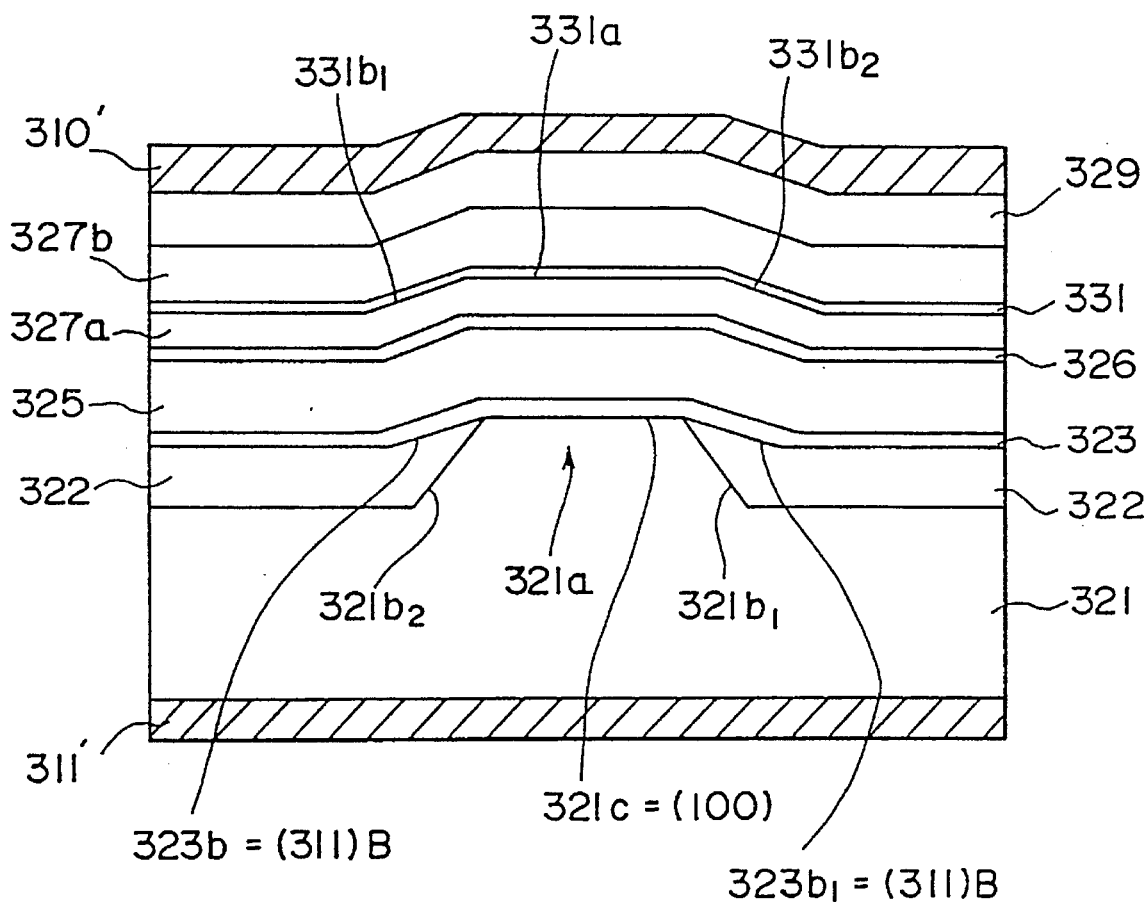
FIG. 20 is a diagram showing the stripe laser diode according to a modification of the third embodiment.

FIG. 20 shows a modification of the third embodiment. There, the device has a structure similar to the device of FIG. 19 except for the point that the conductivity type of each epitaxial layers as well as the conductivity type of the GaAs substrate is reversed. More specifically, the device is constructed on an n-type GaAs substrate 321 that has a mesa structure 321a corresponding to the mesa structure 301a of the substrate 301. On the substrate 321, epitaxial layers 322 through 329 are grown in correspondence to the epitaxial layers 302–309 of FIG. 19 except for the conductivity type. As the construction of the device of FIG. 20 is obvious from the construction of the device of FIG. 19, further description about the details will be omitted.

In the device of FIG. 20, it should be noted that a thin GaAs layer 331 having a thickness of about 8 nm is provided within the p-type clad layer 327 of InGaAlP such that the clad layer 327 is divided into a first layer 327a located below the layer 331 and a second layer 327b located above the layer 331. The layer 331 is doped simultaneously by Zn and Se such that the layer 327 is divided into a p-type region 331a formed in correspondence to the (100) stripe surface of the mesa structure and two n-type regions $331b_1$ and $331b_2$ formed at respective, opposite sides of the n-type region 327a in correspondence to the (311)B surface. The doping of the GaAs layer 331 can be achieved similarly to the layer 312 and the description will be omitted.

Figure 21:
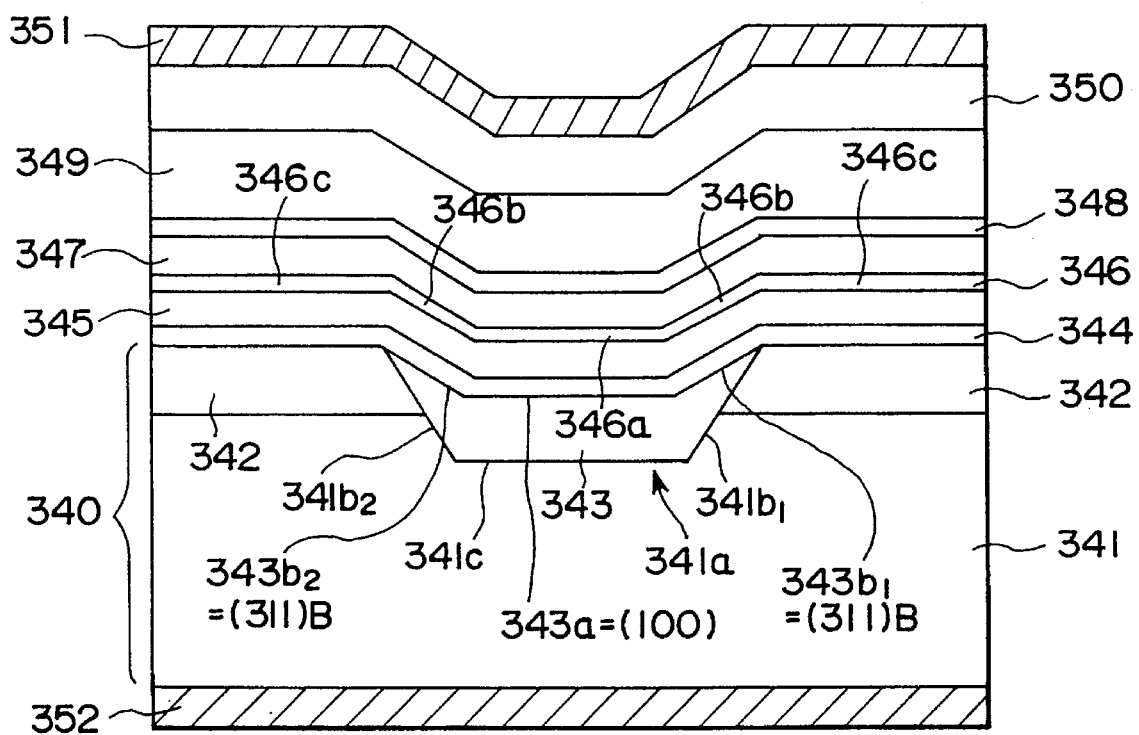
FIG. 21 is a diagram showing the stripe laser diode according to another modification of the third embodiment.

FIG. 21 shows another modification of the third embodiment, wherein the device is constructed on a p-type GaAs substrate 341 covered by an n-type GaAs current blocking layer 342 that corresponds to the layer 302, wherein there is provided a groove 341a on the upper major surface of the layer 342 such that the groove penetrates through the layer 342 and reaches the substrate 341. There, the groove 341a forms a negative mesa structure characterized by a (100) oriented stripe-like bottom surface 341c formed of an exposed surface of the GaAs substrate 341 and a pair of (111)B surfaces $341b_1$ and $341b_2$ at the both sides of the (100) stripe-like bottom surface. Typically, the (100) stripe surface has a width of 5 μm similarly to the previous embodiments.

Figure 22A:
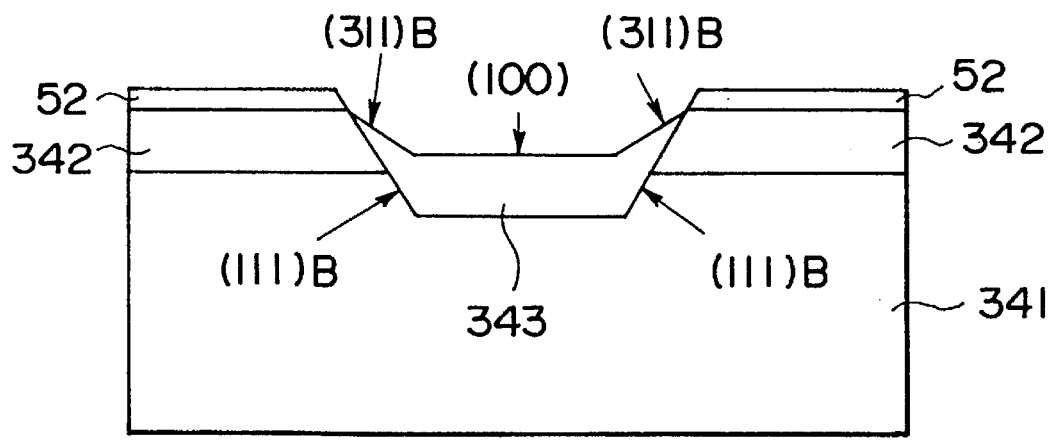
FIGS. 22(A) and 22(B) are diagrams showing the process for fabricating the device of FIG. 21.

On the upper major surface of the layer 342 thus formed with the negative mesa structure 341a, a p-type GaAs layer is grown epitaxially while protecting the upper major surface of the n-type GaAs layer 342, except for the mesa structure 341a, by a silicon oxide mask 52. See FIG. 22(A). Thereby, a p-type region 343 is grown selectively in correspondence to the exposed surface of the negative mesa structure 341a such that the p-type region 343 forms a second negative mesa structure 341a corresponding to the first mesa structure 341a and is characterized by a (100) stripe surface 343a at the bottom and a pair of (311)B surfaces $343b_1$ and $343b_2$ at both sides of the stripe surface 343a. Thereby, the p-type GaAs substrate 341, the n-type GaAs layer 342 and the p-type GaAs layer 343 form a substrate structure 340 on which the essential part of the laser diode is constructed.

Figure 22B:
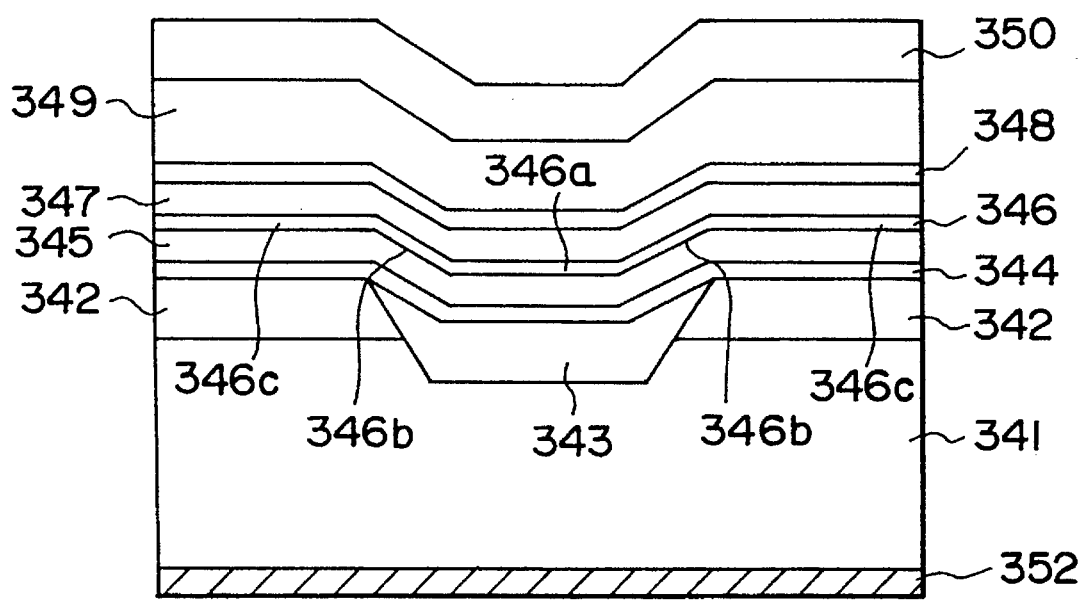

On the substrate structure 340 and as shown in FIG. 22B, a buffer layer 344 of p-type GaAs is grown epitaxially with a thickness of about 0.2 μm and in conformity with the morphology of the second mesa structure, and a first clad layer 345 of p-type InGaAlP is grown on the buffer layer 344 in conformity with the morphology of the second mesa structure. The clad layer 345 may be doped by incorporating Mg therein, as described in the first embodiment, or by incorporating Mg and Se simultaneous therein as described in the second embodiment.

On the upper major surface of the clad layer 345, a current blocking layer 346 of p-type GaAs is grown epitaxially with the doping achieved simultaneously by Zn and Se, such that the layer 346 has the p-type in correspondence to the region that id grown on the (100) surface and such that the layer 346 has the n-type in correspondence to the region that is grown on the (311)B surface. Further, a second clad layer 347 of p-type InGaAlP is grown on the current blocking layer 346 thus grown, and an active layer 348 of undoped InGaP is grown on the clad layer 347 thus formed. Further, an n-type clad layer 349 is grown on the active layer 348 and a contact layer 350 of n-type GaAs is grown on the clad layer 349 as indicated in FIG. 22(B). It should be noted that the foregoing process for growing the epitaxial layers is achieved by the known MOCVD process. After the layered body of FIG. 22(B) is formed, an upper electrode 351 and a lower electrode 352 are provided respectively on the upper major surface of the contact layer 350 and the lower major surface of the substrate 341, and the structure shown in FIG. 21 is obtained.

In the present embodiment, it is of course possible to set the concentration level of Mg and Se in the p-type InGaAlP clad layers 345 and 347 such that the clad layers have the p-type conductivity in correspondence to the region grown on the (100) strip surface of the mesa structure and the n-type conductivity in correspondence to the region grown on the (311)B surface. Alternatively, one may dope the clad layers 345 and 347 uniformly by Mg. In any of these embodiments, one can achieve an efficient current confinement by the use of the GaAs layer 346 that blocks the passage of the drive current by the n-type region formed in correspondence to the (311)B surface.

Next, a fourth embodiment of the present invention will be described, wherein the principle of the present embodiment will be described with reference to FIG. 23, before starting the description of the laser diode of the present embodiment.

Figure 23:
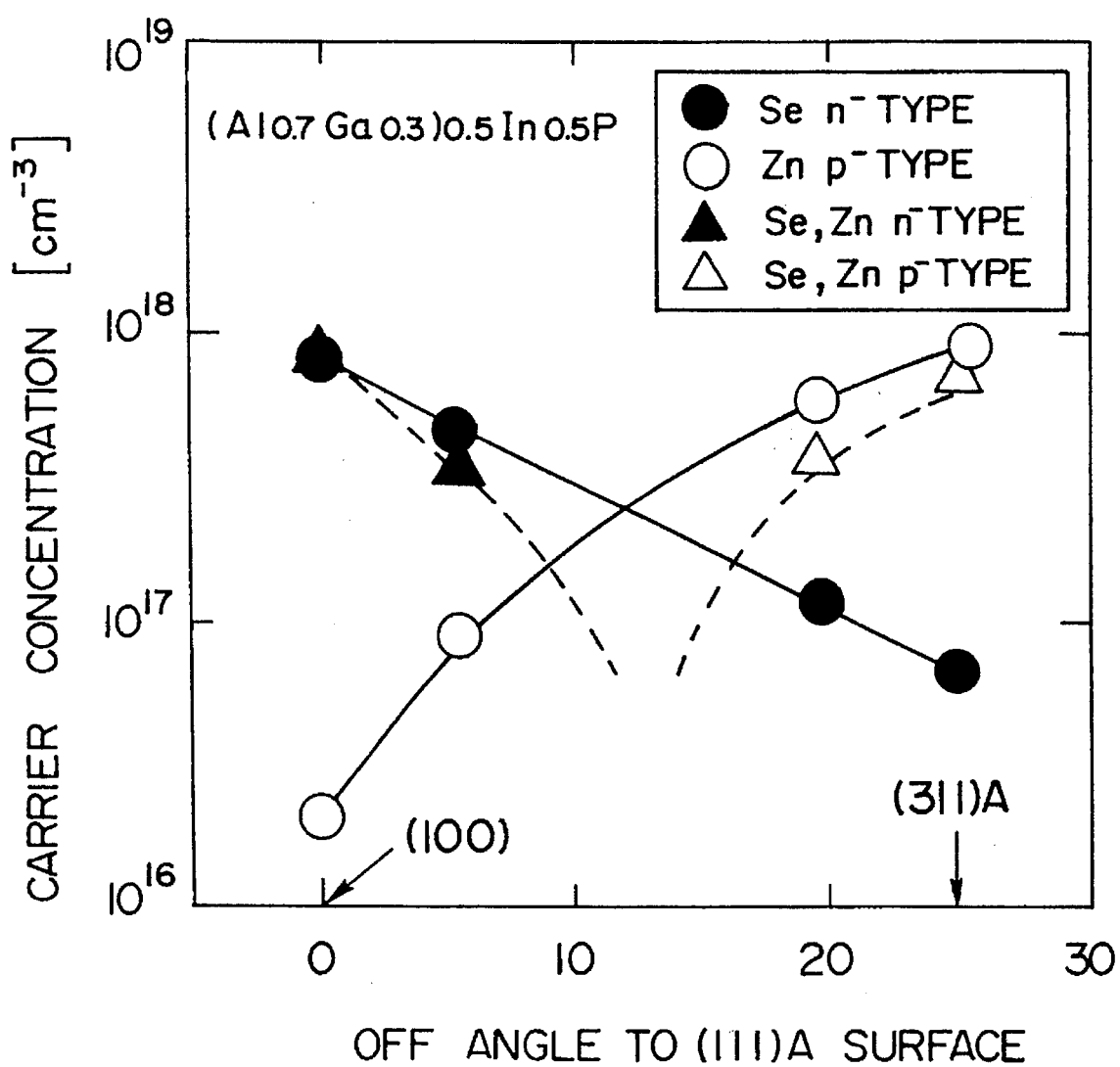
FIG. 23 is a diagram showing the relationship between the carrier concentration level and the crystal surface for an InGaAlP crystal doped simultaneously by Se and Zn.

Referring to FIG. 23, the diagram shows the carrier concentration level in an InGaAlP layer grown on various crystal surfaces and doped by Zn or Se, wherein the solid circles represent the change of the concentration level of electrons released from Se as a function of the increasing tilt angle toward the (111)A surface, while the open circles represent the change of the concentration level of the holes released from Zn. Further, the solid and open triangles represent respectively the change of the electron concentration level and the hole concentration level for the case wherein the InGaAlP layer is doped simultaneously by Zn and Se. As can be seen clearly in FIG. 23, the electrons released from Se are predominant over holes that are released from Zn for the layer that is grown on the (100) surface, while this relationship is reversed in the epitaxial layer grown on the (411)A surface corresponding to the off angle of 20° or on the (311)A surface corresponding to the off angle of 25°, in conformity with the relationship of FIGS. 4 and 5. More specifically, the layer grown on the (311)A surface is doped to the p-type in contrast to the layer grown on the (100) surface that is doped to the n-type under the same doping condition. In the example of FIG. 23, an electron concentration level of about $1\times10^{18}$ cm$^{-3}$ and a hole concentration level of about $2\times10^{16}$ cm$^{-3}$ are achieved on the (100) surface, while an electron concentration level of about $6\times10^{16}$ cm$^{-3}$ and an electron concentration level of about $1\times10^{18}$ cm$^{-3}$ is achieved on (311)A surface in the same condition.

Thus, the relationship of FIG. 23 is effective for controlling the conductivity type of the InGaAlP layer based upon the orientation on the crystal surface on which the layer is grown. For example, the principle of FIG. 23 can be applied to the various embodiments described heretofore, by merely setting the direction of elongation of the (100) stripe surface in the <01$\bar{1}$> direction such that the (311)A surface is exposed at the side surface of the mesa structure in place of the (311)B surface. As the magnitude of change of the carrier concentration level is larger in the (311)A surface than in the (311)B surface, a more effective current confinement can be achieved by using the (311)A surface. The embodiments described heretofore take the advantage of the above mentioned feature of large magnitude of change of the carrier concentration level.

Figure 24A:
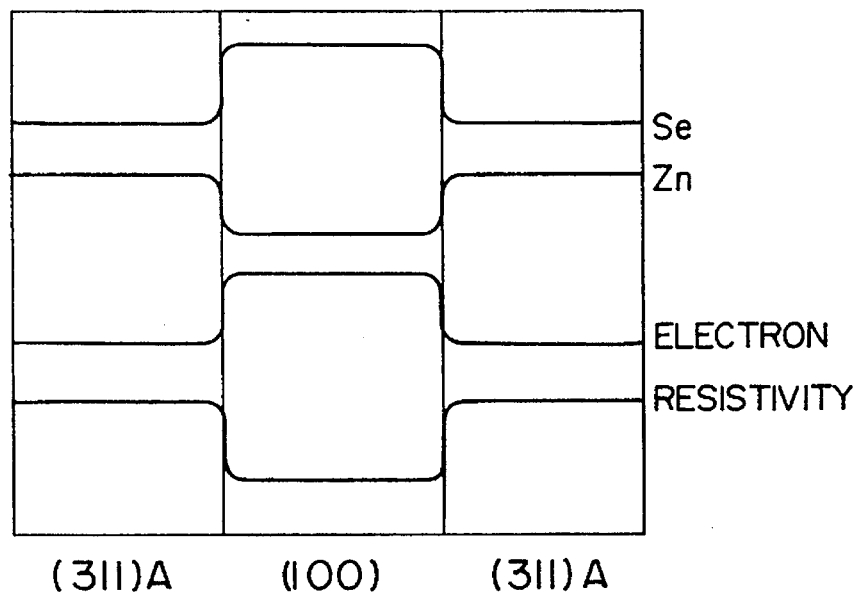
FIGS. 24(A) and 24(B) are diagrams showing the concentration of dopants achieved in various crystal surfaces based upon the relationship of FIG. 23.

FIG. 24(A) shows the change of the electron concentration level and the resistivity corresponding to a first setting of the concentration level of Zn and Se, wherein the concentration levels of Zn and Se are set such that there occurs no change of the conductivity type between the part grown on the (100) surface and the part grown on the (311)A surface. Even in this case, it will be noted that the carrier concentration level and hence the resistivity increases substantially in correspondence to the part of the epitaxial layer grown on the (100) surface and one can achieve an effective concentration of current when the doping scheme of FIG. 24(A) is applied for the fabrication of the clad structure of the laser diode.

Figure 24B:
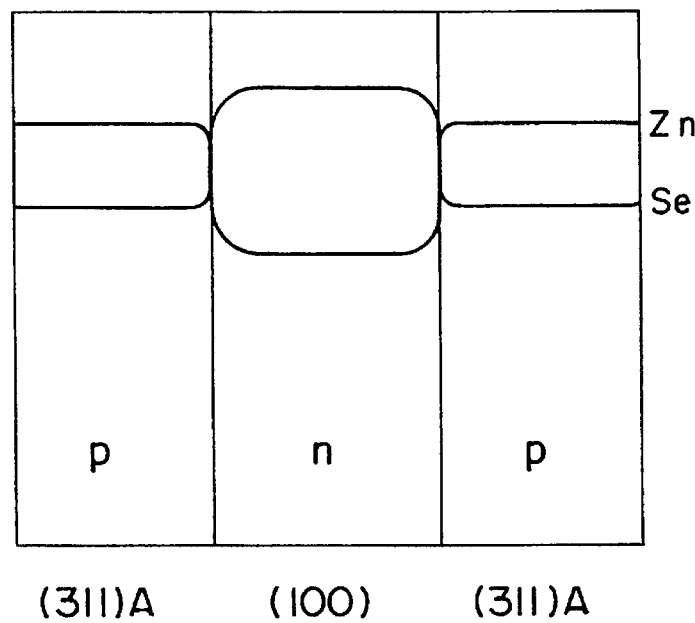

FIG. 24(B) shows, on the other hand, a second scheme of doping wherein the concentration levels of Zn and Se are set such that there occurs a reversal of the conductivity type depending on the part of the InGaAlP layer grown on the (100) surface and the part grown on the (311)A surface. There, the Se concentration level exceeds the Zn concentration level in the part of the InGaAlP layer grown on the (100) surface, while the relationship reverses in the part that is grown on the (311)A surface.

Next, the laser diode according to the fourth embodiment will be described with reference to FIG. 25.

Figure 25:
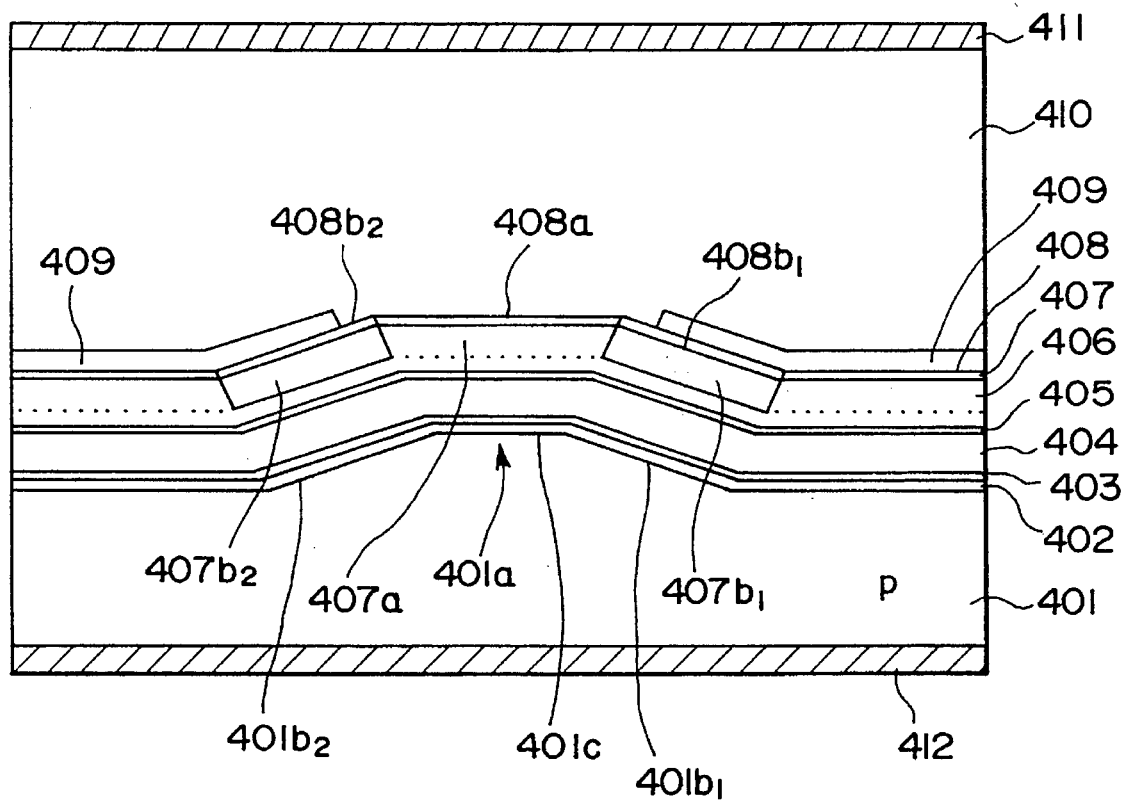
FIG. 25 is a diagram showing the structure of a stripe laser diode according to a fourth embodiment of the present invention.

Referring to FIG. 25, the laser diode of the present embodiment is constructed on a p-type GaAs substrate structure 401. There, the substrate structure 401 is formed with a mesa structure 401a corresponding to the mesa structure 301a such that the mesa structure 401a is defined by a (100) oriented stripe surface 401c extending in the <01$\bar{1}$> direction and laterally bounded by a pair of side surfaces 401$b_1$ and 401$b_2$ both having the (311)A orientation, and a buffer layer 402 of p-type GaAs is grown on the substrate structure 400 in correspondence to the buffer layer 301. Further, an intermediate layer 403 corresponding to the intermediate layer 304 is grown on the buffer layer 402. On the intermediate layer 403, a clad layer 404 corresponding to the clad layer 305 is grown with a doping achieved by Mg such that the clad layer 404 is doped to the p-type uniformly.

On the upper major surface of the clad layer 404, an undoped active layer 405 is grown epitaxially as in the previous embodiments and, further, a first clad layer 406 of n-type InGaAlP is grown further on the active layer 405 with a doping achieved by Se such that the layer 406 is doped to the n-type uniformly for the entirety of the layer 406. Further, another clad layer 407 of n-type InGaAlP is grown on the clad layer 406 epitaxially such that the clad layer 407 incorporates Zn and Se simultaneously while it is grown on the clad layer 406 by the MOCVD process. There, the concentration level of Zn and Se is set as shown in FIG. 24(A) or FIG. 24(B) such that the clad layer 407 shows an increased resistivity in correspondence to the part that is grown on the (311)A surface and designated in FIG. 25 as 407$b_1$ and 407$b_2$, or such that the clad layer 407 shows a p-type conductivity in correspondence to the foregoing regions 407$b_1$ and 407$b_2$.

On the clad layer 407 thus grown, an n-type intermediate layer 408 of InGaP is grown in correspondence to the intermediate layer 308 of the previous embodiments, and a current blocking layer 409 of p-type GaAs is grown further on the intermediate layer 408. There, the layer 409 is patterned such that the intermediate layer 408 is exposed in correspondence to the mesa structure, and a contact layer 410 of n-type GaAs is grown on the current blocking layer 409 in contact with the exposed upper major surface of the intermediate layer 408. Further, an upper electrode 411 and a lower electrode 412 are deposited respectively in ohmic contact with the upper major surface of the layer 410 and with the lower major surface of the substrate 401.

In the laser diode of FIG. 25, one can achieve an efficient current confinement by the p-type regions $407b_1$ and $407b_2$ formed within the n-type clad layer 407, in addition to the current confinement achieved by the p-type GaAs layer 409. Thereby, an efficient laser oscillation can be obtained. Further, one may employ the simultaneous doping of Zn and Se to the intermediate layer 408 such that the layer 408 is divided into a first region 408a of reduced resistivity and a pair of second regions $408b_1$ and $408b_2$ of increased resistivity according to the principle of FIG. 24(A). Alternatively, one may dope the InGaP intermediate layer 408 by Zn and Se such that the region 408a is doped to the n-type and the regions $408b_1$ and $408b_2$ are doped to the p-type according to the principle of FIG. 24(B).

Figure 26:
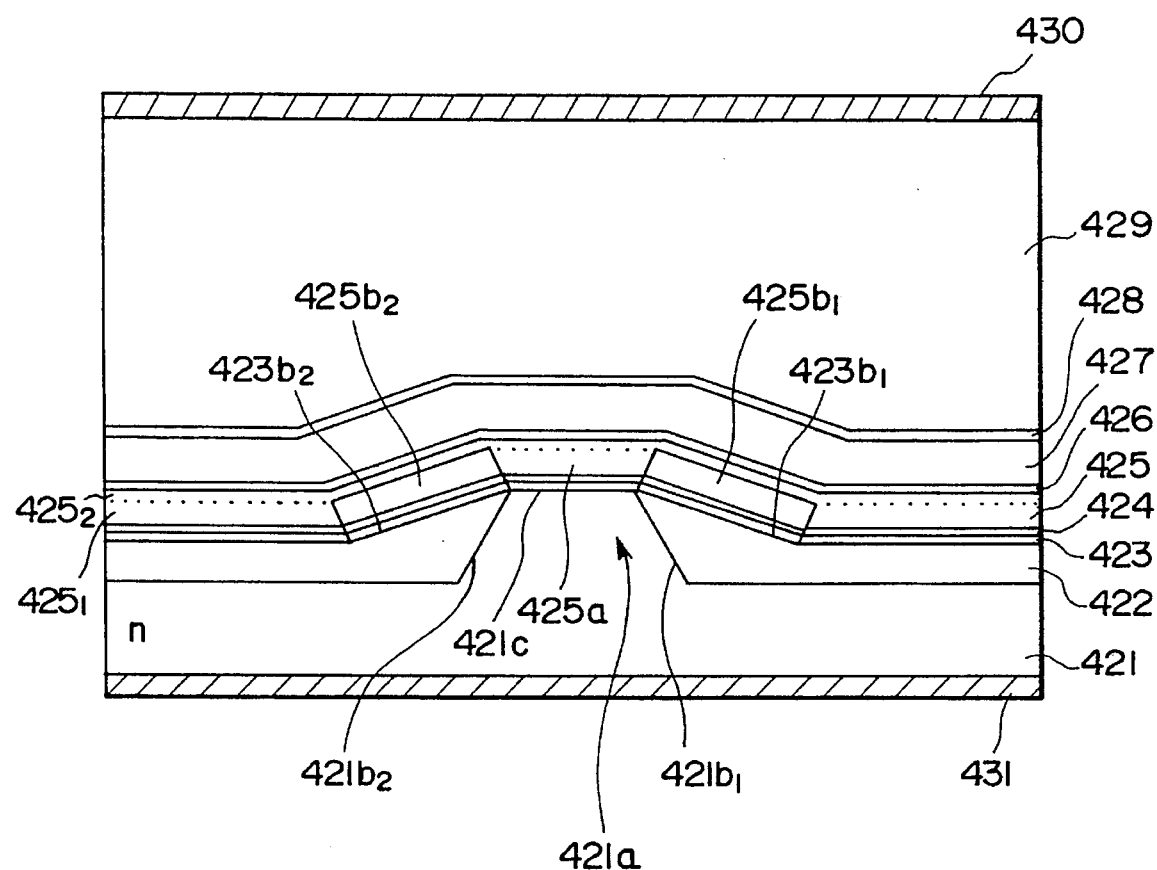
FIG. 26 is a diagram showing the structure of a stripe laser diode according to a modification of the device of FIG. 25.

FIG. 26 is a diagram showing a modification of the fourth embodiment that uses an n-type substrate 421 in place of the p-type substrate 401. There, the substrate 421 includes a mesa structure 421a defined by the (100) oriented stripe-like surface 421c laterally defined by a pair of (111)A oriented surfaces $421b_1$ and $421b_2$, wherein a p-type GaAs layer 422 is grown on the substrate 421 similarly to the layer 322 of FIG. 20.

The p-type GaAs layer 422 has a second mesa structure similar to the layer 322 such that the second mesa structure is characterized by the (100) oriented stripe-like top surface and a pair of (311)A oriented side surfaces $423b_1$ and $423b_2$, and a buffer layer 423 of n-type GaAs is grown on the layer 422. Further, an intermediate layer 424 of n-type InGaAlP is grown on the buffer layer 423, and a first clad layer $425_1$ of n-type InGaAlP is grown on the intermediate layer 424. The layer $425_1$ is doped simultaneously by Zn and Se such that the layer 425 is divided into a first region 425a grown on the (100) surface of the mesa structure 421a and a pair of second regions $425b_1$ and $425b_2$ formed at both sides of the first region 425a in correspondence to the (311)A oriented surfaces of the second mesa structure, similarly to the previous embodiments.

There, one can decrease the carrier density in correspondence to the regions $425b_1$ and $425b_2$ when the doping level of Zn and Se is set as discussed with reference to FIG. 24(A), Further, one can set the conductivity type of the regions $425b_1$ and $425b_2$ to the p-type by setting the doping level of Zn and Se according to FIG. 24(B).

Further, another clad layer $425b_2$ of n-type InGaAlP is grown on the layer $425b_1$ with the doping by Se, and an active layer 426 of undoped InGaP is grown on the layer $425_2$ epitaxially and in conformity with the morphology of the mesa structure. On the active layer 406, a clad layer 427 of p-type InGaAlP is grown epitaxially, and an intermediate layer 428 of p-type InGaP is grown further on the clad layer 427. Further, a contact layer 429 of p-type GaAs is grown on the layer 428 as usual. After the layered semiconductor body is formed as described above, an upper electrode 430 is provided on the upper major surface of the p-type GaAs contact layer 429 and a lower electrode 431 is provided on the lower major surface of the n-type GaAs substrate 421.

According to the present embodiment, one can confine the injected current effectively by the regions $425b_1$ and $425b_2$. Further, the effect of the current confinement can be enhanced by employing the simultaneous doping of Zn and Se also in the intermediate layer 424.

Figure 27:
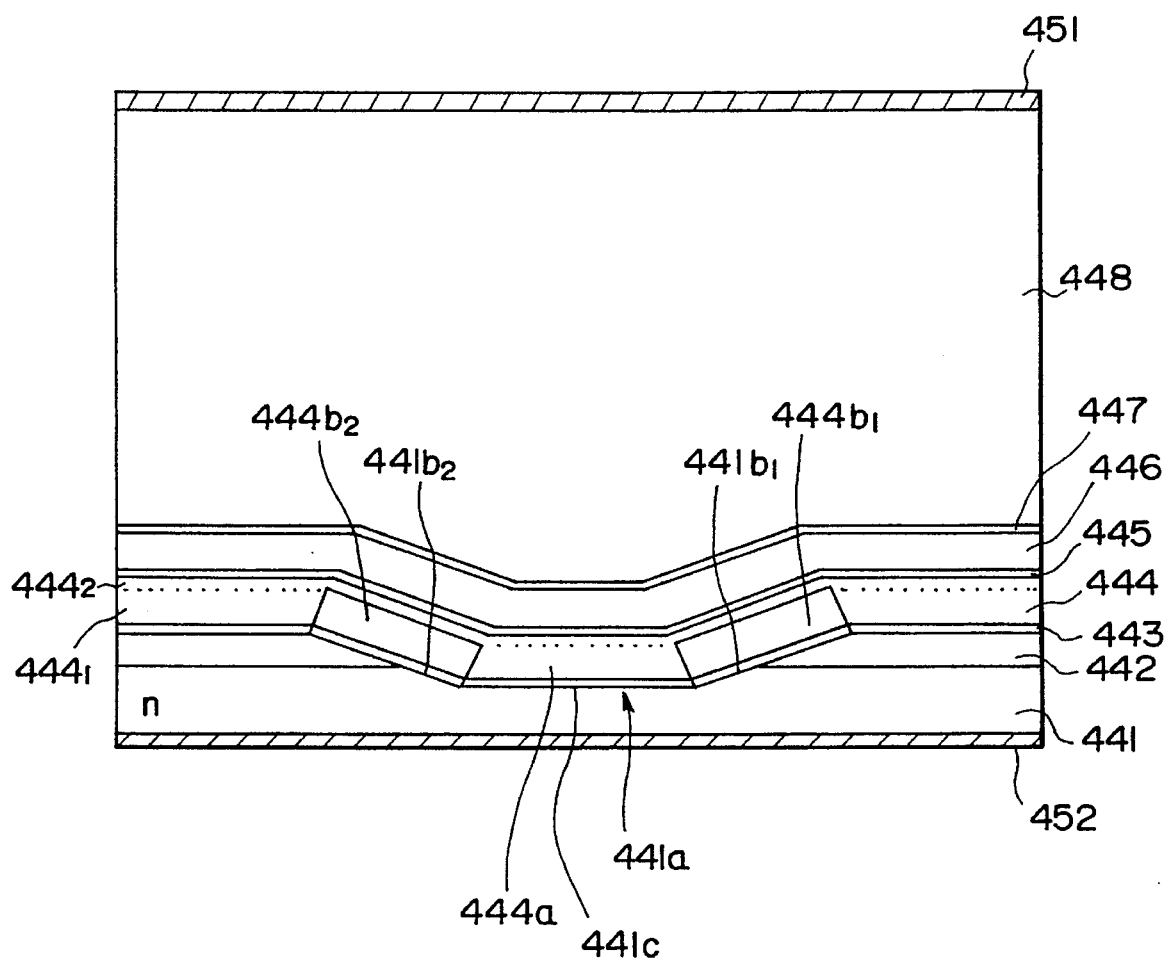
FIG. 27 is a diagram showing the structure of a stripe laser diode according to another modification of the device of FIG. 25.

FIG. 27 shows another modification of the fourth embodiment, wherein the device is constructed on an n-type GaAs substrate 441 that is covered by a current confinement layer 442 of p-type GaAs. There, the layer 442 as well as the substrate 441 are formed with a negative mesa structure 441a similar to the mesa structure 341a of FIG. 21, and an intermediate layer 443 of n-type InGaP is grown on the layer 442 to cover the mesa structure 441a.

On the intermediate layer 443, a first clad layer $444_1$ of n-type InGaAlP is grown epitaxially, wherein the layer $444_1$ is doped simultaneously by Zn and Se with the concentration level set as indicated in FIG. 24(A) or FIG. 24(B). When Zn and Se are incorporated with the scheme of FIG. 24(A), the clad layer $444_1$ is divided into a low resistivity n-type region 444a corresponding to the (100) stripe surface and a pair of high resistivity n-type regions $444b_1$ and $444b_2$ respectively grown on the (311)A surface of the mesa structure. Thereby, the clad layer $444_1$ achieves an efficient current confinement. When Zn and Se are incorporated according to the scheme of FIG. 24(B), on the other hand, the region 444a is doped to the n-type while the regions $444b_1$ and $444b_2$ are doped to the p-type. Thereby, the regions $444b_1$ and $444b_2$ block the injection current, and the construction of the latter is useful also for achieving an efficient current confinement.

On the clad layer $444_1$, another clad layer $444_2$ of n-type InGaAlP is grown epitaxially, and an active layer 445 of undoped InGaP is grown on the layer $444_2$. Further, a clad layer 446 of p-type InGaAlP is grown on the upper major surface of the active layer 445, and an intermediate layer 447 of p-type InGaP is grown on the layer 446. On the layer 446, a p-type contact layer 448 is grown as illustrated. Further, an electrode 451 and an electrode 452 are provided respectively on the upper major surface of the clad layer 448 and on the lower major surface of the substrate 441.

Figure 28:
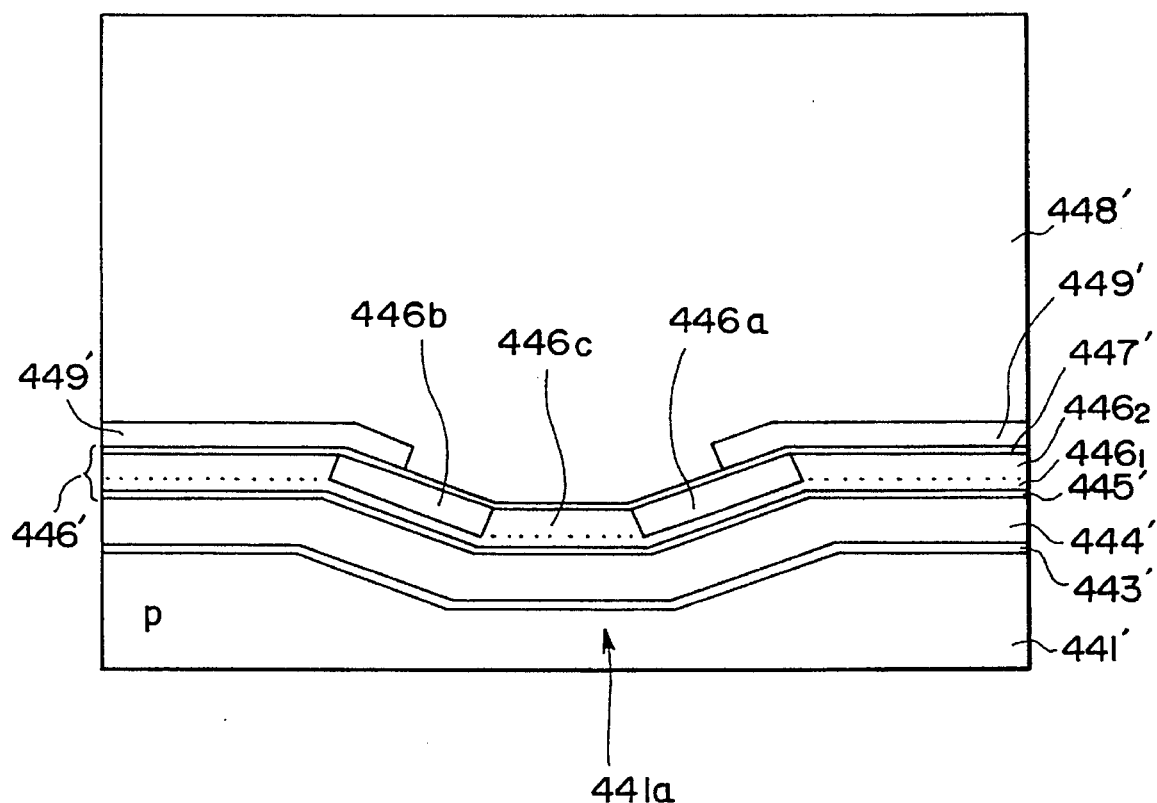
FIG. 28 is a diagram showing the structure of a stripe laser diode according to still other modification of the device of FIG. 25.

FIG. 28 shows another modification of the fourth embodiment, wherein the device of FIG. 28 is constructed on a p-type substrate structure 441' that has a construction similar to the structural unit of FIG. 27 formed of the GaAs substrate 441 and the GaAs layer 442 expect that the conductivity type is reversed, wherein the substrate structure 441' has a negative mesa similar to the mesa 441a.

On the substrate structure 441', the epitaxial layers 443'–448' corresponding to the epitaxial layers of FIG. 27 are grown consecutively with the reversed conductivity type such that the epitaxial layer 443' corresponds to the epitaxial layer 443, the epitaxial layer 444' corresponds to the epitaxial layer 444, the epitaxial layer 445 corresponds to the epitaxial layer 445', the epitaxial layer 446' corresponds to the epitaxial layer 446, the epitaxial layer 447' corresponds to the epitaxial layer 447, the epitaxial layer 448' corresponds to the epitaxial layer 448, and the epitaxial layer 449' corresponds to the epitaxial layer 449. There, the conductivity type of the epitaxial layers are reversed with respect to each other except for the active layer 445 and 445' that form the undoped active layers. Further, the construction of the layer 444' is different from the layer 444 in that the layer 444' is formed of a single layer of p-type InGaAlP. Similarly, the construction of the layer 446' is different from the construction of the layer 446 in that the layer 446' is formed of stacking of two layers, a first, lower layer $446_1$ and a second, upper layer $446_2$.

There, the layer $446_1$ is doped to the n-type uniformly by incorporating Se, while the layer $446_2$ is doped to the n-type by incorporating Zn and Se simultaneously. By setting the concentration level of Zn and Se according to the relationship of FIG. 24(A), one can selectively increase the resistivity in correspondence to sloped regions 446a and 446b of the layer $446_2$ that are grown on the (311)A surface, with respect to a stripe region 446c that is grown in correspondence to the (100) stripe surface. Alternatively, one may reverse the conductivity type selectively in correspondence to the regions 446a and 446b with respect to the region 446c by setting the doping level of Zn and Se according to the relationship of FIG. 24(B). In any of these approaches, one can effectively confine the injection current into the mesa structure 441a for efficient laser oscillation.

Figure 29:
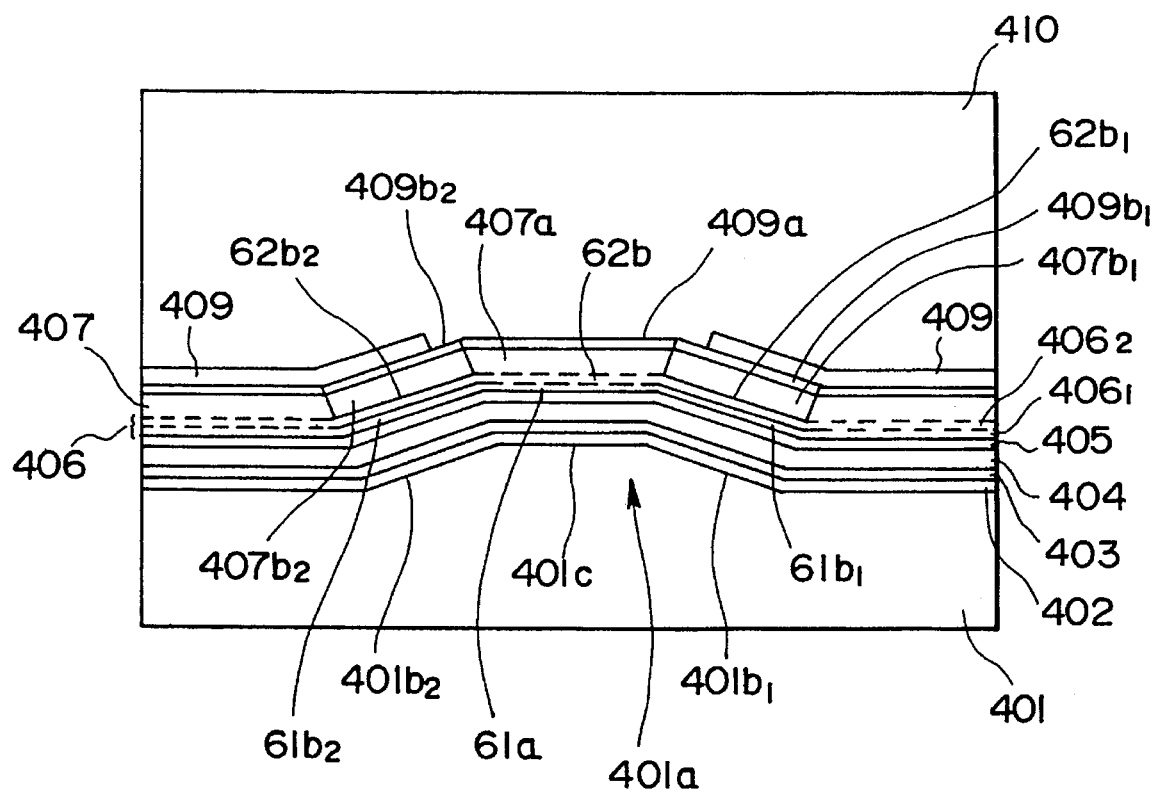
FIG. 29 is a diagram showing the structure of a stripe laser diode according to a fifth embodiment of the present invention.

Next, a fifth embodiment of the present invention will be described with reference to FIG. 29 showing a device having a structure similar to FIG. 25. Thus, the device of FIG. 29 will be designated by the same reference numerals for those parts that correspond to the device of FIG. 25, and the description thereof will be omitted.

In the device of FIG. 29, the clad layer 406 is divided into a lower layer $406_1$ and an upper layer $406_2$, wherein the upper layer $406_2$ is doped uniformly to the n-type by incorporation of Se, while the lower layer $406_1$ is doped simultaneously by Zn and Se such that the layer $406_1$ has a first region 61a of the n-type that is laterally sandwiched by a pair of second regions $61b_1$ and $61b_2$ of the p-type. Thereby, there is formed a p-n junction in correspondence to the interface between the n-type upper layer $406_2$ and the region $61b_1$ or $61b_2$, and these p-n junctions acts as a remote junction with respect to the undoped active layer for forming a potential barrier for the carriers that are injected to the active layer 405. Thereby, the path of the drive current flowing through the (311)A surface is effectively blocked and the efficiency of current confinement is improved even more.

Figure 30:
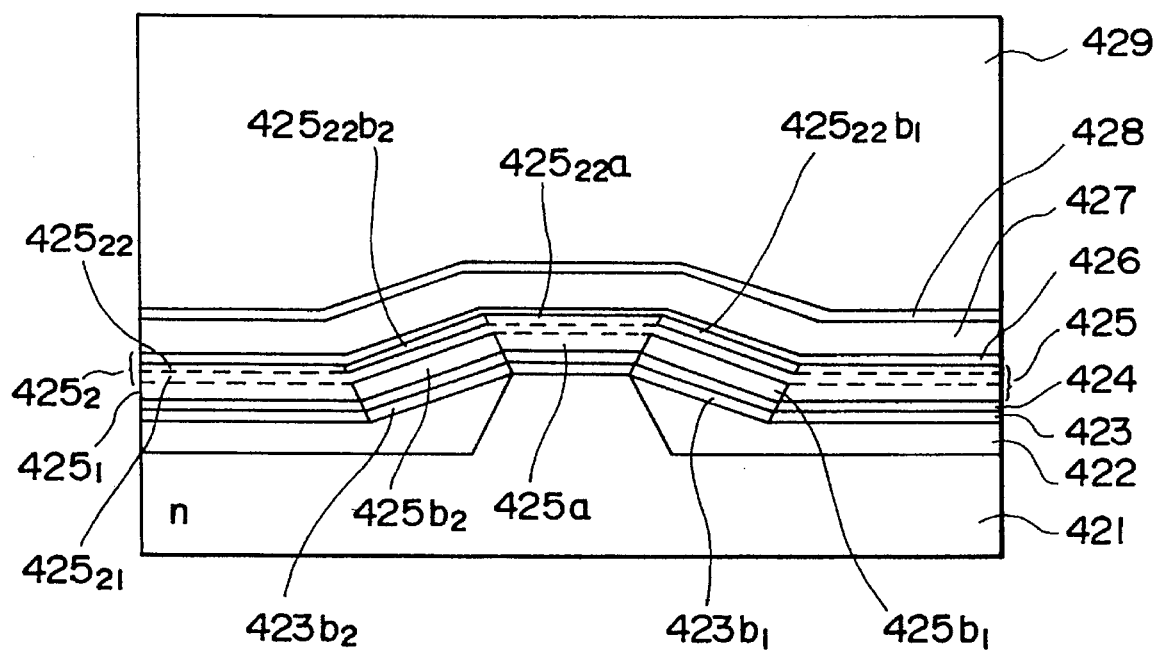
FIG. 30 is a diagram showing the structure of a stripe laser diode according to a modification of the device of FIG. 29.

FIG. 30 shows a modification of the fifth embodiment wherein the laser diode has a structure similar to the device of FIG. 26, except that the clad layer $425_2$ is divided into a lower layer $425_{21}$ doped to the n-type by Se and an upper layer $425_{22}$ doped by Zn and Se simultaneously, wherein the layer $425_{22}$ is divided into a first region $425_{22}a$ of the n-type corresponding to the (100) stripe of the mesa structure and a pair of regions $425_{22}b_1$ and $425_{22}b_2$ of the p-type formed at both sides of the region $425_{22}$ in correspondence to the (311)A surface. Thereby, there is formed a remote junction between the n-type layer $425_{12}$ and the region $425_{22}b_1$ or $425_{22}b_2$, and the flow of the drive current through the (311)A surface of the mesa structure is blocked by the potential barrier formed adjacent to the remote junction. Thereby, one can increase the effect of the current confinement in the current path that passes through the regions 425a and $425_{22}a$.

Figure 31:
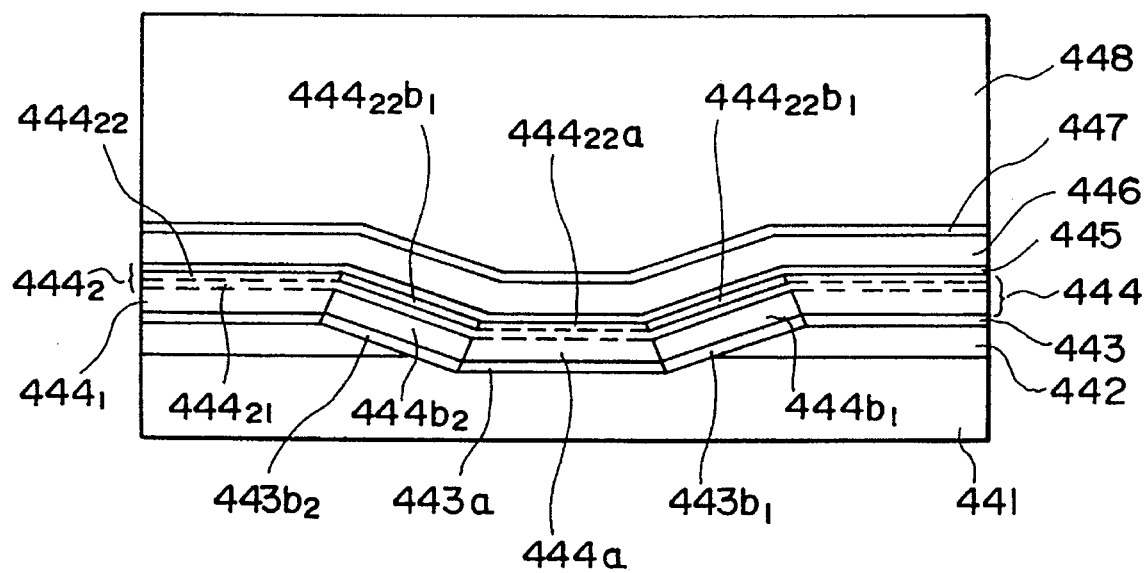
FIG. 31 is a diagram showing the structure of a stripe laser diode according to another modification of the device of FIG. 29.

FIG. 31 shows another modification of the fifth embodiment wherein the laser diode has a structure similar to the device of FIG. 27, except that the clad layer $444_2$ is divided into a lower layer $444_{21}$ doped to the n-type by Se and an upper layer $444_{22}$ that is doped simultaneously by Zn and Se. There, the upper layer $444_{22}$ is divided into a first region $444_{22}a$ corresponding to the (100) stripe of the mesa structure and doped to the n-type and a pair of regions $444_{22}b_1$ and $444_{22}b_2$ corresponding to the (311)A surface and doped to the p-type. Again, there is formed a remote junction in correspondence to the interface between the layer $444_{21}$ and the region $444_{22}b_1$ or $444_{22}b_2$ for blocking the current flowing therethrough. Thereby, one can effectively confine the drive current to the path that passes through the regions 444a and $444_{22}a$ corresponding to the (100) stripe surface of the mesa structure.

Next, a sixth embodiment of the present invention will be described with reference to FIG. 32.

Figure 32:
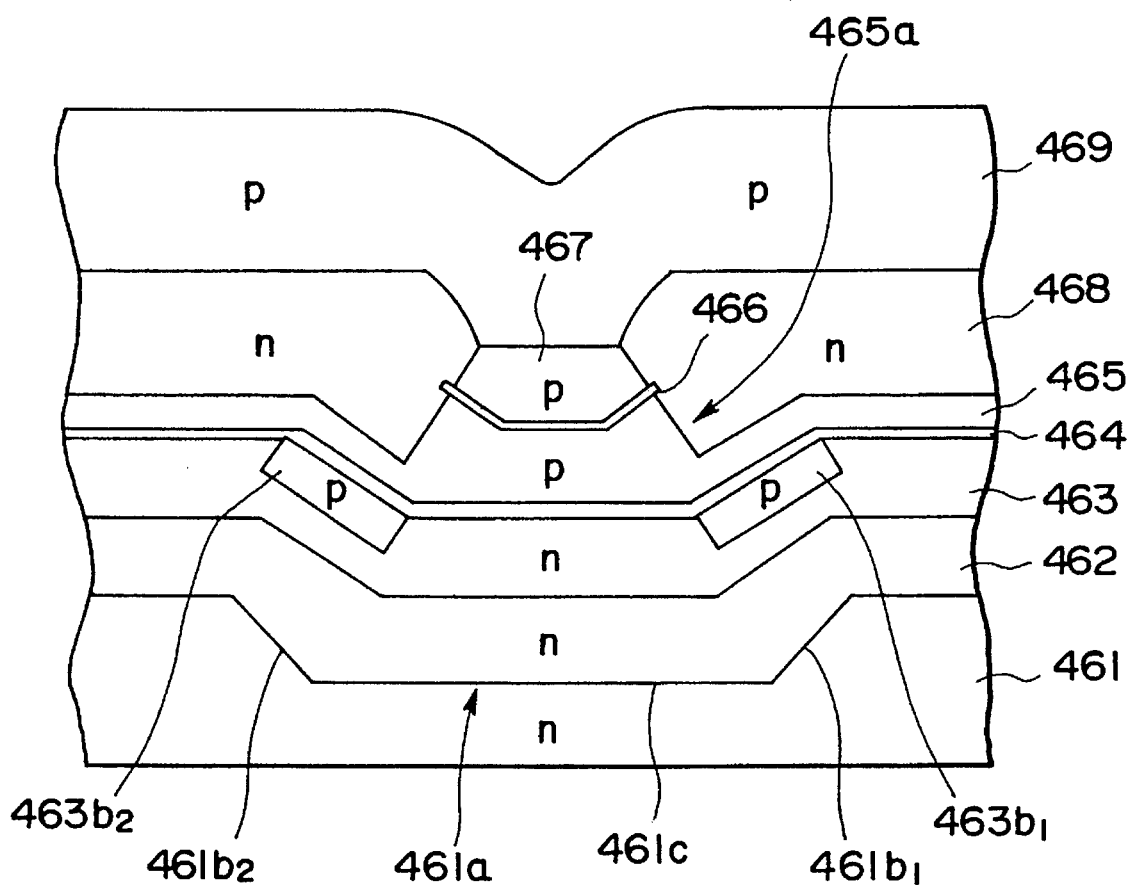
FIG. 32 is a diagram showing the structure of a stripe laser diode according to a sixth embodiment of the present invention.

Referring to FIG. 32, the device is constructed on an n-type substrate 461 of GaAs. The substrate 461 is formed with a negative mesa structure 461a that is defined by a (100) stripe surface 461c at the bottom surface and a pair of (311)A surfaces $461_1$ and $461b_2$ that form the side wall of the mesa structure 461a. On the substrate 461 thus formed with the mesa structure 461a, a buffer layer 462 of n-type GaAs is grown epitaxially. Thereby, there is formed a second mesa structure in the buffer layer 462 in correspondence to the mesa structure 461a such that the second mesa structure has a (100) oriented stripe surface at the bottom and a pair of (311)A oriented side walls that define the (100) oriented stripe surface at the bottom.

On the buffer layer 462, a clad layer 463 of n-type InGaAlP is grown epitaxially while doping simultaneously by Zn and Se such that a pair of p-type regions designated as $463b_1$ and $463b_2$ are formed in the layer 462 in correspondence to the (311)A surface. The rest of the layer 463 is doped to the n-type. Further, an active layer 464 of undoped InGaP is grown epitaxially on the clad layer 463, and a p-type clad layer 465 of InGaAlP is grown further on the active layer 454.

There, the clad layer 465 is formed with a positive mesa structure 465a that projects upward in correspondence to the negative mesa structure 461a, and an intermediate layer 466 of p-type InGaP is grown in correspondence to the mesa structure 465a. Further, another intermediate layer 467 of p-type GaAs is formed on the layer 466 as a continuation of the mesa structure 465a.

The mesa structure 465a including the InGaP layer 466 and the GaAs layer 467 grown thereon are laterally supported by an n-type region 468 of GaAs for current confinement, and a p-type contact layer 469 of GaAs is grown on the layer 468 in contact with the upper major surface of the layer 467.

According to the device of the present embodiment, one can confine the current by the p-type regions $463b_1$ and $463b_2$, in addition to the usual current confinement structure formed by the n-type GaAs layer 468. By forming the mesa structure 465a in correspondence to the clad layer 465, the effect of the current confinement is increased even more.

Next, the fabrication process of the structure of FIG. 32 will be described briefly with reference to FIGS. 33(A)–33(M).

Figure 33A:
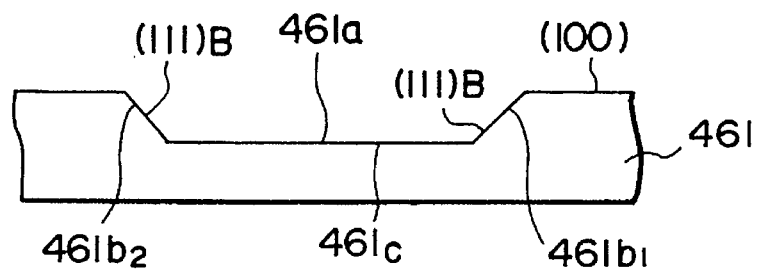
FIGS. 33(A)–33(M) are diagrams showing the process for fabricating the device of FIG. 32.

Referring to FIG. 33(A), the mesa structure 461a is formed on the upper major surface of the n-type substrate 461 as a groove extending in the <01$\bar{1}$> direction such that the groove is defined by the bottom surface 461c and a pair of side walls $461b_1$ and $461b_2$. Further, the epitaxial growth of the n-type GaAs layer 462 is achieved on the structure thus obtained such that the second mesa structure is formed in correspondence to the mesa structure 461c such that the mesa structure is laterally defined by a pair of (311)A side walls as shown in FIG. 33(B).

Figure 33B:
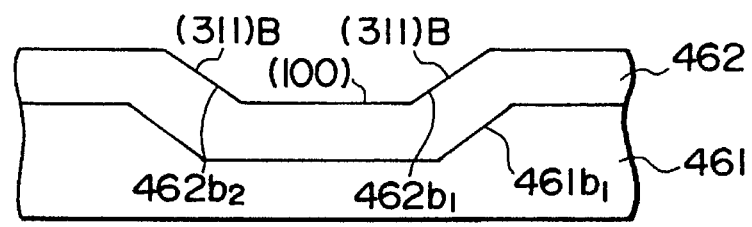
Figure 33C:
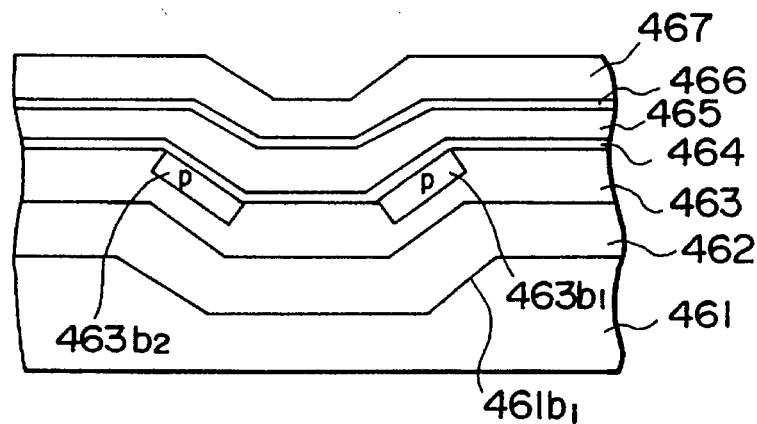

On the structure of FIG. 33(B), the layers 463 through 467 are grown consecutively (i.e., in sequence) by the MOCVD process with respective conductivity types as shown in FIG.

33(C). There, the layer 463 is doped to the n-type except for the obliquely extending surface part that is doped to the p-type, while the layers 465–467 are doped to the n-type.

Figure 33D:
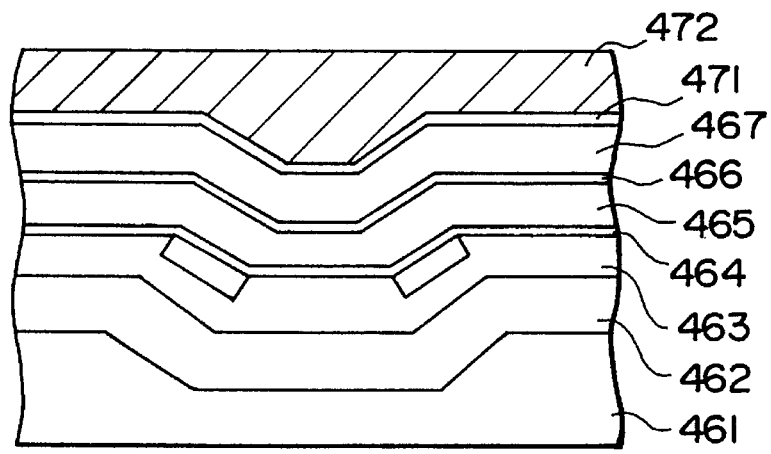

Next, a silicon oxide mask 471 is deposited on the upper major surface of the layer 467 as shown in FIG. 33(D), and a photoresist 471 is deposited on the mask 471. It should be noted that there is formed a depression or groove on the upper major surface of the layer 467 and hence on the upper major surface of the layer 471 in correspondence to the mesa structure 461c, and the photoresist fills the groove thus formed.

Figure 33E:
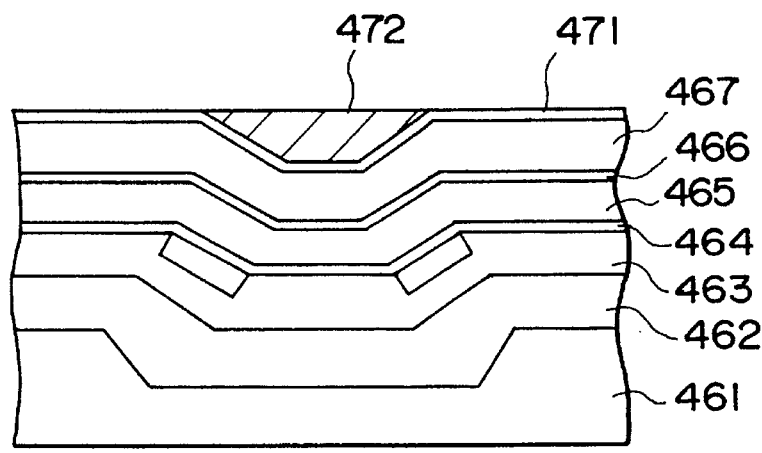

In a step of FIG. 33(E), the photoresist 472 is subjected to an ashing process using oxygen plasma, such that the photoresist 472 is removed except for those parts that fill the groove.

Figure 33F:
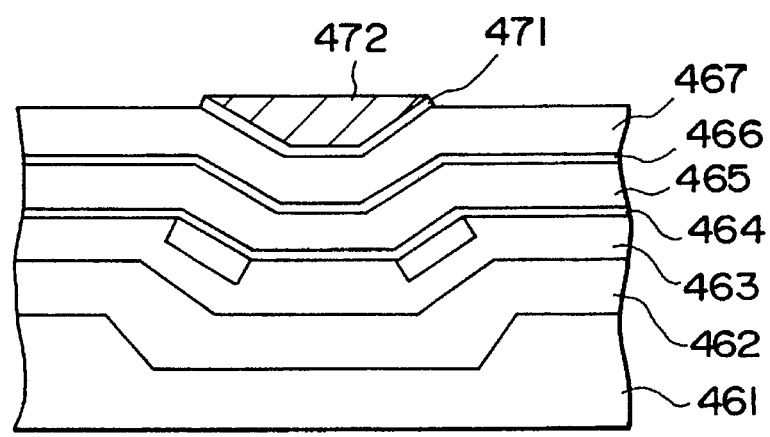
Figure 33G:
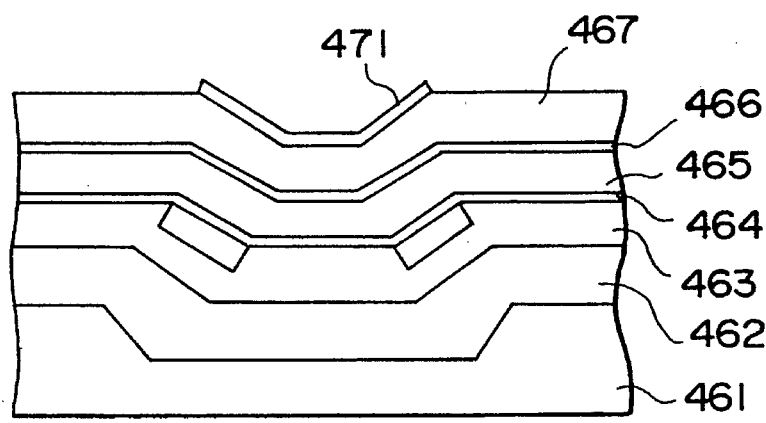

Next, in a step of FIG. 33(F), the silicon oxide mask 471 is subjected to an etching process while using the remaining photoresist 472 as a mask, and the photoresist 472 is removed subsequently as shown in FIG. 33(G).

Figure 33H:
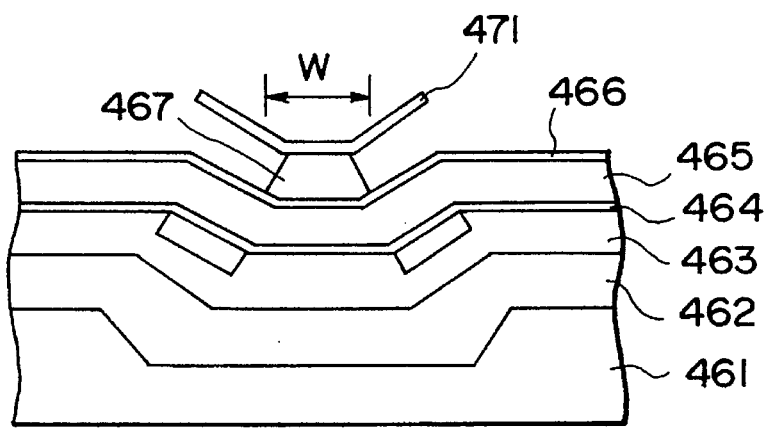
Figure 33I:
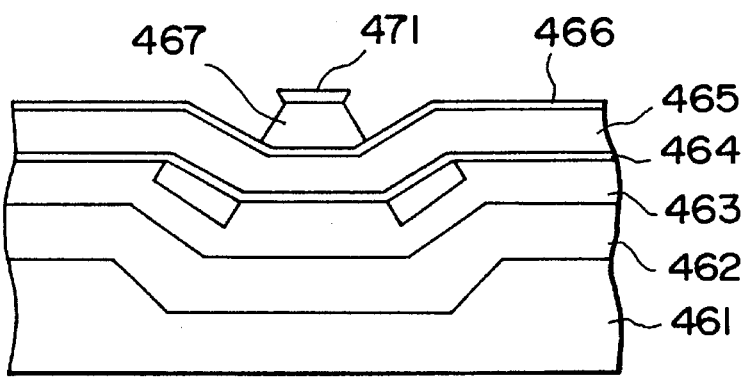

Next, the structure of FIG. 33(G) is subjected to a wet etching process using an aqueous solution of $NH_4$ and $H_2O_2$ as the etching agent, wherein the layer 467 is etched selectively as shown in FIG. 33(H). Further, the silicon oxide layer 471 projecting outward form the patterned layer 467 is removed by a wet etching process that uses a buffered HF solution as the etching agent as shown in FIG. 33(I).

Figure 33J:
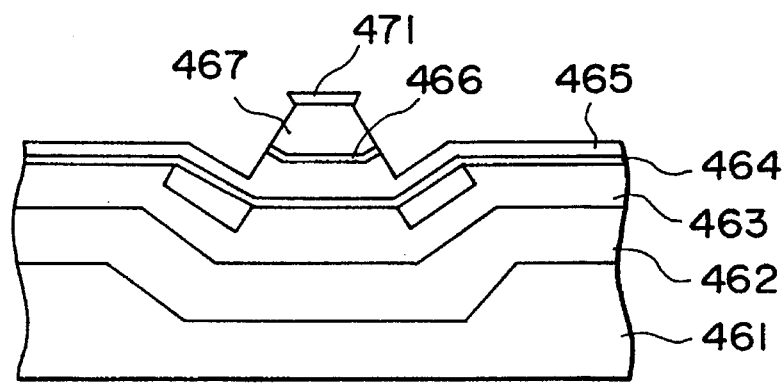

Further, the intermediate layer 466 is removed by a wet etching process using a mixture of Br, HBr and $H_2O$ while using the patterned layer 467 as a mask, and the layer 465 is etched subsequently by using a HCl etching solution. Thereby, the structure shown in FIG. 33(J) is obtained.

Figure 33K:
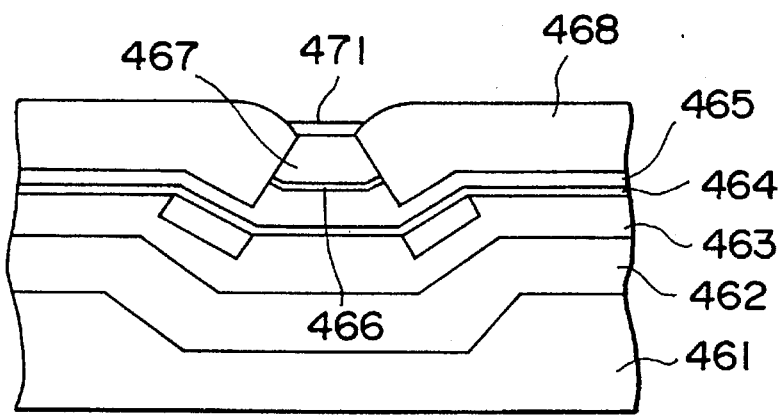
Figure 33L:
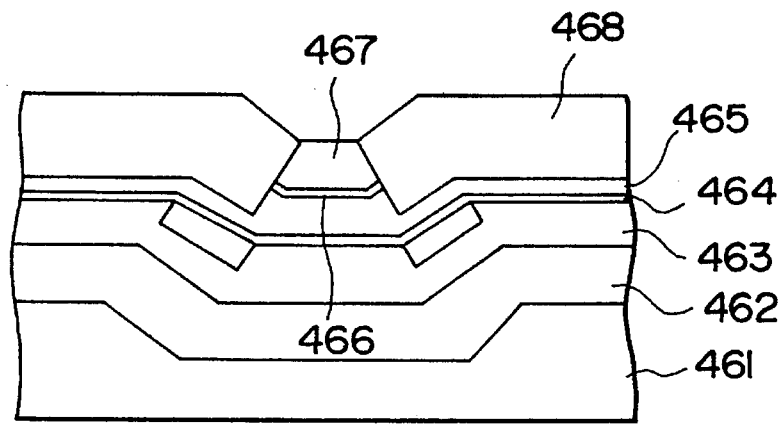
Figure 33M:
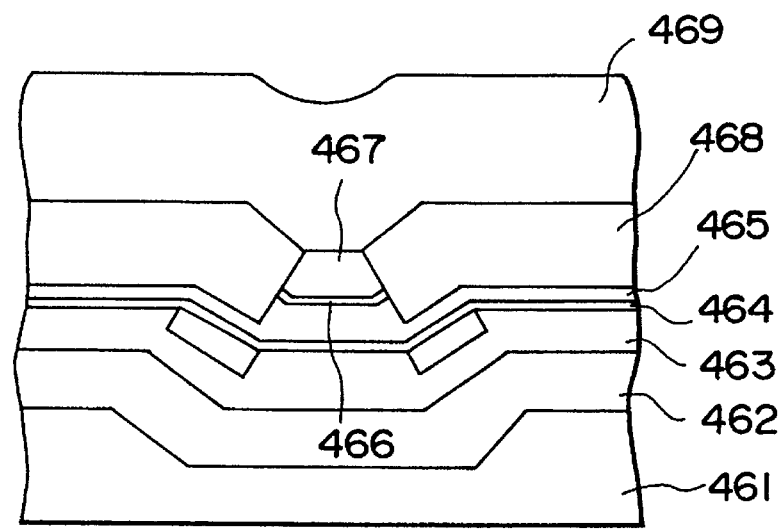

Next, while using the silicon oxide layer 471 as a mask, the deposition of n-type GaAs is achieved by the MOCVD process to form the GaAs layer 468 as shown in FIG. 33(K). Further, the mask 471 is removed in the step of FIG. 33(L), and the p-type GaAs contact layer 469 is deposited on the structure of FIG. 33(L) as shown in FIG. 33(M). Thereby, the structure of FIG. 32 is obtained.

Next, a seventh embodiment of the present invention will be described.

Figure 34:
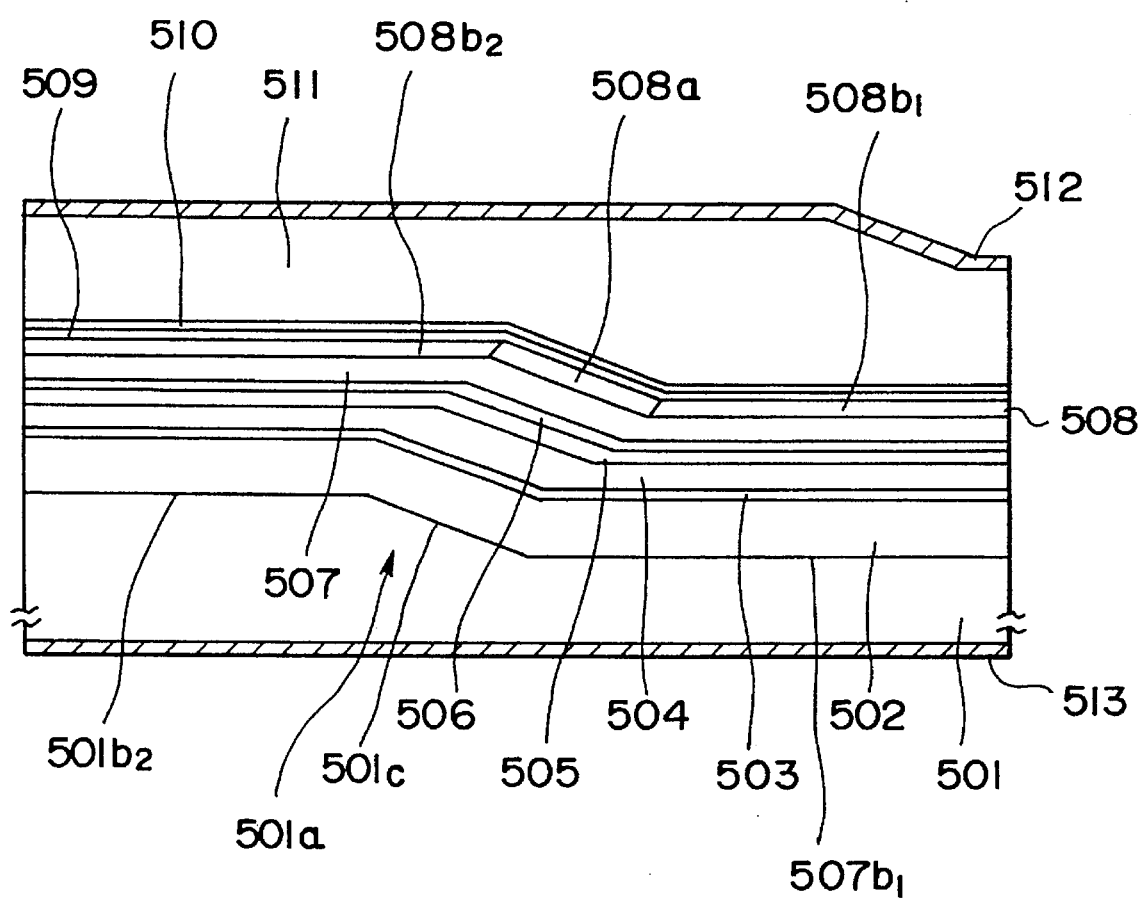
FIG. 34 is a diagram showing the structure of a stripe laser diode according to a seventh embodiment of the present invention in a transversal cross section.

FIG. 34 shows a stripe laser diode according to the seventh embodiment, wherein the device is constructed on a GaAs substrate 501 doped by Si to the n-type with the carrier concentration level of $4\times10^{18}$ cm$^{-3}$. The substrate 501 has a (100)-oriented upper major surface as usual, wherein the upper major surface is formed with a step 501a that extends in the longitudinal direction of the laser diode coincident to the <01$\bar{1}$> direction of GaAs crystal. There, the step 501a is formed of a (311)A oriented stripe surface 501c extending in the foregoing <01$\bar{1}$> direction with a step height of typically 1 μm, and the step 501a divides the upper major surface of the substrate 501 to a first (100) region 501$b_1$ and a second (100) region 501$b_2$. It should be noted that the step 501a can be formed on the planar (100) surface of the GaAs substrate 501 by providing a silicon oxide mask and apply a wet etching process using a HF solution as the etching agent.

On the upper major surface of the substrate 501, there is provided an n-type GaAs buffer layer doped by Se or Si with a thickness of 1 μm. When Se is used for the dopant, it will be noted that the concentration level of Se is changed depending on the crystal surface as already explained with reference to FIG. 17. In the illustrated example, the Se concentration level is about $3\times10^{17}$ cm$^{-3}$ on the part grown on the (100) surface, while the Se concentration level changes to about $1.2\times10^{17}$ cm$^{-3}$ in correspondence to the part grown on the (311)A surface. See the relationship of FIG. 17. As a result of the epitaxial growth with a uniform thickness, the stepped structure of the upper major surface of the substrate 501 is transferred to the upper major surface of the buffer layer 502.

On the buffer layer 502, an intermediate layer 503 of n-type InGaP is grown epitaxially by a MOCVD process. There, the layer 503 has a composition of $Ga_{0.5}In_{0.5}P$ and doped by Se or Si, wherein the concentration level of Se changes, when Se is used for the dopant, depending on the crystal surface such that the Se content takes a value of $3.7\times10^{17}$ cm$^{-3}$ on the (100) surface while a value of about $7\times10^{16}$ cm$^{-3}$ on the (311)A surface. Further, the thickness of the layer 503 becomes about 0.1 μm on the (100) surface while the thickness is about 0.25 μm on the (311)A surface.

On the layer 503, a clad layer 504 of n-type InGaAlP is grown with a composition of $(Al_{0.7}Ga_{0.3})_{0.5}In_{0.5}P$, wherein the layer 504 is doped by Se or Si to the n-type. There, the thickness of the layer 504 may change slightly depending on the crystal surface such that the layer 504 has a thickness of about 0.3 m for the part grown on the (100) surface while the layer 504 has a thickness of about 0.6 m for the part grown on the (311)A surface. Further, an optical guide layer 505 of n-type InGaAlP is grown on the layer 504 with a composition of $(Al_{0.4}Ga_{0.6})_{0.5}In_{0.5}P$, wherein the layer 505 is doped by Se or Si to the n-type. The thickness of the layer 505 changes depending on the crystal surface on which the layer is grown such that the part of the layer 505 grown on the (100) surface has a thickness of 0.2 μm while the part grown on the (311)A surface has a thickness of about 0.4 μm. Further, an active layer 506 of undoped InGaP is grown on the layer 505 with a composition of $Ga_{0.5}In_{0.5}P$. Again, the thickness of the layer 506 changes depending on the crystal surface on which the layer is grown such that the part of the layer 506 grown on the (100) surface has a thickness of 0.015 μm while the part grown on the (311)A surface has a thickness of 0.03 μm.

On the active layer 506 thus formed, a p-type clad layer 507 of InGaAlP is grown with a composition of $(Al_{0.7}Ga_{0.3})_{0.5}In_{0.5}P$. There, the layer 507 is doped by Mg or Zn and has a thickness of 0.3 μm in correspondence to the part grown on the (100) surface and a thickness of 0.6 μm in correspondence to the part grown on the (311)A surface. Further, another clad layer 508 of InGaAlP is grown on the layer 507 while 10 doping simultaneously by Zn and Se such that the layer 507 is divided into a p-type first region 508a having a composition of $(Al_{0.7}Ga_{0.3})_{0.5}In_{0.5}P$ and a thickness of 0.4 μm and a pair of n-type second regions 508$b_1$ and 508$b_2$ located at both sides of the region 508a with a o thickness of 0.2 μm. There, the region 508a is enriched in Zn than Se and shows the p-type conductivity type while the regions 508$b_1$ and 508$b_2$ are enriched in Se than Zn and shows the n-type conductivity type.

On the layer 508, an intermediate layer 509 of p-type InGaAlP having a composition of $(Al_{0.1}Ga_{0.9})_{0.5}In_{0.5}P$ is grown with a thickness of 0.04 μm in correspondence to the part grown on the (100) surface and a thickness of 0.08 μm in correspondence to the part grown on the (311)A surface. Further, another intermediate layer 510 of p-type InGaAlP is grown on the layer 509 with a composition of $(Al_{0.4}Ga_{0.6})_{0.5}In_{0.5}P$ such that the layer 510 has a thickness of 0.1 μm in correspondence to the part grown on the (100) surface and a thickness of 0.2 μm in correspondence to the part grown on the (311)A surface. There, both the layers 509 and 510 are doped by Mg or Zn and shows the p-type conductivity irrespective of the crystal surface. Further, a contact layer 511 of p-type GaAs is provided on the layer 510 with a thickness of 5–10 μm. The layer 511 may be doped by Zn with a concentration level of $1-6\times10^{18}$ cm$^{-3}$.

In the growth of the foregoing epitaxial layers, doping is achieved by admixing the gaseous material containing the desired dopant into the source gas of the epitaxial layer similarly to the previous embodiments. Thus, when Se alone is introduced as in the layers 502–505, hydrogen selenide is added for example with a mole ratio of Se with respect to the group V elements set to about $2\times10^{-6}$ such that an electron concentration level of about $8\times10^{17}$ cm$^{-3}$ is achieved on the part grown on the (100) surface and an electron concentration level of about $1.5\times10^{17}$ cm$^{-3}$ in correspondence to the part grown on the (311)A surface. On the other hand, when Se and Zn are doped simultaneously as in the layer 508, the mole ratio of dimethylzinc used for the source of Zn is set to 0.1 with respect to the gaseous source of the group III elements, wherein dimethylzinc is supplied with a concentration level such that the Zn content in the layer 508 becomes to about $5\times10^{16}$ cm$^{-3}$ in correspondence to the part grown on the (100) surface and such that the Zn content becomes to about $5\times10^{17}$ cm$^{-3}$ in correspondence to the part grown on the (311)A surface.

After the layered body shown in FIG. 34 is formed, an upper electrode 512 and a lower electrode 513 are provided, respectively, on the upper major surface of the GaAs contact layer 511 and a lower major surface of the GaAs substrate 501.

In the device of FIG. 34, too, one can obtain an efficient current confinement in the region 508a and an efficient laser oscillation is obtained in the active layer in correspondence to the stripe region grown on the (311)A surface. The device is formed by a simple repetition of the epitaxial process once the substrate 501 is formed with the step 501a.

Figure 35:
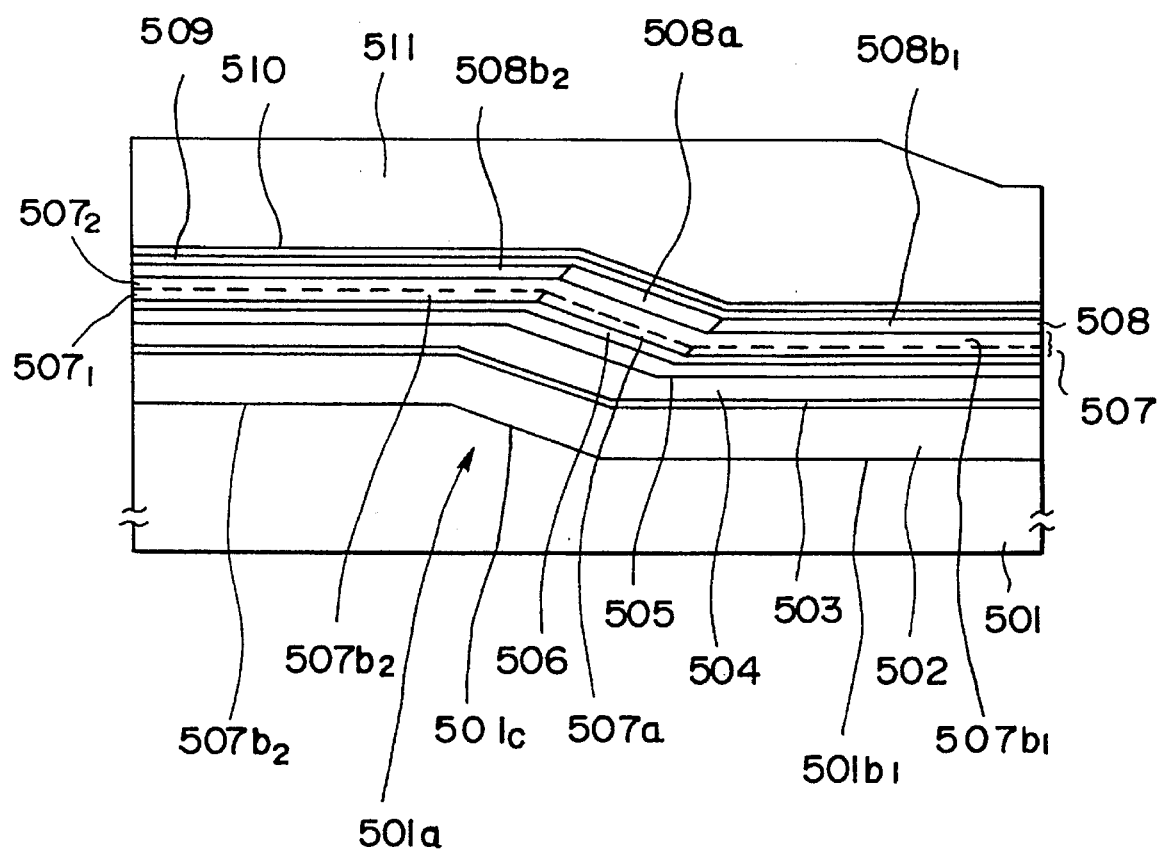
FIG. 35 is a diagram showing the structure of a stripe laser diode according to a modification of the device of FIG. 34.

FIG. 35 shows a modification of the device of FIG. 34, wherein a remote junction is formed within the clad layer 507. There, the layer 507 is formed of a lower layer part $507_1$ and an upper layer part $507_2$, wherein the lower layer part $507_1$ is divided into a first region 507a of p-type formed in correspondence to the (311)A surface and a pair of second regions $507b_1$ and $507b_2$, both doped to the n-type. Such a doping of the layer $507_1$ is achieved by employing the simultaneous doping of Zn and Se as already described. On the other hand, the upper layer part $507_2$ is doped to the p-type throughout. With the formation of the remote junction at the interface between the n-type region $507b_1$ or $507b_2$ and the p-type upper layer $507_2$, one can enhance the effect of the current confinement further.

Figure 36:
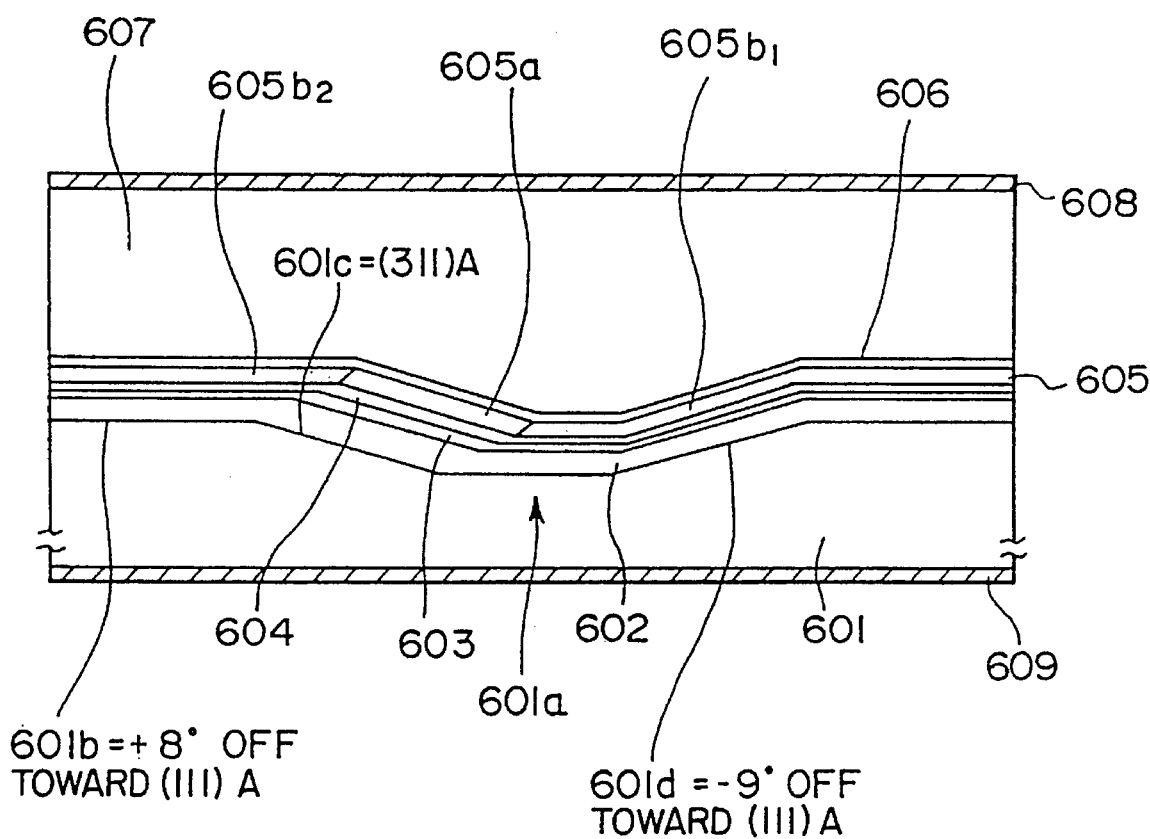
FIG. 36 is a diagram showing the structure of a stripe laser diode according to a modification of the device of FIG. 34.

FIG. 36 shows another modification of the laser diode of FIG. 34, wherein the device is constructed on an n-type GaAs substrate 601 that has an upper major surface 601b tilted from the (100) surface toward the (111)A surface by about +8 degrees, wherein the positive angle of tilting indicates the tilting of the surface in the clockwise direction. Further, the substrate 601 is formed with a groove or negative mesa 601a to extend in the <01$\bar{1}$> direction, wherein the negative mesa 601a is defined by a (311)A oriented side wall 601c and an opposing side wall 601d that is tilted from the (100) surface toward the (111)A surface by a tilt angle of –9 degrees. Thereby, the surface 601d forms a crystallographically equivalent surface to the upper major surface 601b of the substrate 601.

On the substrate 601 thus formed, epitaxial layers 602–606 are grown consecutively, wherein the layer 602 corresponds to the clad layer 502, the layer 603 corresponds to the active layer 506, the layer 604 corresponds to the clad layer 507, the layer 605 corresponds to the clad layer 508, and the layer 606 corresponds to the layer 509. Further, a contact layer 607 of p-type GaAs is formed on the layer 606 in correspondence to the contact layer 511. On the upper major surface of the layer 607, an upper electrode 608 is formed, while a lower electrode 609 is formed on the lower major surface of the substrate 601. There, the layer 602 is doped to the n-type by Se or Si, while the layers 604 and 606 are doped by Mg or Zn to the p-type, similarly to the previous embodiment. On the other hand, the clad layer 605 is doped simultaneously by Zn and Se.

In the layer diode of FIG. 36, it will be noted that the clad layer 605, doped by Zn and Se simultaneously, is divided into three distinct parts or regions, a first region 605a grown on the (311)A stripe surface, and second and third regions $605b_1$ and $605b_2$ formed at both lateral sides of the first region 605a, wherein the first region 605a has the p-type conductivity while the second and third regions $605b_1$ and $605b_2$ have the n-type conductivity type. There, it should be noted that the region $605b_1$ forming the side wall of the mesa 601a has a crystal surface equivalent to the crystal surface of the region $605b_2$ that is formed on the upper major surface of the substrate, because of the foregoing tilting of the upper major surface. Associated with such a construction, only one of the regions, that is the first region 605a, is doped to the p-type while the rest of the layer 605 is doped to the n-type. Thus, the drive current is confined selectively into the stripe part of the active layer 603 formed in correspondence to the (311)A surface, and the laser oscillation occurs preferentially in this stripe part. On the other hand, the laser oscillation in the other stripe part corresponding to the surface 601d is suppressed because of the depletion of the drive current.

The principle of the laser diode as set forth in FIG. 36 can be applied to the form a structure for avoiding melting of the edge surface in the laser diode known as catastrophic optical damage. In the laser diodes, there is a tendency that impurity states at the edge surface of the laser diode cause absorbtion of the optical beam, and such an optical absorption causes a temperature rise at the edge part of the laser diode. When such a temperature rise occurs, the band gap of the active layer is narrowed and ultimately causes a short circuit. Thereby, the current flows along the edge surface and induces melting.

In order to avoid the problem of catastrophic optical damage, the conventional high power laser diodes use a wide band gap material at the edge part. Alternatively, the electrode is formed such that the injection of the current does not occur in correspondence to the edge part. However, these conventional measures are complex and not practical for fabricating a laser diode in an actual production line.

Figure 37:
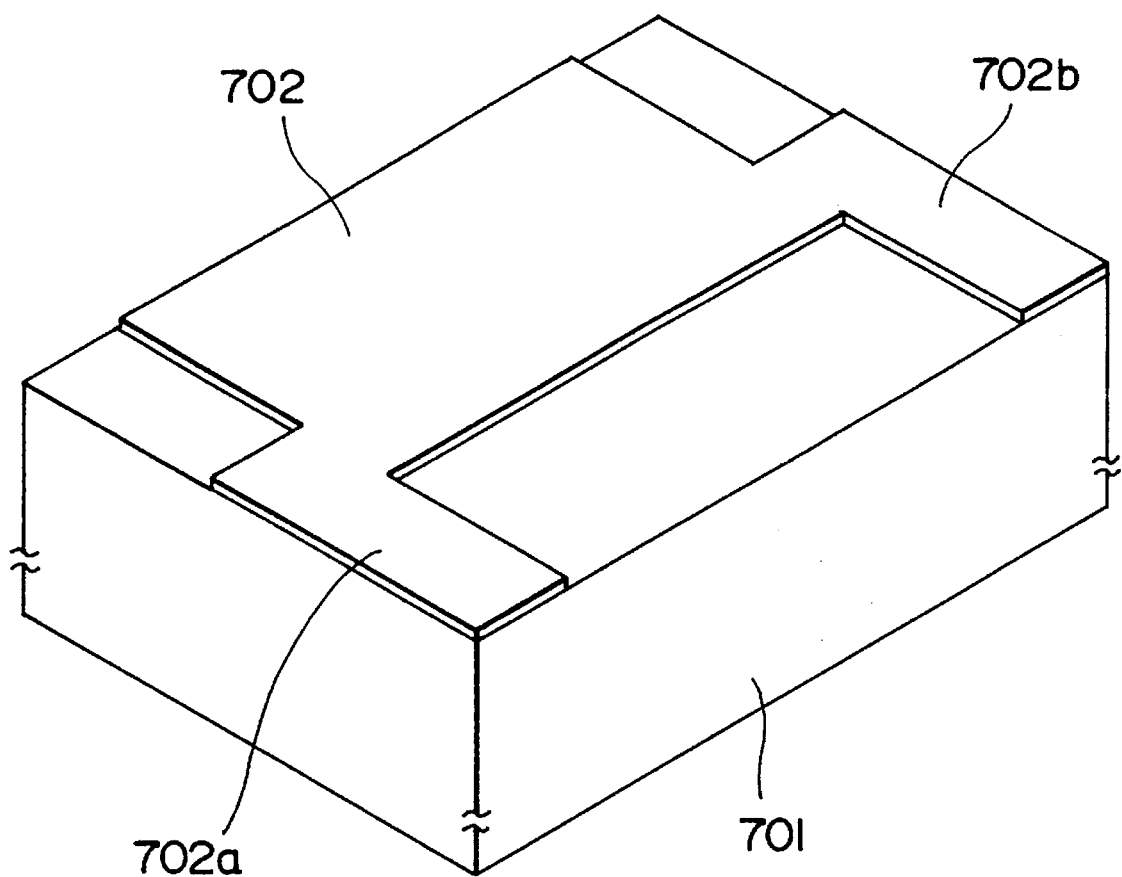
FIGS. 37 and 38 are diagrams showing the process for fabricating a laser diode according to an eighth embodiment of the present invention.
Figure 38:
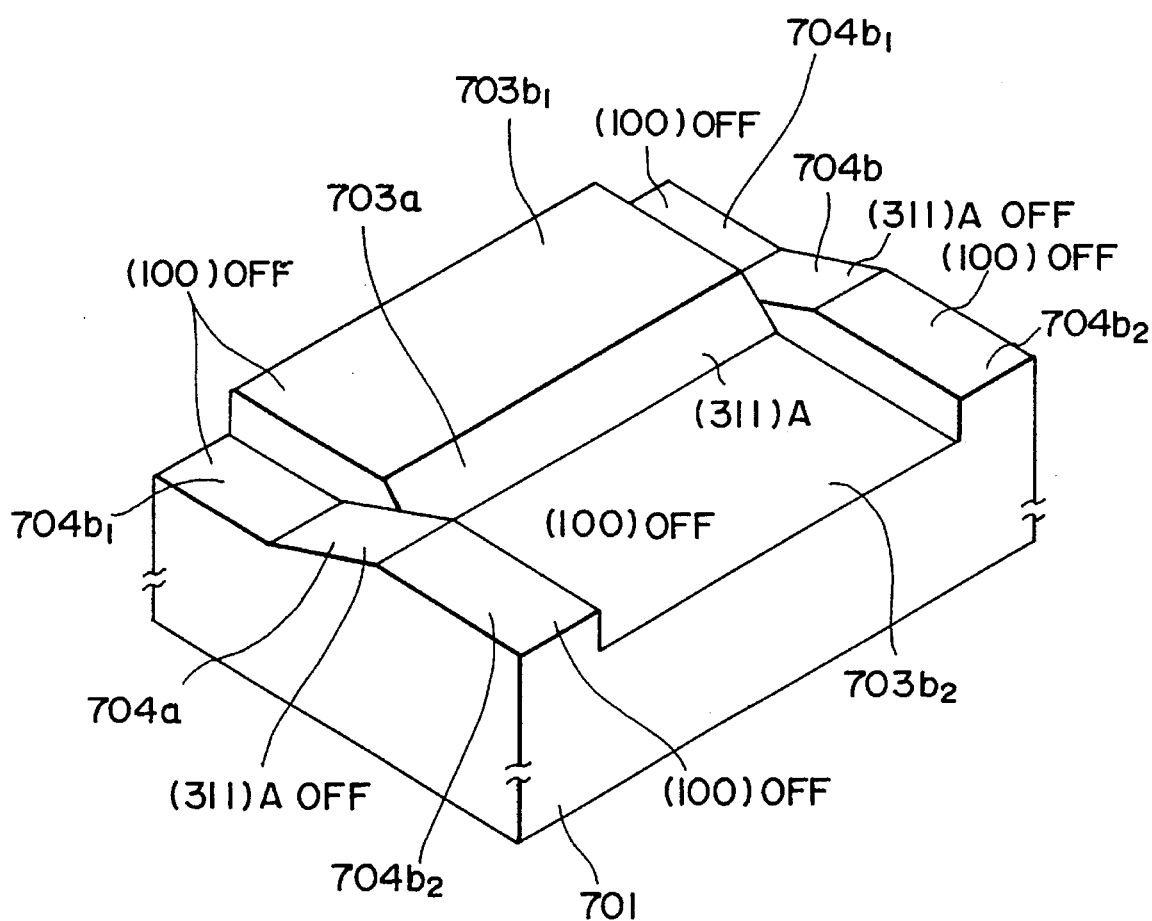

FIGS. 37 and 38 show the process for fabricating a laser diode wherein the problem of the catastrophic optical absorption is eliminated, based upon the principle explained with reference to FIG. 36.

Referring to FIG. 37, a substrate 701 of n-type GaAs is prepared such that the substrate 701 has upper and lower major surfaces characterized by a crystal surface that is tilted with respect to the (100) surface of the GaAs crystal toward the (111)A surface by +8 degrees. Further, the upper major surface of the substrate 701 is covered by a silicon oxide layer 702 that is patterned as shown in FIG. 37. There, the oxide layer 702 forms a mask and has a pair of projecting patterns 702a and 702b in correspondence to the respective, opposite longitudinal edges of the substrate 701.

Next, the substrate 701 thus protected by the mask 702 is subjected to a wet etching process such that the etching process acts upon the exposed upper major surface of the substrate 701. Thereby, a structure shown in FIG. 38 is obtained, wherein FIG. 38 shows the state after the mask 702 is removed. There, it will be noted that the upper major surface of the substrate 701 is divided into a first surface 703a forming a stripe region and characterized by the (311)A surface and a pair of flat surfaces 703b₁ and 703b₂ formed at both sides of the stripe region 703a and characterized by the same tilted crystal surface as the original upper major surface of the substrate 701. Further, at both longitudinal ends of the substrate 701, an oblique surface 704a characterized by the crystal surface offset from the (311)A surface is formed in alignment with the stripe surface 703a such that the surface 704a is laterally bounded by surfaces 704b₁ and 704b₂, wherein the surfaces 704₁ and 704b₂ are formed by the same crystal surface as the tilted upper major surface 703b₁ or 7093b₂ of the substrate 701.

On the substrate 701 thus prepared, epitaxial layers are grown by the MOCVD process similarly to the device of FIG. 36. Thereby, it will be noted that the epitaxial layer grown on the stripe surface 703a is not equivalent to the epitaxial layer grown on the stripe surface 704a. The relationship between the epitaxial layer grown on the stripe surface 703a and epitaxial layer grown on the stripe surface 704a is similar to the relationship between the epitaxial layer 605a and the epitaxial layer 605b₁ of FIG. 36.

Figure 39:
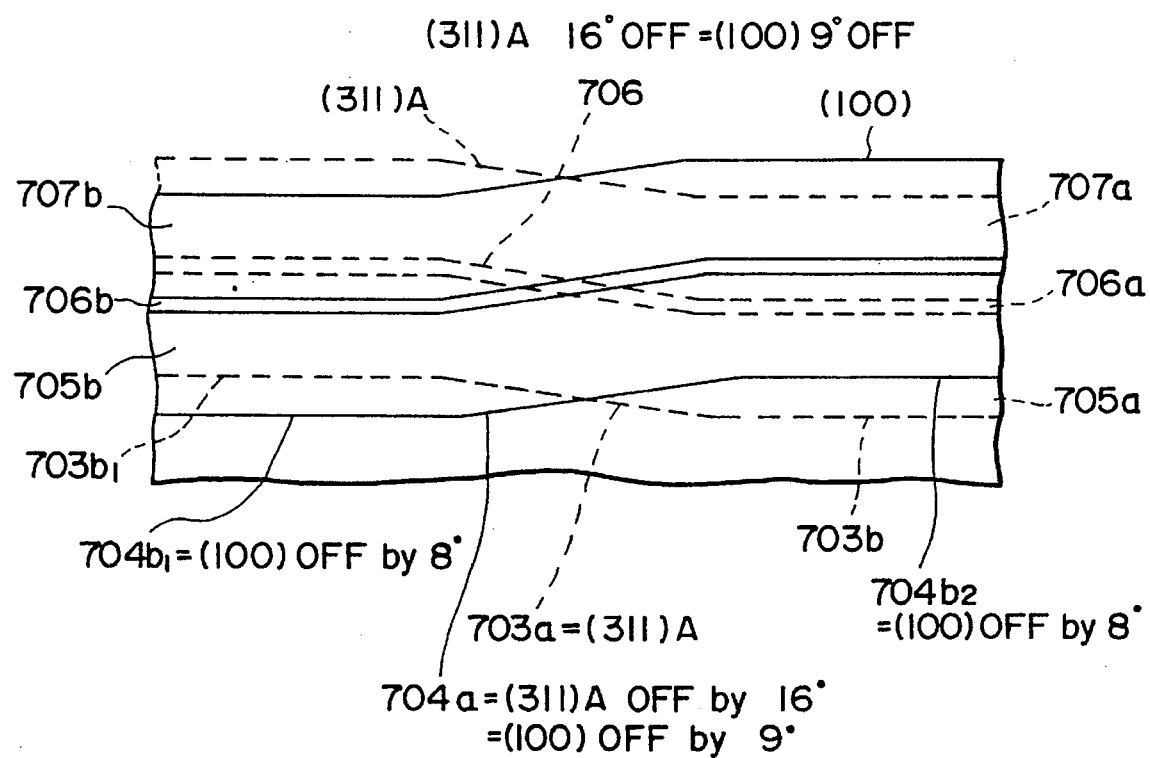
FIG. 39 is a diagram showing the essential part of the laser diode of the eighth embodiment.

FIG. 39 shows the essential part of the epitaxial layers grown on the structure of FIG. 38, wherein an n-type InGaAlP clad layer 705a, an undoped InGaP active layer 706a and a p-type InGaAlP clad layer 707a are grown consecutively (i.e., in sequence) on the essential part of the structure of FIG. 39 including the surfaces 703a and 703b₁, 703b₂. There, the clad layer 705a is doped by Se to the n-type throughout, while the layer 707a is doped simultaneously by Zn and Se such that the part of the layer 707a grown on the (311)A surface is doped to the p-type while the rest of the layer 707a is doped to the n-type.

On the other hand, epitaxial layers 705b–707b are grown consecutively (i.e., in sequence) on the edge part of the structure of FIG. 38 including the surfaces 704a, 704b₁ and 704b₂ simultaneously with the corresponding layers 705a–707a, wherein it will be noted that none of these surfaces includes the (311)A surface. Thus, the clad layers 705b and 707b are both doped to the n-type and the double hetero ( ) junction essential for the laser diode is no longer formed in the edge part of the laser diode. Thereby, the laser oscillation at the edge part of the laser diode is prohibited even when the electrode is provided uniformly on the upper and lower major surface of the laser diode structure thus formed, and the problem of the catastrophic optical damage is avoided successfully.

Further, the present invention is not limited to the embodiments described heretofore, but various variations and modifications may be made without departing from the scope of the invention.

What is claimed is:

1. A stripe laser diode, comprising:

a semiconductor substrate doped to a first conductivity type, said substrate having an upper major surface and a lower major surface and extending in a longitudinal direction of the laser diode from a first end to a second, opposite end thereof;

a first stripe structure formed on said upper major surface of said semiconductor substrate as a part of said substrate, said first stripe structure comprising a first stripe surface formed of a crystal surface having a first crystal orientation and extending in said longitudinal direction and a second stripe surface formed of a crystal surface having a second, different crystal orientation and extending in said longitudinal direction adjacent to said first stripe surface;

a first clad layer of InGaAlP having upper and lower major surfaces and provided on said semiconductor substrate so as to extend in said longitudinal direction from a first end to a second, opposite end thereof;

a second stripe structure formed on said upper major surface of said first clad layer so as to extend in said longitudinal direction as a part of said first clad layer and in conformity with said first stripe structure, said second stripe structure comprising a third stripe surface corresponding to said first stripe surface and formed of a crystal surface having said first crystal orientation, said third stripe surface extending in said longitudinal direction, and a fourth stripe surface corresponding to said second stripe surface and formed of a crystal surface having said second crystal orientation, said fourth stripe surface extending in said longitudinal direction adjacent to said third stripe surface;

an active layer of undoped semiconductor material having upper and lower major surfaces and provided on said first clad layer so as to extend in said longitudinal direction from a first end to a second, opposite end, said active layer being supplied with first type carriers of a first polarity and second type carriers of a second, opposite polarity for producing an optical beam as a result of recombination of said first and second type carriers;

a third stripe structure formed on said upper major surface of said active layer so as to extend in said longitudinal direction as a part of said active layer and in comformity with said first and second stripe structures, said third stripe structure comprising a fifth stripe surface corresponding to said third stripe surface and formed of a crystal surface having said first crystal orientation, said fifth stripe surface extending in said longitudinal direction, and a sixth stripe surface corresponding to said fourth stripe surface and formed of a crystal surface having said second crystal orientation, said sixth stripe surface extending in said longitudinal direction along said fifth stripe surface;

a second clad layer of InGaAlP having upper and lower major surfaces and provided on said active layer so as to extend in said longitudinal direction from said first end to said second end of said substrate;

a fourth stripe structure formed on said upper major surface of said second clad layer so as to extend in said longitudinal direction as a part of said second clad layer and in conformity with said first through third stripe structures, said fourth stripe structure comprising a seventh stripe surface formed of a crystal surface having said first crystal orientation, said seventh stripe surface extending in said longitudinal direction, and an eighth stripe surface formed of a crystal surface having said second crystal orientation, said eighth stripe surface extending in said longitudinal direction adjacent to said seventh stripe surface;

first electrode means, provided on said lower major surface of said substrate, for establishing an ohmic contact therewith and injecting said first type carriers into said active layer via said first clad layer;

second electrode means, provided on said upper major surface of said second clad layer, for establishing an ohmic contact therewith and injecting said second type carriers into said active layer via said second clad layer;

one of said first and second clad layers being doped, at least in a part thereof, with a p-type dopant and simultaneously with an n-type dopant and thereby forming a current guiding structure for guiding a drive current of the laser diode such that said drive current is injected selectively into said active layer in correspondence to a region defined in said third stripe structure by said fifth stripe surface; and each of said first, third, fifth and seventh stripe surfaces being formed of a (311)A-oriented crystal surface and being inclined with respect to said upper major surface of said substrate and each of said second, fourth, sixth and eighth stripe surfaces being formed of a crystal surface coincident to the crystal surface forming said upper major surface of said substrate.

2. A stripe laser diode comprising:

a semiconductor substrate doped to a first conductivity type, said substrate having an upper major surface and a lower major surface and extending in a longitudinal direction of the laser diode from a first end to a second, opposite end thereof;

a first stripe structure formed on said upper major surface of said semiconductor substrate as a part of said substrate, said first stripe structure comprising a first stripe surface formed of a crystal surface having a first crystal orientation and extending in said longitudinal direction and a second stripe surface formed of a crystal surface having a second, different crystal orientation and extending in said longitudinal direction adjacent to said first stripe surface;

a first clad layer of InGaAlP having upper and lower major surfaces and provided on said semiconductor substrate so as to extend in said longitudinal direction from a first end to a second, opposite end thereof;

a second stripe structure formed on said upper major surface of said first clad layer so as to extend in said longitudinal direction as a part of said first clad layer and in conformity with said first stripe structure, said second stripe structure comprising a third stripe surface corresponding to said first stripe surface and formed of a crystal surface having said first crystal orientation, said third stripe surface extending in said longitudinal direction, and a fourth stripe surface corresponding to said second stripe surface and formed of a crystal surface having said second crystal orientation, said fourth stripe surface extending in said longitudinal direction adjacent to said third stripe surface;

an active layer of undoped semiconductor material having upper and lower major surfaces and provided on said first clad layer so as to extend in said longitudinal direction from a first end to a second, opposite end, said active layer being supplied with first type carriers of a first polarity and second type carriers of a second, opposite polarity for producing an optical beam as a result of recombination of said first and second type carriers;

a third stripe structure formed on said upper major surface of said active layer so as to extend in said longitudinal direction as a part of said active layer and in conformity with said first and second stripe structures, said third stripe structure comprising a fifth stripe surface corresponding to said third stripe surface and formed of a crystal surface having said first crystal orientation, said fifth stripe surface extending in said longitudinal direction, and a sixth stripe surface corresponding to said fourth stripe surface and formed of a crystal surface having said second crystal orientation, said sixth stripe surface extending in said longitudinal direction along said fifth stripe surface;

a second clad layer of InGaAlP having upper and lower major surfaces and provided on said active layer so as to extend in said longitudinal direction from said first end to said second end of said substrate;

a fourth stripe structure formed on said upper major surface of said second clad layer so as to extend in said longitudinal direction as a part of said second clad layer and in conformity with said first through third stripe structures, said fourth stripe structure comprising a seventh stripe surface formed of a crystal surface having said first crystal orientation, said seventh stripe surface extending in said longitudinal direction, and an eighth stripe surface formed of a crystal surface having said second crystal orientation, said eighth stripe surface extending in said longitudinal direction adjacent to said seventh stripe surface;

first electrode means, provided on said lower major surface of said substrate, for establishing an ohmic contact therewith and injecting said first type carriers into said active layer via said first clad layer;

second electrode means, provided on said upper major surface of said second clad layer, for establishing an ohmic contact therewith and injecting said second type carriers into said active layer via said second clad layer;

one of said first and second clad layers being doped, at least in a part thereof, with a p-type dopant and simultaneously with an n-type dopant and thereby forming a current guiding structure for guiding a drive current of the laser diode such that said drive current is injected selectively into said active layer in correspondence to a region defined in said third stripe structure by said fifth stripe surface;

one of said first and second clad layers is doped, at least in a part thereof, with a first dopant having a conductivity type identical with one of said first and second conductivity types and, simultaneously, with a second dopant having a conductivity type opposite to the conductivity type of said first dopant, to form a current guiding structure for guiding a drive current of the laser diode such that said drive current is injected selectively into said active layer in correspondence to a region defined in said third stripe structure by said fifth stripe surface; and said clad layer that forms said current guiding structure further comprises:
  a first sub-clad layer doped simultaneously with said first dopant and said second dopant with respective doping levels thereof set such that said first sub-clad layer is doped to said conductivity type of said first dopant with an increased carrier density in a region corresponding to said fifth stripe surface of said third stripe structure and having said first crystal orientation and such that said first sub-clad layer is doped to the conductivity type of said second dopant in a region corresponding to said sixth stripe surface of said third stripe structure and having said second crystal orientation, and
  a second sub-clad layer doped with a dopant having a conductivity type identical to the conductivity type of said first dopant, such that said second sub-clad layer is doped to said first conductivity type and with an increased carrier density in a region corresponding to said fifth stripe surface of said third stripe structure and having said first crystal orientation, as compared with a region corresponding to said sixth stripe surface of said third stripe structure.

3. A stripe laser diode, comprising:

a semiconductor substrate doped to a first conductivity type, said substrate having an upper major surface and a lower major surface and extending in a longitudinal direction of the laser diode from a first end to a second, opposite end thereof;

a first stripe structure formed on said upper major surface of said semiconductor substrate as a part of said substrate, said first stripe structure comprising a first stripe surface formed of a crystal surface having a first crystal orientation and extending in said longitudinal direction and a second stripe surface formed of a crystal surface having a second, different crystal orientation and extending in said longitudinal direction adjacent to said first stripe surface;

a first clad layer of a compound semiconductor material having upper and lower major surfaces and provided on said semiconductor substrate so as to extend in said longitudinal direction from a first end to a second, opposite end thereof;

a second stripe structure formed on said upper major surface of said first clad layer so as to extend in said longitudinal direction as a part of said first clad layer and in conformity with said first stripe structure, said second stripe structure comprising a third stripe surface corresponding to said first stripe surface and formed of a crystal surface having said first crystal orientation, said third stripe surface extending in said longitudinal direction, and a fourth stripe surface corresponding to said second stripe surface and formed of a crystal surface having said second crystal orientation, said fourth stripe surface extending in said longitudinal direction adjacent to said third stripe surface;

an active layer of undoped semiconductor material having upper and lower major surfaces and provided on said first clad layer so as to extend in said longitudinal direction from a first end to a second, opposite end thereof, said active layer being supplied with first type carriers of a first polarity and second type carriers of a second opposite polarity thereby to produce an optical beam as a result of recombination of said first and second type carriers;

a third stripe structure formed on said upper major surface of said active layer so as to extend in said longitudinal direction as a part of said active layer and in conformity with said first and second stripe structures, said third stripe structure comprising a fifth stripe surface corresponding to said third stripe surface and formed of a crystal surface having said first crystal orientation, said fifth stripe surface extending in said longitudinal direction, and a sixth stripe surface corresponding to said fourth stripe surface and formed of a crystal surface having said second crystal orientation, said sixth stripe surface extending in said longitudinal direction along said fifth stripe surface;

a second clad layer of a compound semiconductor material having upper and lower major surfaces and provided on said active layer so as to extend in said longitudinal direction from said first end to said second end of said substrate;

a fourth stripe structure formed on said upper major surface of said second clad layer so as to extend in said longitudinal direction as a part of said second clad layer and in conformity with said first through third stripe structures, said fourth stripe structure comprising a seventh stripe surface formed of a crystal surface having said first crystal orientation, said seventh stripe surface extending in said longitudinal direction, and an eighth stripe surface formed of a crystal surface having said second crystal orientation, said eighth stripe surface extending in said longitudinal direction adjacent to said seventh stripe surface;

first electrode means, provided on said lower major surface of said substrate, for establishing an ohmic contact therewith and injecting said first type carriers into said active layer via said first clad layer; and second electrode means, provided on said upper major surface of said second clad layer, for establishing an ohmic contact therewith and injecting said second type carriers into said active layer via said second clad layer;

said second crystal orientation being set coincident to a crystal orientation of said upper major surface of said substrate, said first crystal orientation thereby defining a crystal surface inclined with respect to the upper major surface of said substrate;

one of said first and second clad layers being doped, at least in a part thereof, with a first dopant having a conductivity type identical to one of said first and second conductivity types and, simultaneously, with a second dopant having a conductivity type opposite to the conductivity type of said first dopant thereby to form a current guiding structure for guiding a drive current of the laser diode such that said drive current is injected selectively into said active layer in correspondence to a region defined in said third stripe structure by said fifth stripe surface; and said clad layer that forms said current guiding structure further comprising:

a first sub-clad layer doped simultaneously with said first dopant and said second dopant with respective doping levels set such that said first sub-clad layer is doped to the conductivity type of said first dopant with an increased carrier density in a region corresponding to said fifth stripe surface of said third stripe structure and having said first crystal orientation and such that said first sub-clad layer is doped to the conductivity type of said second dopant in a region corresponding to said sixth crystal orientation, and a second sub-clad layer doped with a dopant having a conductivity type identical to the conductivity type of said first dopant, such that said second sub-clad layer is doped to the conductivity type of said first dopant with an increased carrier density in a region corresponding to said fifth stripe surface of said third stripe structure and having said first crystal orientation as compared with a carrier density region corresponding to said sixth stripe surface of said third stripe structure and having said second crystal orientation.

4. A laser diode as claimed in claim 3, wherein said first crystal orientation define a crystal surface inclined with respect to the upper major surface of said substrate selectively at one of, or in a range between, a (311)A-oriented surface and a (411)A-oriented surface.

5. A laser diode as claimed in claim 4, wherein said first crystal orientation defines said (311)A-oriented surface.

6. A laser diode as claimed in claim 4, wherein said first crystal orientation defines said (411)A-oriented surface.

7. A laser diode as claimed in claim 3, wherein said active layer has an increased thickness in a region thereof that has said first crystal orientation, as compared with a region thereof that has said second crystal orientation.

8. A laser diode as claimed in claim 3, wherein each of said first and second clad layers has an increased thickness in a region thereof that has said first crystal orientation, as compared with a region thereof that has said second crystal orientation.

9. A laser diode as claimed in claim 3, wherein said second crystal orientation defines a crystal surface tilted from a (100)-oriented surface in the direction of a (111)A-oriented surface.

10. A laser diode as claimed in claim 9, wherein said first stripe structure defines a groove extending in said longitudinal direction in said upper major surface of said substrate, said groove being defined laterally by a pair of opposing side walls and such that said first stripe surface forms one of said opposing side walls of said groove, each of said second through fourth stripe structures forming a groove corresponding to said groove on said upper major surface of said substrate and such that corresponding grooves are formed, respectively, on said upper major surfaces of said first clad layer, said active layer and said second clad layer, said second electrode means filling said groove formed on said upper major surface of said second clad layer and having a planarized upper major surface for external connection.

* * * * *

UNITED STATES PATENT AND TRADEMARK OFFICE
CERTIFICATE OF CORRECTION

PATENT NO. : 5,621,748
DATED : Apr. 15, 1997
INVENTOR(S) : KONDO et al.

It is certified that error appears in the above-indentified patent and that said Letters Patent is hereby corrected as shown below:

TITLE PAGE: [30] Foreign Application Priority Data, the fourth application, change "51563" to --4-51563--.

Col. 9, line 59, after "for" insert --Se;--.

Col. 20, line 64, after "therein" insert --,--.

Col. 21, line 3, change "id" to --is--.

Col. 23, line 54, change "," to --.--.

Col. 28, line 20, change "0.6 m" to --0.6 μm--;
line 43, delete "10";
line 47, after "a" delete "0".

Col. 31, line 43, change "hetero()junction" to --heterojunction--.

Signed and Sealed this

Twelfth Day of August, 1997

Attest:

BRUCE LEHMAN

*Attesting Officer*    *Commissioner of Patents and Trademarks*